(12) United States Patent
Goetting et al.

(10) Patent No.: US 7,235,999 B2
(45) Date of Patent: Jun. 26, 2007

(54) SYSTEM MONITOR IN A PROGRAMMABLE LOGIC DEVICE

(75) Inventors: F. Erich Goetting, Cupertino, CA (US);
John K. Jennings, Dublin (IE);
Anthony J. Collins, Dublin (IE);
Patrick J. Quinn, Dublin (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/590,023

(22) Filed: Oct. 31, 2006

(65) Prior Publication Data

US 2007/0040717 A1    Feb. 22, 2007

Related U.S. Application Data

(62) Division of application No. 10/837,135, filed on Apr. 30, 2004, now Pat. No. 7,138,820.

(51) Int. Cl.
*H03K 19/003* (2006.01)

(52) U.S. Cl. ............................ 326/9; 326/14; 326/16

(58) Field of Classification Search ............... 326/8–9, 326/14, 16; 341/120, 172
See application file for complete search history.

(56) References Cited

U.S. PATENT DOCUMENTS

| | | | |
|---|---|---|---|
| 5,305,003 A | 4/1994 | Han et al. | |
| 6,140,860 A | 10/2000 | Sandhu et al. | |
| 6,535,798 B1 | 3/2003 | Bhatia et al. | |
| 6,642,751 B1 | 11/2003 | Quinn | |
| 6,732,354 B2 | 5/2004 | Ebeling et al. | |
| 6,784,824 B1 | 8/2004 | Quinn | |
| 6,836,839 B2 | 12/2004 | Master et al. | |
| 6,851,047 B1 | 2/2005 | Fox et al. | |
| 6,920,627 B2 | 7/2005 | Blodget et al. | |
| 6,956,512 B1 | 10/2005 | San et al. | |
| 7,102,555 B2 | 9/2006 | Collins et al. | |
| 7,124,041 B1 * | 10/2006 | Johnson et al. | 702/58 |
| 2002/0000831 A1 | 1/2002 | Smith | |
| 2002/0109844 A1 * | 8/2002 | Christel et al. | 356/417 |
| 2002/0138716 A1 | 9/2002 | Master et al. | |
| 2002/0149972 A1 | 10/2002 | Lamb et al. | |
| 2003/0034848 A1 | 2/2003 | Norman et al. | |
| 2003/0105949 A1 | 6/2003 | Master et al. | |
| 2003/0154357 A1 | 8/2003 | Master et al. | |
| 2004/0030736 A1 | 2/2004 | Scheuermann | |
| 2004/0078403 A1 | 4/2004 | Scheuermann et al. | |
| 2005/0044344 A1 | 2/2005 | Stevens | |

OTHER PUBLICATIONS

Raphael David et al.; "DART: A Dynamically Reconfigurable Architecture Dealing with Future Mobile Telecommunications Constraints"; Copyright 2002 IEEE; pp. 1-8.

(Continued)

*Primary Examiner*—Anh Q. Tran
(74) *Attorney, Agent, or Firm*—W. Eric Webostad

(57) ABSTRACT

Method and apparatus for a system monitor embedded in a programmable logic device are described. The system monitor includes a dynamic reconfiguration port interface for configuring or reconfiguring the system monitor during operation thereof. The system monitor includes an analog-to-digital converter which is reconfigurable responsive to input via a dynamic reconfiguration port.

12 Claims, 31 Drawing Sheets

OTHER PUBLICATIONS

Nicholas Cravotta; "Sense of Self: enabling systems to monitor—and control—their environment"; Oct. 25, 2001; EDN; available from www.ednmag.com; pp. 1-6 and 53-60.
Ken Chapman; XAPP627 (v1.1); "PicoBlaze 8-Bit Microcontroller for Virtex-II Series Devices"; Feb. 4, 2003; available from Xilinx, Inc., 2100 Logic Drive, San Jose, California 95124; pp. 1-44.

Xilinx, Inc; U.S. Appl. No. 10/683,944, filed Oct. 10, 2003 by Young.
Xilinx, Inc; U.S. Appl. No. 10/837,330, filed Apr. 30, 2004 by Goetting et al.
Xilinx, Inc; U.S. Appl. No. 10/837,331, filed Apr. 30, 2004 by Vadi et al.

* cited by examiner

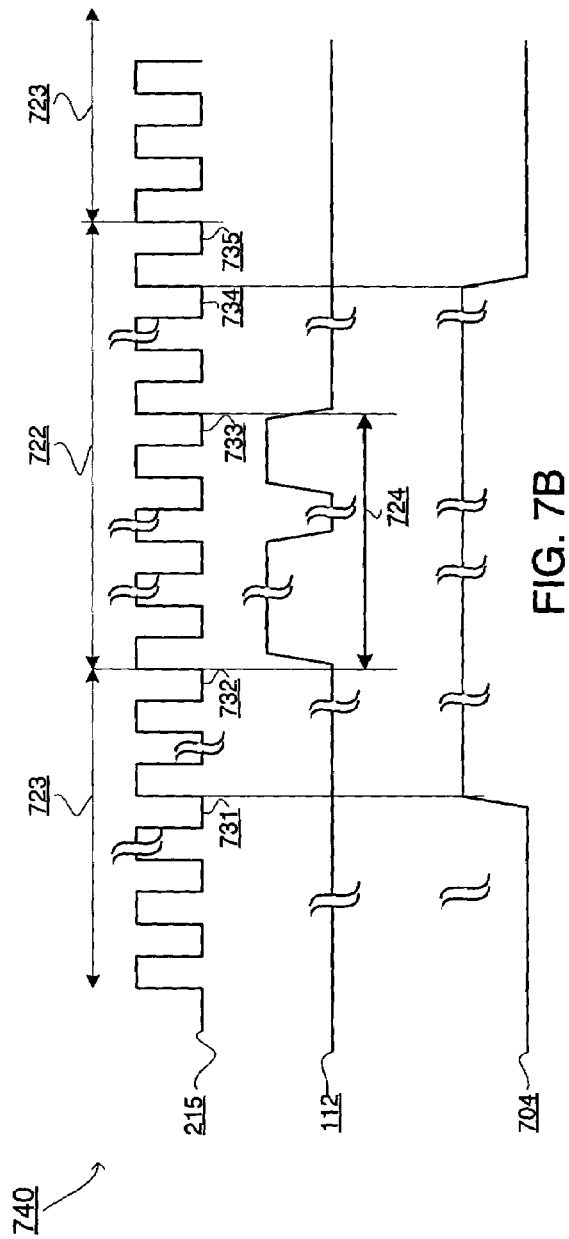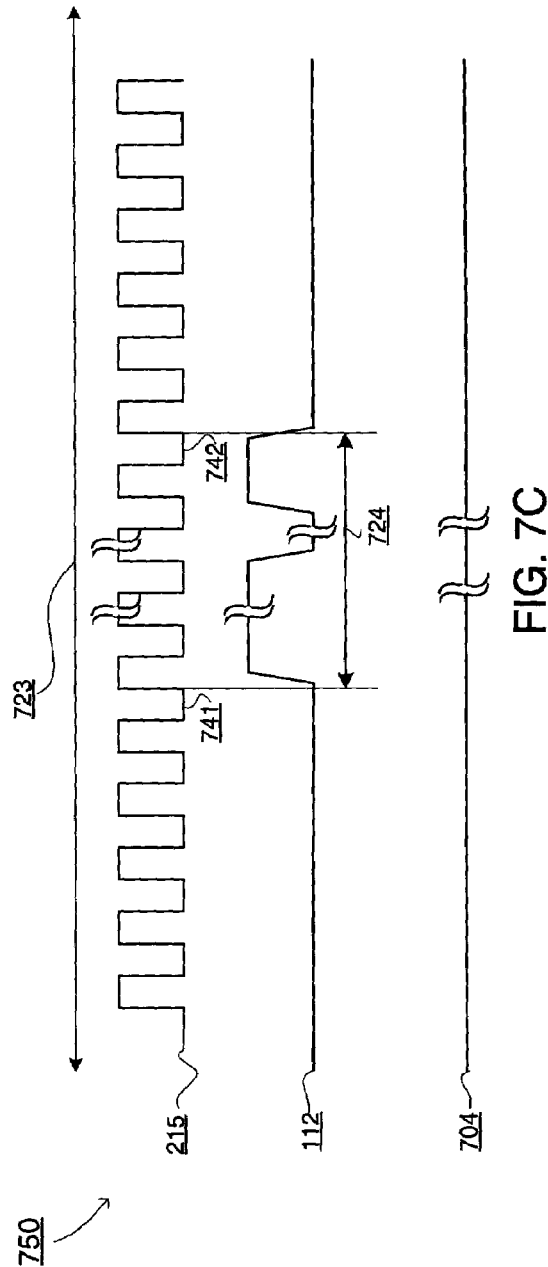
FIG. 7B
FIG. 7C

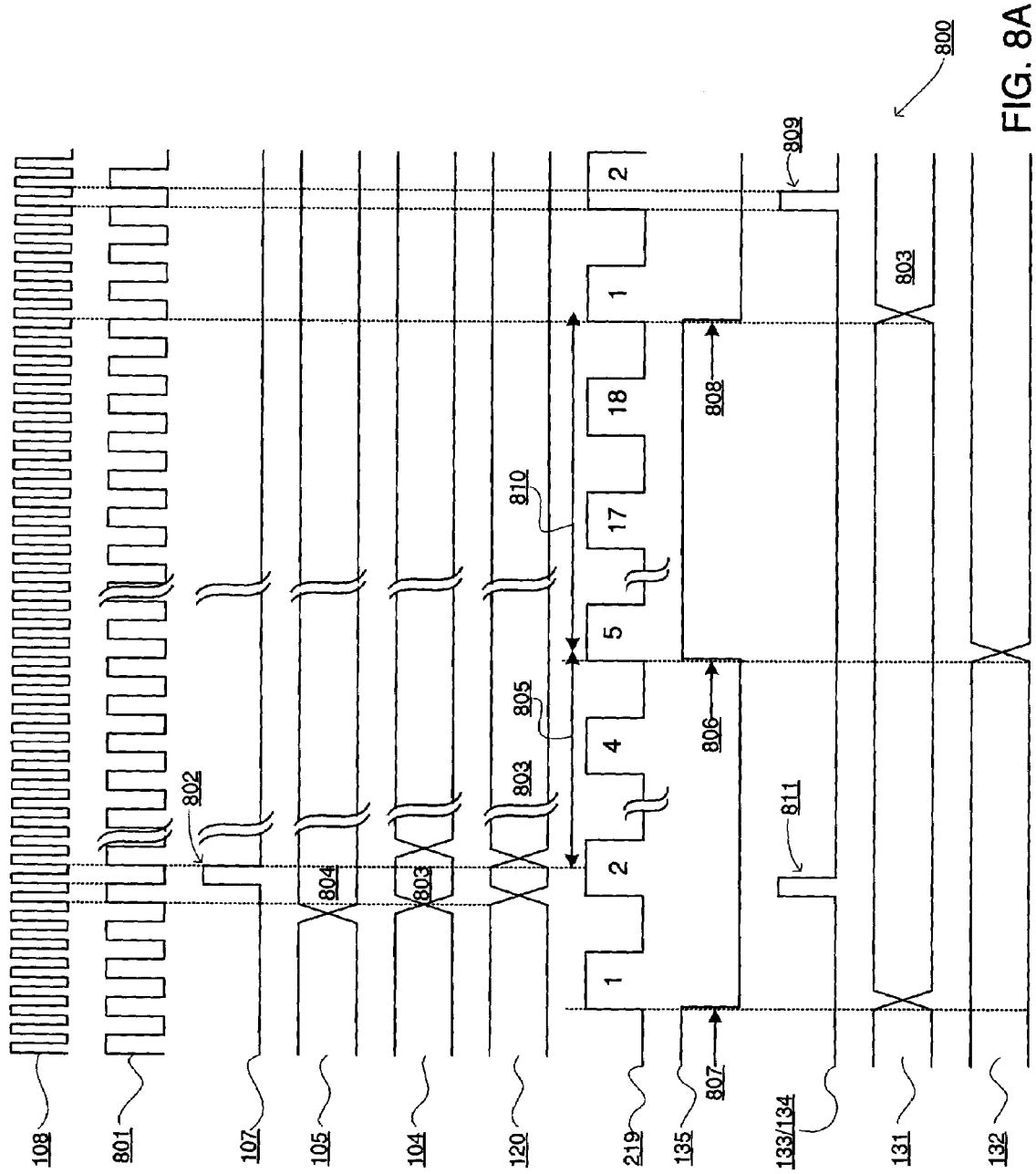

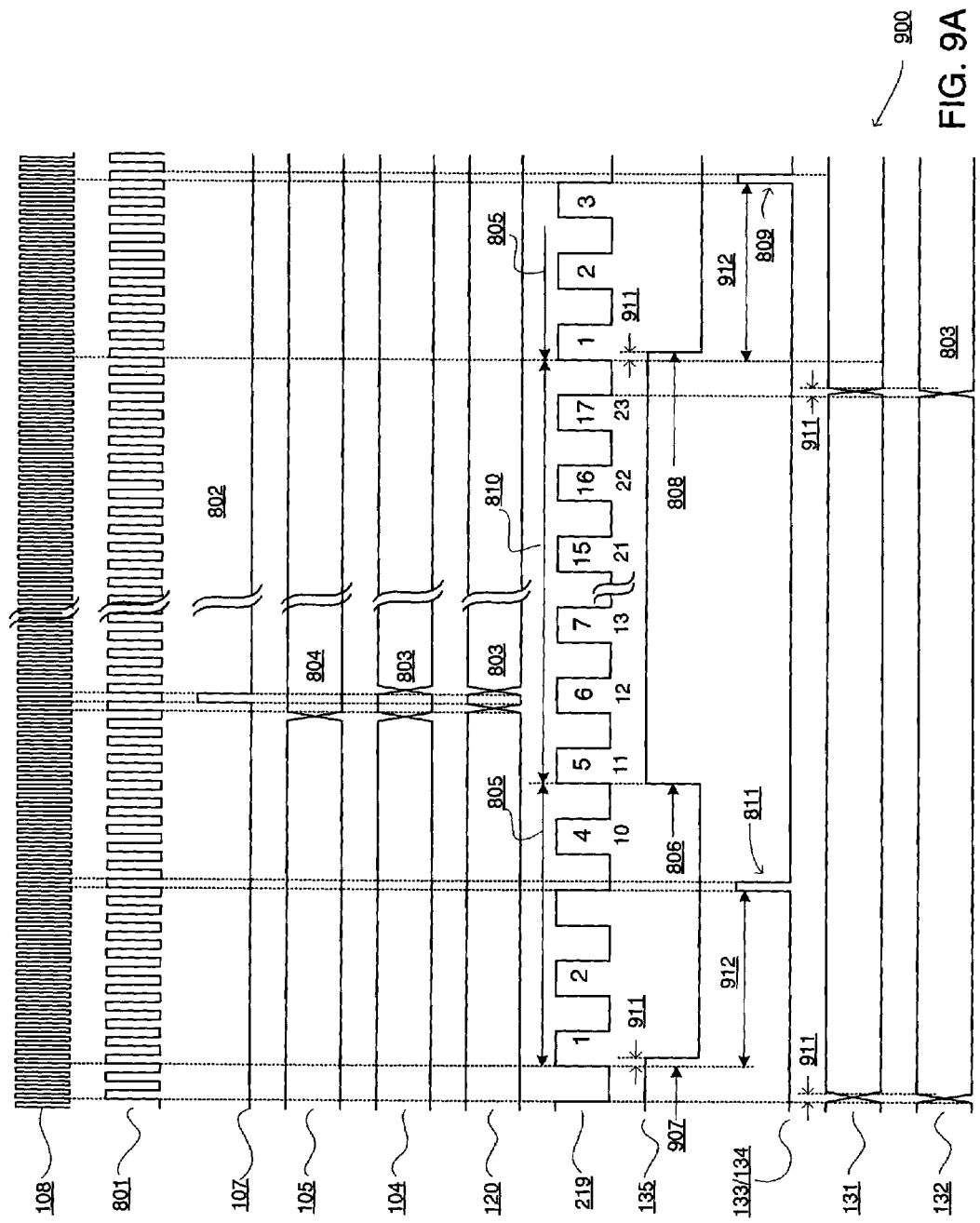

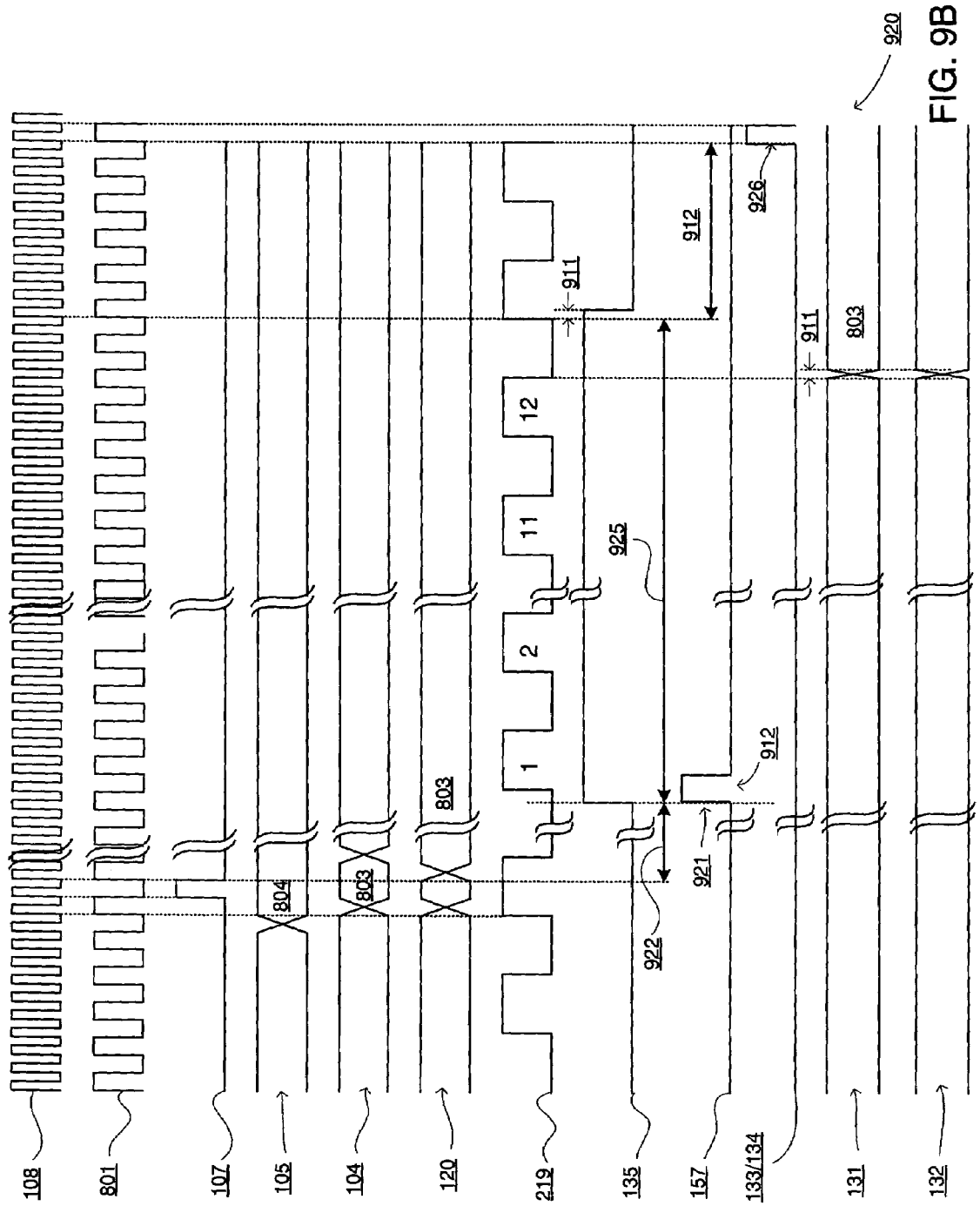

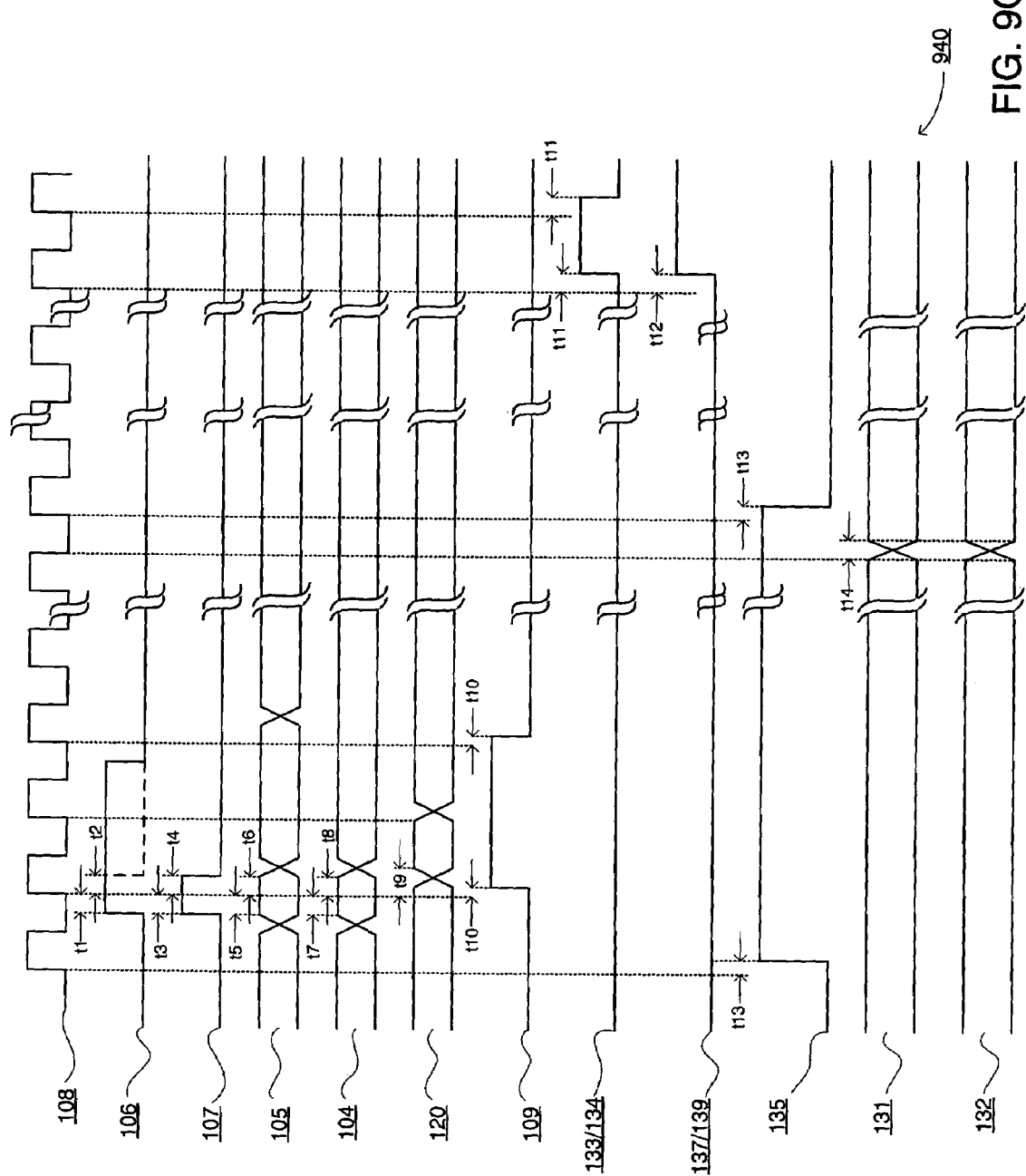

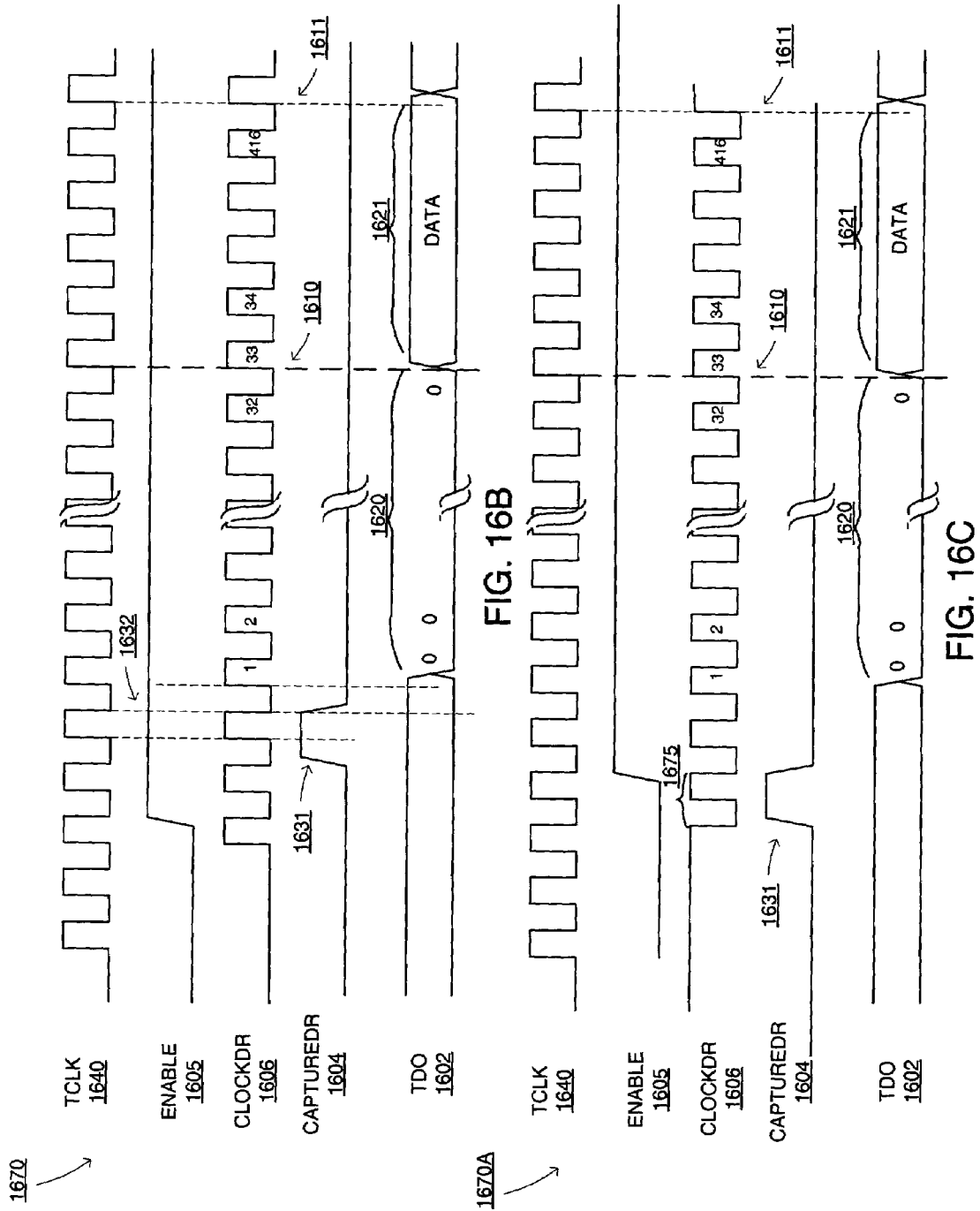

SYSTEM MONITOR IN A PROGRAMMABLE LOGIC DEVICE

This application is a Division of application Ser. No. 10/837,135 filed Apr. 30, 2004, now U.S. Pat. No. 7,138,820.

FIELD OF THE INVENTION

One or more aspects of the invention relate generally to testing an integrated circuit having a system monitor and, more particularly, to a system monitor embedded in a programmable logic device.

BACKGROUND OF THE INVENTION

In semiconductor industry, integrated circuits continue to use smaller geometries, lower supply voltages, and higher integration. These integrated circuits consequently have higher current densities and increased power dissipation. Accordingly, monitoring of environmental conditions, such as temperatures and power supplies, at the system or circuit board level is now done at the integrated circuit level.

Thermal control circuits used to ensure an integrated circuit does not exceed a factory defined temperature limit have been included in microprocessor integrated circuits. However, having thermal control done by a microprocessor, which may be a central processing unit of a system, adds overhead to processing functionality that may reduce system performance. Accordingly, monitoring may be offloaded to a processor or dedicated monitor. However, conventionally, such offloading involved a three or more additional integrated circuits to provide sufficient additional input/output and busing to support a number of sensors, as well as driver software. More recently, single chip sensor monitors have been developed. However, such single chip sensors heretofore have not provided a substantially complete single chip solution owing to configuration limitations, among other limited features.

Besides monitoring environmental conditions or physical characteristics of a system, it is useful to be able to obtain test data associated with such monitoring. Joint Test Action Group ("JTAG") functionality is a known way for conducting a boundary scan or otherwise digitally testing an integrated circuit. Additionally, the Institute of Electrical and Electronics Engineers ("IEEE") has advocated a standard for analog boundary scanning, namely, IEEE 1149.4. Both analog and digital sensors may be useful for monitoring integrated circuit physical characteristics and environmental conditions, whether internal or external to a chassis.

Accordingly, it would be desirable and useful to provide system monitoring in a single integrated circuit that facilitates obtaining data obtained from an analog or digital sensor.

SUMMARY OF THE INVENTION

An aspect of the invention is a programmable logic device including a system monitor. The system monitor includes: channel inputs including analog inputs; selection circuitry coupled to the channel inputs, the selection circuitry having a channel output; an analog-to-digital converter having an analog input and a digital output; and an interface having storage devices, where the storage devices for storing control information and data. The interface includes interface logic and control logic. The analog-to-digital converter is configurable responsive to a first portion of the control information; and the selection circuitry is configured to selectively couple a channel input of the channel inputs to the channel output responsive to a second portion of the control information. The analog-to-digital converter is coupled to the channel output at the analog input and coupled at the digital output to the storage devices.

Another aspect of the invention is a method for configuration of a system monitor, including: resetting a system monitor after powering up a host programmable logic device; waiting for the programmable logic device to initialize; activating reference generation circuits and at least one temperature sensor; and entering a temperature sensing mode of the system monitor, where the temperature sensing mode is independent of configuration of configuration memory cells of the programmable logic device.

Another embodiment of the present invention includes a system monitor circuit in an integrated circuit. The system monitor circuit includes: an analog-to digital converter (ADC) configured to monitor a plurality of sensors; a calibration circuit for calibrating an output of the ADC using a set value in a first register; a filter circuit for filtering an output of the calibration circuit or an output of the ADC; and a alarm circuit configured to determine an alarm condition by comparing the output of the calibration circuit or an output of the ADC or an output of the filter circuit with a set value in a second register. The system monitor circuit may further include: a microcontroller such as a hardwired Pico-Blaze or MicroBlaze coupled to the ADC.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIGS. 7B and 7C are signal diagrams depicting respective exemplary embodiments of partial configuration timings.

FIG. 8A is a signal diagram depicting an exemplary embodiment of a Continuous Sampling Mode timing.

FIG. 9A is a signal diagram depicting another exemplary embodiment of a Continuous Sampling Mode timing.

FIG. 9B is a signal diagram depicting another exemplary embodiment of an Event Driven Sampling Mode timing.

FIG. 9C is a lower-level signal diagram depicting another exemplary embodiment of a System Monitor detailed timing.

FIG. 16B is a signal diagram depicting an exemplary embodiment of a System Monitor TAP signal read timing for the System Monitor register memory of FIG. 3A.

FIG. 16C is a signal diagram depicting an exemplary alternative embodiment of System Monitor read timing.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention.

Exemplary FPGA Configurations

Figure 1A:
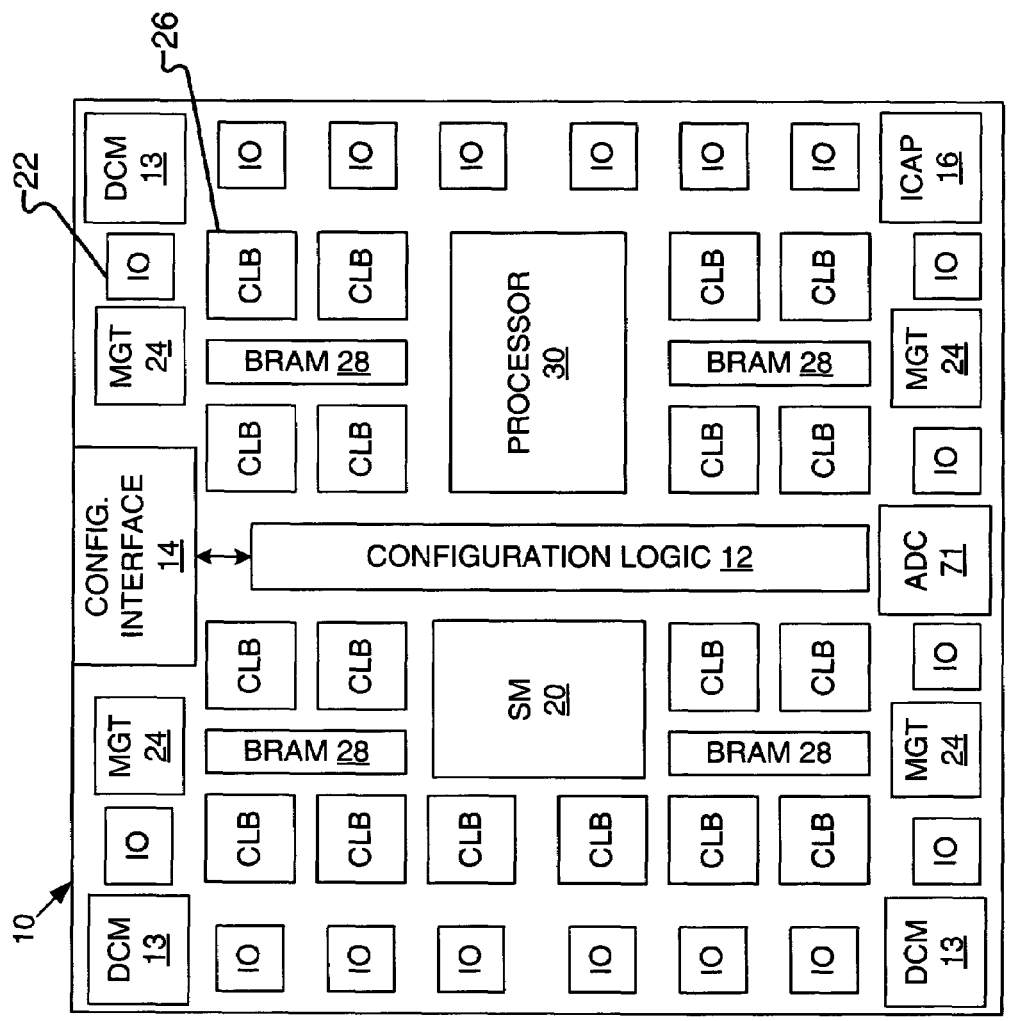
FIG. 1A is a high-level block diagram depicting an exemplary embodiment of a Field Programmable Gate Array ("FPGA") with a "ring" architecture.

FIG. 1A is a high-level block diagram depicting an exemplary embodiment of a Field Programmable Gate Array ("FPGA") 10 with a "ring" architecture. FPGA 10 is an example of an integrated circuit with software configurable logic and interconnects. However, other Programmable Logic Device ("PLD") integrated circuits other than Field Programmable Gate Arrays ("FPGAs"), including complex PLDs ("CPLD") and other integrated circuits with configurable logic and interconnects, may be used.

FPGA 10 includes configurable logic blocks ("CLBs") 26, programmable input/output blocks ("IOBs") 22, memory, such as block random access memory 28, delay lock loops ("DLLs") and multiply/divide/de-skew clock circuits which collectively provide digital clock managers ("DCMs") 13, and multi-gigabit transceivers ("MGTs") 24.

An external memory may be coupled to FPGA 10 to store and provide a configuration bitstream to configure FPGA 10, namely, to program one or more configuration memory cells to configure CLBs 26 and IOBs 22. Notably, IOBs 22, as well as MGTs 24, are disposed in a ring or ring-like architecture forming a perimeter of IOs around CLBs 26 of FPGA 10.

Additionally, FPGA 10 may include an Internal Configuration Access Port ("ICAP") 16, an embedded processor 30, an embedded System Monitor 20 with an Analog-to-Digital Converter ("ADC"). Though FPGA 10 is illustratively shown with a single embedded processor 30, FPGA 10 may include more than one processor 30. Additionally, known support circuitry for interfacing with embedded processor 30 may be included in FPGA 10. Furthermore, rather than an embedded processor 30, processor 30 may be programmed into configurable logic such as a "soft" processor 30.

Although FIG. 1A (not to scale) illustratively shows a relatively small number of IOBs 22, CLBs 26 and BRAMs 28, for purposes of example, it should be understood that an FPGA 10 conventionally includes many more of these elements. Additionally, FPGA 10 includes other elements, such as a programmable interconnect structure and a configuration memory array, which are not illustratively shown in FIG. 1A. Additional details regarding an example of an FPGA are described in "Virtex-II™ Pro, Platform FPGA Handbook", (Oct. 14, 2002) which includes "Virtex-II Pro™ Platform FPGA Documentation" (March 2002) "Advance Product Specification," "Rocket IO Transceiver User Guide", "PPC 405 User Manual" and "PPC 405 Processor Block Manual" available from Xilinx, Inc., 2100 Logic Drive, San Jose, Calif. 95124.

FPGA 10 is configured in response to a configuration information (commands and data) bitstream, which is loaded into a configuration memory array of FPGA 10 from an external memory, e.g., a read-only memory ("ROM"), via configuration interface 14 and configuration logic 12. Configuration interface 14 can be, for example, a select map interface, an IEEE 1149.1 TAP interface, or a master serial interface. Alternatively, with respect to external configuration or reconfiguration, FPGA 10 may be internally reconfigured through use of ICAP 16 or a dynamic reconfiguration port ("DRP") 201 (shown in FIG. 2). A dynamic reconfiguration port is described in additional detail in commonly assigned, co-pending U.S. patent application entitled "Reconfiguration Port for Dynamic Reconfiguration", by Vasisht M. Vadi, David P. Schultz, John D. Logue, John Mcgrath, Anthony Collins, and F. Eric Goetting, filed concurrently, which is incorporated by reference herein in its entirety.

Configuration data is conventionally divided out into data frames. Configuration data may be loaded into the configuration memory array one frame at a time via configuration interface 14 or ICAP 16, or in sub-frame increments (e.g., one or more words, bytes, and/or bits) via a dynamic reconfiguration port.

Figure 1B:
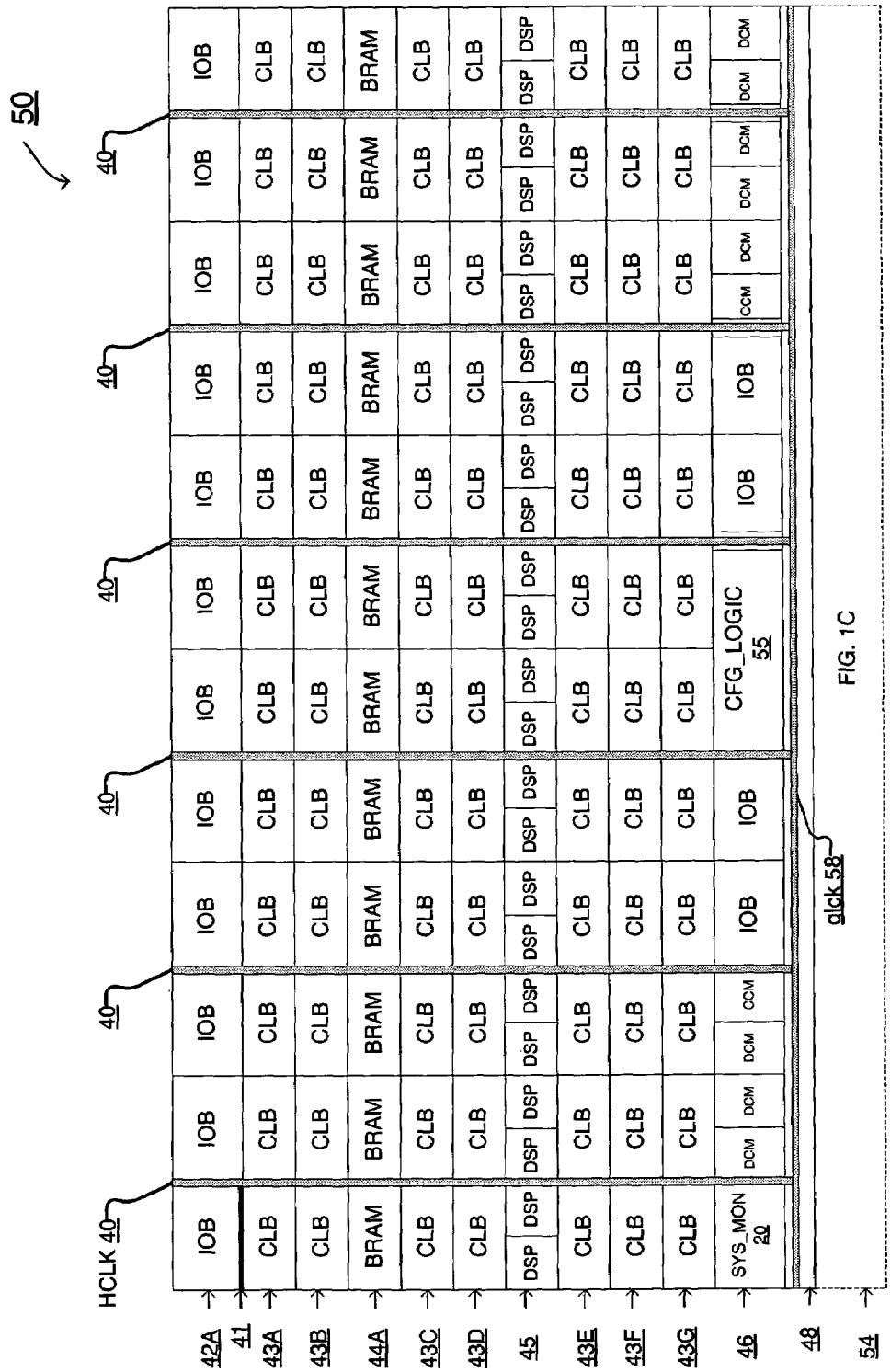
FIGS. 1B and 1C are high-level block diagrams depicting an exemplary embodiment of an FPGA with a "columnar" architecture.
Figure 1C:
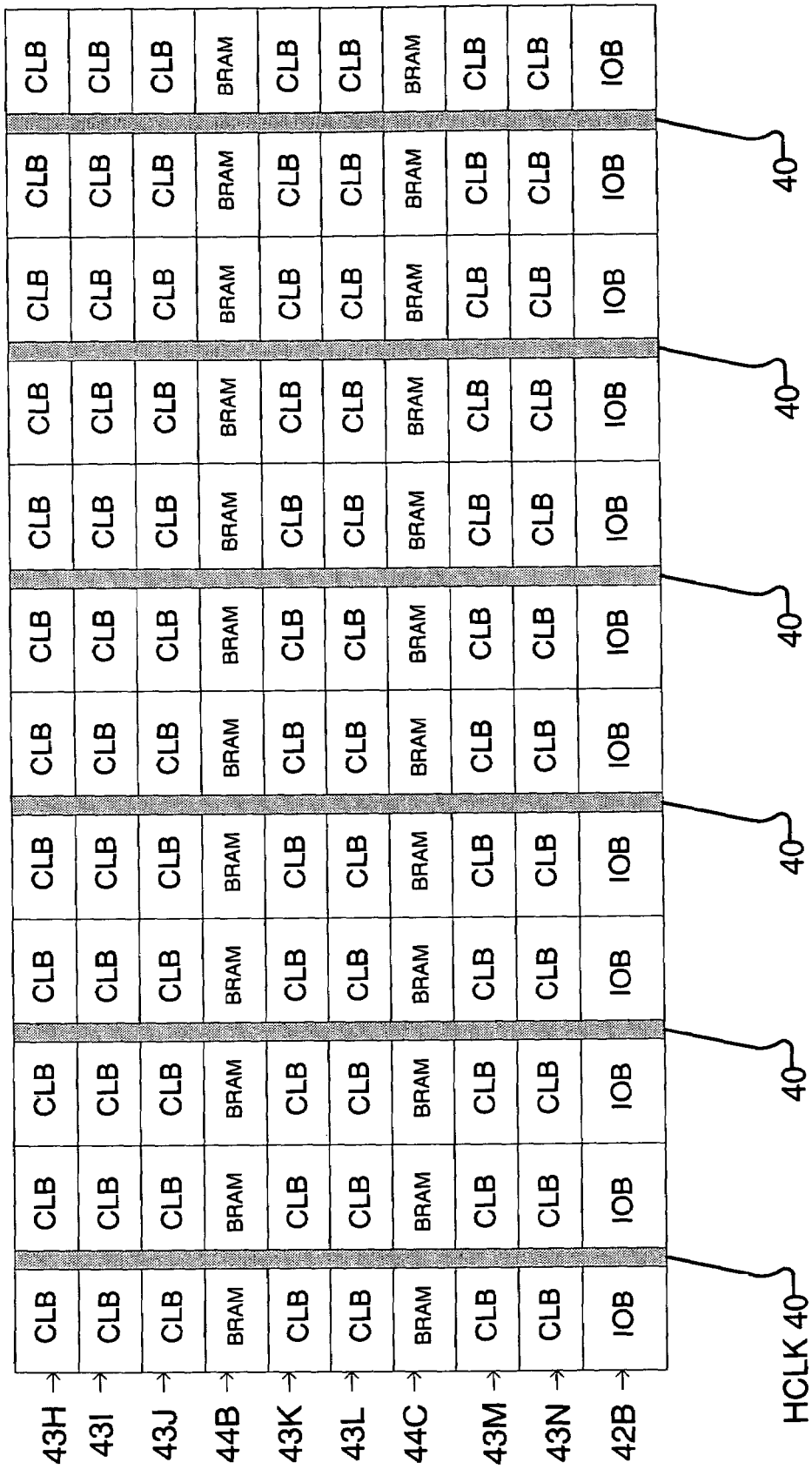

FIGS. 1B and 1C (not to scale) are high-level block diagrams depicting an exemplary embodiment of an FPGA 50 with a "columnar" architecture. FIG. 1B illustratively shows a top portion of FPGA 50, and FIG. 1C illustratively shows the bottom portion of FPGA 50.

Figure 1D:
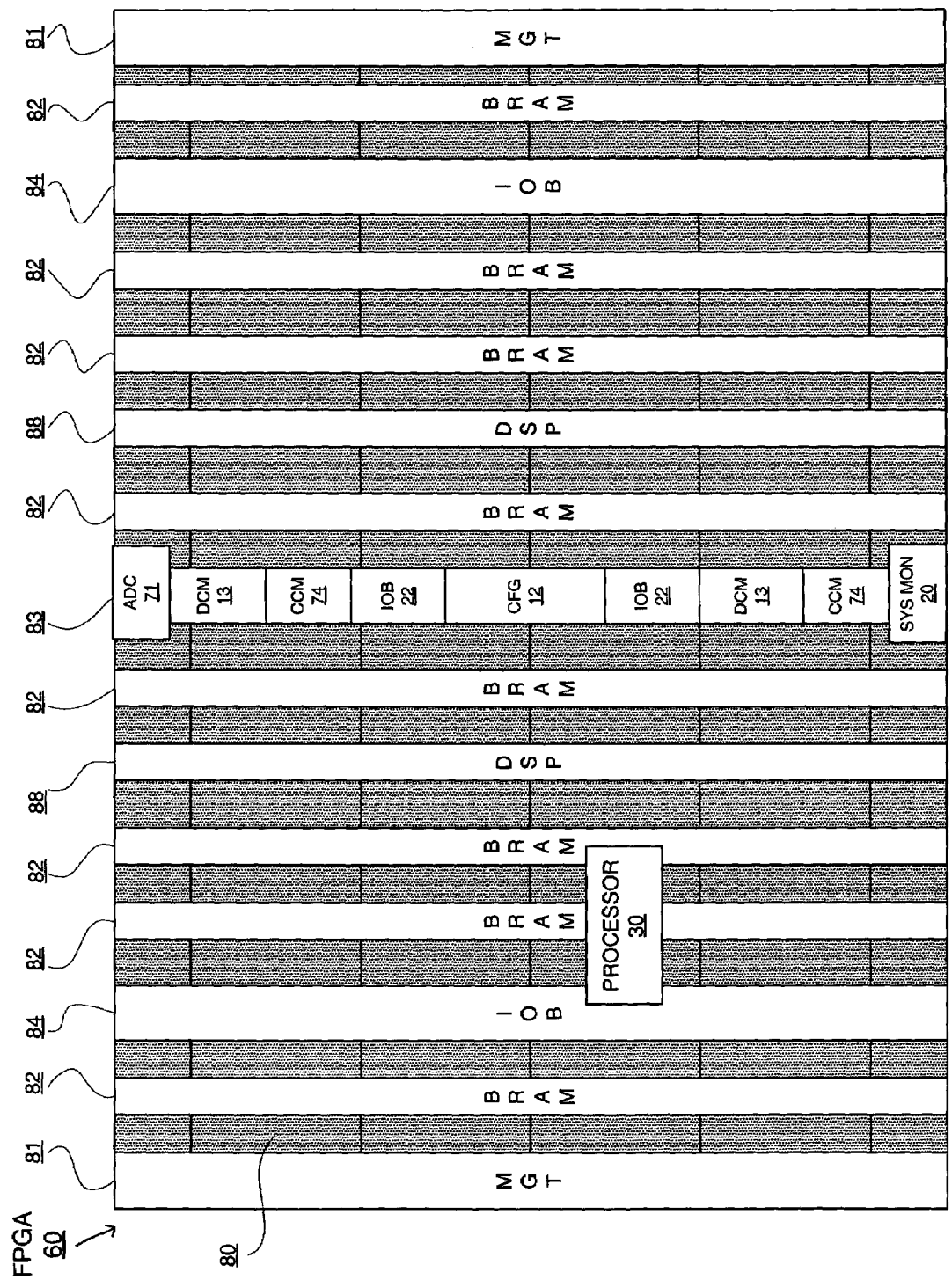
FIG. 1D is a high-level block diagram depicting another exemplary embodiment of an FPGA with a "columnar" architecture and with an embedded processor.

FIG. 1D (not to scale) is a high-level block diagram depicting another exemplary embodiment of an FPGA 60 with a "columnar" architecture and with an embedded processor 30. A column of MGTs 81 may be disposed on opposite sides of FPGA 60. Programmable fabric 80, which may include CLBs and programmable interconnects, may be used to respectively couple columns of MGTs 81 to columns of BRAMs 82. Programmable fabric 80 may be used to couple columns of BRAMs 82 to one another and to columns of IOBs 84. This inward progression on two opposing sides of FGPA 60 of coupling columns may continue until a center or generally centrally located column 83 is reached.

Center column 83 may be coupled to columns of BRAMs 82 via programmable fabric 80. Center column 83 may include function logic blocks. Function logic blocks may, for example, include a System Monitor ("SM") 20, one or more DCMs 13, one or more clock companion modules ("CCMs"), and configuration logic ("CFG") 12, and one or more IOBs 22, among other function logic blocks. Notably, not all function blocks have to be located in center column 83. For example, Digital Signal Processors ("DSPs") may be instantiated in columns of DSPs 88, which are coupled to columns of BRAMS 82 via programmable fabric 80. Alternatively, one or more DSPs may be included in center column 83.

System monitor 20 may include an ADC to monitor parameters like temperature and voltage, both internally ("on-chip") and externally ("off-chip"). A second ADC 71 may be instantiated, for example generally at the top of center column 83 of FPGA 60, to provide additional external analog channels. Notably, a second ADC 71 may be included in FPGA 10 of FIG. 1A.

DCMs 13 may include circuits to perform clock de-skew, clock phase shifting, clock frequency synthesis, and other clock features. CCMs 74 may include circuits for phase-matched binary clock division and internal clock jitter and skew measurement.

Configuration logic 12 includes logic used to address and load configuration information into configuration memory cells, such as SRAM-based configuration memory cells, during configuration of FPGA 60 from an externally supplied bitstream. Configuration logic 12 may include configuration registers, boundary-scan test circuitry, such as TAP controller circuitry, and encryption or decryption circuitry used to respectively encrypt or decrypt bitstreams of configuration data loaded into or read out of FPGA 60 as applicable. Additional details regarding FPGA 60 may be found in a co-pending U.S. patent application Ser. No. 10/683,944, entitled "Columnar Architecture", by Young, filed Oct. 10, 2003, which is incorporated by reference herein in its entirety.

FIGS. 1B and 1C in combination provide a more detailed block diagram of an FPGA 50 having a columnar architecture, though columns have been transposed for rows. The word "tile" as used herein includes an area comprising a) circuitry with one or more programmable functions, including memory, or fixed non-programmable circuitry, and b) programmable interconnections.

CLB tiles 43 are laid out in a two-dimensional array. In this example, each CLB tile 43 includes a portion of a programmable interconnect structure such that at least part of the programmable interconnect structure for FPGA 50 is formed by the various portions of the many CLBs when CLB tiles 43 are formed together for FPGA 50. Also illustrated are block random memory/multiplier (BRAM/Multiplier) tiles 44.

In order to provide input/output circuitry for interfacing FPGA 50 to external logic, IOB tiles 42 are provided along two outermost rows (e.g., top and bottom rows) of FPGA 50. In this particular example, an input/output interconnect tile ("IOI tile") is used to couple an IOB tile to a CLB tile. Reference numeral 41 points to one such IOI tile. IOI tile 41 is disposed between an IOB tile 42 and a CLB tile 43.

DSPs are placed in tile area 45. A generally central tile area 46 may be used for support circuitry. The support circuitry may include, for example, DCMs 13, CCMs 74, IOBs 22, configuration logic 12, encryption/decryption logic, global clock driver circuitry, boundary-scan circuitry and System Monitor 20.

In this particular example, clock distribution circuitry is located in tile areas 48 and 52. Tile area 48 is for DCM clock distribution, IOB clock distribution and H-tree row clock distribution, as well as FPGA "global" buffers ("BUFG"). Notably, H-tree clock distribution 40 may be disposed between columns of tiles. Tile area 52 is for FPGA "global" clock distribution 58.

Figure 1E:
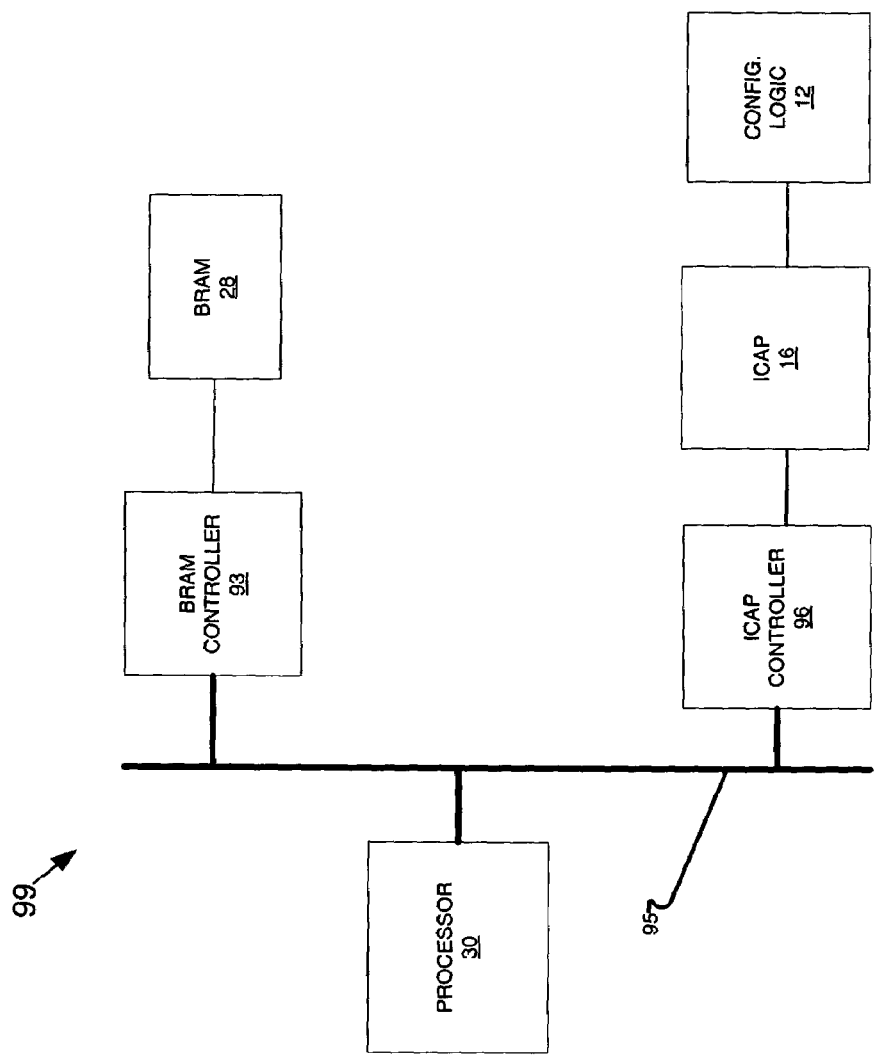
FIG. 1E is a block diagram depicting an exemplary embodiment of an internal configuration/reconfiguration ("configuration") interface.

FIG. 1E is a block diagram depicting an exemplary embodiment of an internal configuration/reconfiguration ("configuration") interface 99. Internal configuration interface 99 includes a processor 30, a BRAM controller 93, at least one BRAM 28, an ICAP controller 96, and ICAP 16, and configuration logic 12. BRAM controller 93 and ICAP controller 96 may be instantiated using configurable logic and programmable interconnects to provide bus 95 connectivity with processor 30. Configuration interface 99 is described in additional detail in a co-pending U.S. patent application Ser. No. 10/377,857 entitled "Reconfiguration of a Programmable Logic Device Using Internal Control", by Blodget et al., filed Feb. 28, 2003, which is incorporated by reference herein in its entirety.

System Monitor and ADC.

Figure 2:
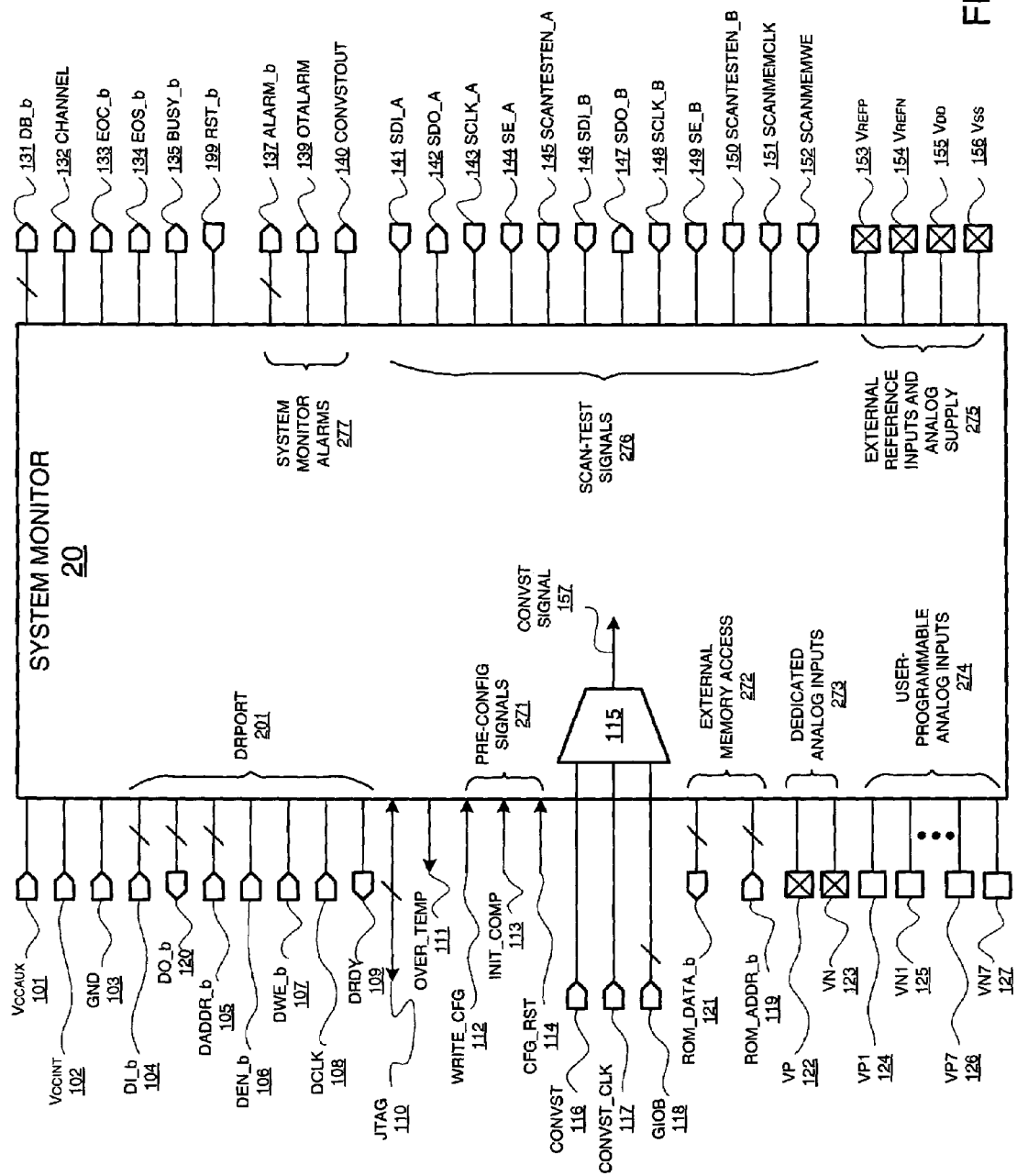
FIG. 2 is a high-level schematic/block diagram depicting an exemplary embodiment of a pin-out for a System Monitor of FIGS. 1A and 1B.

FIG. 2 is a high-level schematic/block diagram depicting an exemplary embodiment of a pin-out for System Monitor 20. Notably, inverted signals are indicated with "_b" in the signal identifier. However, for clarity, inverted signals are referred to as "signals" elsewhere herein. With simultaneous reference to FIGS. 1A through 1E and FIG. 2, the pin-out of System Monitor 20 is further described.

Input pin 101 is for receiving an auxiliary supply voltage ($V_{CCAUX}$) for System Monitor 20 and for interface and level translation logic. Input pin 102 is for receiving an internal supply voltage ($V_{CCINT}$). Internal supply voltage 102 supplies voltage for digital logic of System Monitor 20. Input pin 103 is for receipt of a ground for System Monitor 20.

Input pins 104 through 108 are inputs from a dynamic reconfiguration port ("DRP" or "DRPORT") 201. DRP 201 is described in more detail in a co-pending patent application entitled "Reconfiguration Port for Dynamic Reconfiguration", by Vasisht M. Vadi et al.

Input pin 104 or more particularly input pins 104 are data input pins for a System Monitor register input. Data input 104 may be a 16-bit wide input (i.e., 16 separate input pins for parallel input). Data inputs allow data to be written to System Monitor registers. Output pins 120 are data output pins for providing System Monitor register outputs. Output pins 120 may be for a 16-bit wide data output. Data output signal 120 is for reading data from System Monitor registers Input pin 105, or more particularly input pins 105, are for receiving a System Monitor register address. Data address signal 105 may be 7-bits wide. Input pin 106 is for receiving a data enable signal, which is a DRP 201 enable signal. Input pin 107 is for receiving a data write enable signal, which is a System Monitor register write enable signal. Input pin 108 is for receiving a DRP clock signal ("DCLK"), which may be a reference clock signal for read and write operations to DRP 201. It may also be used as the reference clock for the control logic of System Monitor 20. Output pin 109 is for a data ready signal for DRP 201. Data ready signal 109 may be used to indicate that data written to a dynamic reconfiguration port has been latched or that data on an output data bus of System Monitor 20 is valid or otherwise may be read out.

Input pins 104 through 108 and output pins 109 and 120 collectively are DRP (DRPORT) 201. Pins 104 through 108 and pins 109 and 120 may be connected to a programmable interconnect of a programmable logic device, such as a field programmable gate array ("FPGA").

Accordingly, it should be understood that via DRP 201 registers of System Monitor 20 may be written to or read from during operation of System Monitor 20 for dynamic writes or reads. System Monitor 20 includes ADC configuration, sequence and alarm registers that may be dynamically accessed for a read or write operation via DRP 201.

Input pin 199 is for receiving a configuration reset signal, which may be used to reset logic and interface portions of System Monitor 20. Notably, System Monitor register contents are not reset by reset signal 199. A logic high signal on input pin 199 resets System Monitor control logic. Responsive to reset signal 199 being de-asserted, System Monitor 20 leaves the reset state on a next positive edge of DRP clock signal 108. Input pin 199 may be connected to an FPGA programmable interconnect, such as local interconnect.

Bi-directional interface 110 is an IEEE 1149.1 TAP interface. Control signals may be provided via the IEEE 1149.1 interface to System Monitor 20. System Monitor 20 includes a dedicated connection between data registers and a TAP controller state machine, where the TAP controller state machine is instantiated in configuration logic of the FPGA. Notably, the TAP controller state machine may be instantiated on any post power-up configuration of the FPGA such that access to System Monitor data is provided. Alternatively, the TAP controller state machine (e.g., "JTAG state machine") may be dedicated ("hardwired") logic, which is hardwired to System Monitor 20. Bi-directional interface 110 may be used to pre-configure System Monitor 20 prior to configuration of an FPGA in which System Monitor 20 is located. In other words, dedicated connections of bi-directional interface 110 may be accessed to configure System Monitor 20 after a host FPGA is powered up or when a host FPGA is in a power down mode. This facilitates verifying functionality of a host FPGA prior to configuration thereof.

Output pin 111 may be formed using dedicated connections to a host FPGA, namely, such connections are hardwired as opposed to formed using programmable interconnects. Output pin 111 is for outputting an over-temperature ("OT") signal. OT signal 111 is coupled to FPGA configuration logic by dedicated wires that are not interconnect wires. Thus, such dedicated connections may remain functional even after a host FPGA enters a power down mode. OT signal 111 may be used to send an FPGA into a power down mode responsive to reaching a threshold temperature. However, even in the power down mode, System Monitor 20 will continue to function (using an internal oscillator), and reassert OT signal 111 responsive to a previously overheated FPGA cooling down to a temperature where it may be powered up again without significant risk to damaging the FPGA. If the FPGA, or other integrated circuit, is being automatically powered down, a user would see this flag go active prior to chip power down and be able to do one or both of logging the event or activating a safe power down.

Input pins 112 through 114 may be to dedicated connections to a host FPGA, namely, such connections are hardwired. Input pins 112 through 114 are System Monitor pre-configuration signals 271. Input pin 112 is for receiving a configuration write signal. Configuration write signal 112 may be used to place System Monitor 20 in a temperature only monitoring mode during full or partial configuration of a host FPGA. Notably, thermal monitoring may be initiated prior to configuration of the host FPGA. Configuration write signal 112 places System Monitor 20 in a "safe" operating mode where it continues to monitor temperature or other parameters even during FPGA configuration. In this "safe" operating mode, System Monitor 20 is insensitive to random changes of bits in the control registers which may happen during configuration of a host FPGA.

Input pin 113 is for receipt of an initialization completed signal. Input pin 113 may be part of a dedicated connection from configuration logic 12 of a host FPGA 10 to System Monitor 20, where configuration logic 12 provides an initialization complete signal 113 indicating that a power-up sequence of the host FPGA has completed. Notably, this initialization complete signal 113 may be used as a flag to cause System Monitor 20 to start monitoring temperature or other analog parameters of the host FPGA. Examples of such other analog parameters may include power supply voltages, power supply currents, and internal test voltages, among others.

Input pin 114 is for receipt of a configuration/chip reset signal. A configuration reset signal 114 may be asserted whenever a full-chip reset is to be undertaken. System monitor 20 may use configuration reset signal 114 to reset portions of System Monitor logic and interface ports.

Input pins 116, 117 and 118 may be connected to FPGA programmable interconnects for input to multiplexer 115. Input pin 116 is for receipt of logic input for a Convert Start ("CONVST") signal. Input pin 117 is for receipt of a local clock input for a CONVST clock signal. Input pin 118, or more particularly input pins 118, is for receipt of global clock inputs. Global clock inputs 118 may for example be 16-bits wide. Global clock inputs 118 allow a CONVST clock to be taken from an IOB clock bus of a host FPGA, which may be a differential signal having little to no jitter and little to no skew. For global clock input 118 being 16-bits wide, one of 16 possible clocks may be selected by multiplexer 115. Whether selected from input pin 116, 117 or 118, output of multiplexer 115 is CONVST clock signal 157. CONVST clock signal 157 may be used to define an ADC sampling instant for an event-sampling mode.

Interconnect resources exist throughout interconnect tiles of an FPGA to allow flexibility in routing resources. DRP clock signal 108 may be obtained from a general interconnect tile. CONVST clock signal 116, used for event mode sampling, may not come from an interconnect tile but may be obtained from a clock multiplexer implemented within System Monitor block 20.

Because of a source clock is used for reference generation for on-chip sensors, which are switch capacitor based, DRP clock signal 108 is used for functioning of System Monitor block 20.

Configuration memory cells of a host FPGA may be tested using a readback operation as described in the co-pending patent application entitled "Reconfiguration Port for Dynamic Reconfiguration", by Vasisht M. Vadi et. al., filed concurrently), which is incorporated herein by reference in its entirety. A separate memory interface to an embedded processor memory interface, such as a hardwired PicoBlaze or MicroBlaze, where the PicoBlaze and MicroBlaze softcores are available from Xilinx, Inc. of San Jose, Calif., may be accessed via memory address pins 119 and memory data pins 120. As described below in additional detail, programmable read-only memory may optionally be included with System Monitor 20 for access by an embedded processor. The embedded processor may be used to run programs out of such memory, such as averaging values, among other functions described herein. However, if there is not sufficient area for including programmable read-only memory within System Monitor 20, memory internal or external to a host FPGA may be accessed via pins 119 and 121.

Input pins 122 and 123 may be connected to dedicated interconnects of a host FPGA. These are dedicated pins connected to package pins and are not connected through FPGA programmable interconnects. Rather, input pins 122 and 123 are analog inputs for an ADC and as such are ADC pins. Pins 124 through 127 may be provided as selectable pins using local digital input/output ("IO") pins of a host FPGA.

Pins 122 and 123 are respectively for receiving positive and negative analog voltage inputs. By providing dedicated external analog inputs for an ADC, pins 122 and 123 provide one differential analog input channel.

Input pins 124 and 125 are for respectively receiving positive and negative analog voltage inputs, namely, an external analog input channel. There may be multiple user selectable analog input pins external to System Monitor 20 which would depend in part upon the number of external analog input channels for an ADC, as indicated as pairs of positive and negative voltage input analog pin pairs 124, 125 to 126, 127. Though for purposes of clarity, seven external analog input channels are described below, fewer or more analog external input channels may be used. Notably, fewer or more analog input channels may be provided by reconfiguring local digital IO's. Such analog input channels may be defined at or during configuration of a host FPGA.

Output pins 131 through 135 and 137 through 140 may be coupled to programmable interconnects of a host FPGA. Output pins 131 through 135 are ADC outputs. Output pins 131 are for a data output signal of an ADC. Notably, bus width of this data bus 131 may be 12-bits. Notably, data bus 131 may be 12-bits wide, with only a portion of those 12 bits being available to a user for purposes of analog-to-digital conversion. A result of analog-to-digital conversion of analog information by an ADC of System Monitor 20 is provided as output as data output signal 131. An ongoing analog-to-digital conversion process by an ADC of System Monitor 20 is indicated by output signal 135, namely busy signal 135. For example, for the duration of an analog-to-digital conversion busy signal 135 will be at a logic high voltage and at the conclusion of such an analog-to-digital conversion busy signal 135 will transition to a logic low voltage.

Output signal 132 is a channel output signal. Channel signal 132 indicates what channel, for example, one of five available channels, is being used for data output 131.

Output pin 133 is for an end of conversion ("EOC") signal. EOC signal 133 output is a voltage logic level high pulse within one period of DRP clock input 108 to indicate that a result of an analog-to-digital conversion, including an averaging function thereof, has been transferred to output data registers.

Output pin 134 is for an end of sequence ("EOS") signal. EOS signal 134 is a logic level high pulse within one period of DRP clock signal 108 to indicate an end of a sequence such as for a channel sequencer 222 (shown in FIG. 3A).

Outputs 137 are for alarm signals. For example, there may be seven separate output pins 137 for alarm signals. Alarm signals 137 are used to indicate that measured on chip parameters, such environmental conditions or physical characteristics of a host FPGA or a platform monitored by a host FPGA, have exceeded alarm threshold values specified in alarm registers of System Monitor 20.

Output pin 139 is for an over temperature alarm signal. Over temperature alarm signal 139 is available on a programmable interconnect of a host FPGA in contrast to a dedicated or hardwired connection as used for over temperature signal 111. Over temperature alarm signal 139 may go active a few milliseconds before over temperature signal 111.

Output pin 140 is for a CONVST output clock signal. CONVST clock output signal 140 may be derived from CONVST clock signal 157. In order to test the output of multiplexer 115, CONVST output clock signal 140 may be fed back to a programmable interconnect via a logic created input.

Additional ports may be used for production testing. There may be two sets of scan ports, such as scan port A and scan port B for such production testing. For example, input pins 141 and 146 may respectively be for scanned data input to port A and port B. Output pins 142 and 147 may be for scan data outputs from port A and from port B respectively. Input pin 143 and input pin 148 may be for respective port A and port B scan clock signals. Input pin 144 and input pin 149 may be for respective port A and port B scan enable signals. Input pin 145 and input pin 150 may be for respective port A and port B scan test enable signals. Input pin 151 may be for a scan memory clock signal. Input pin 152 may be for a scan memory write enable signal. Accordingly, pins 141 through 152 are for scan test signals 276 and are connected to host FPGA through programmable interconnects.

Dedicated external pins 153 through 156 may be used as external reference inputs for an ADC external reference inputs and analog supply 275. For example, pin 153 may be for a positive reference voltage. Pin 154 may be used for a negative reference voltage. Pin 155 may be for an ADC supply voltage, $AV_{DD}$. Pin 156 may be for an ADC ground reference, $AV_{SS}$.

Figure 3A:
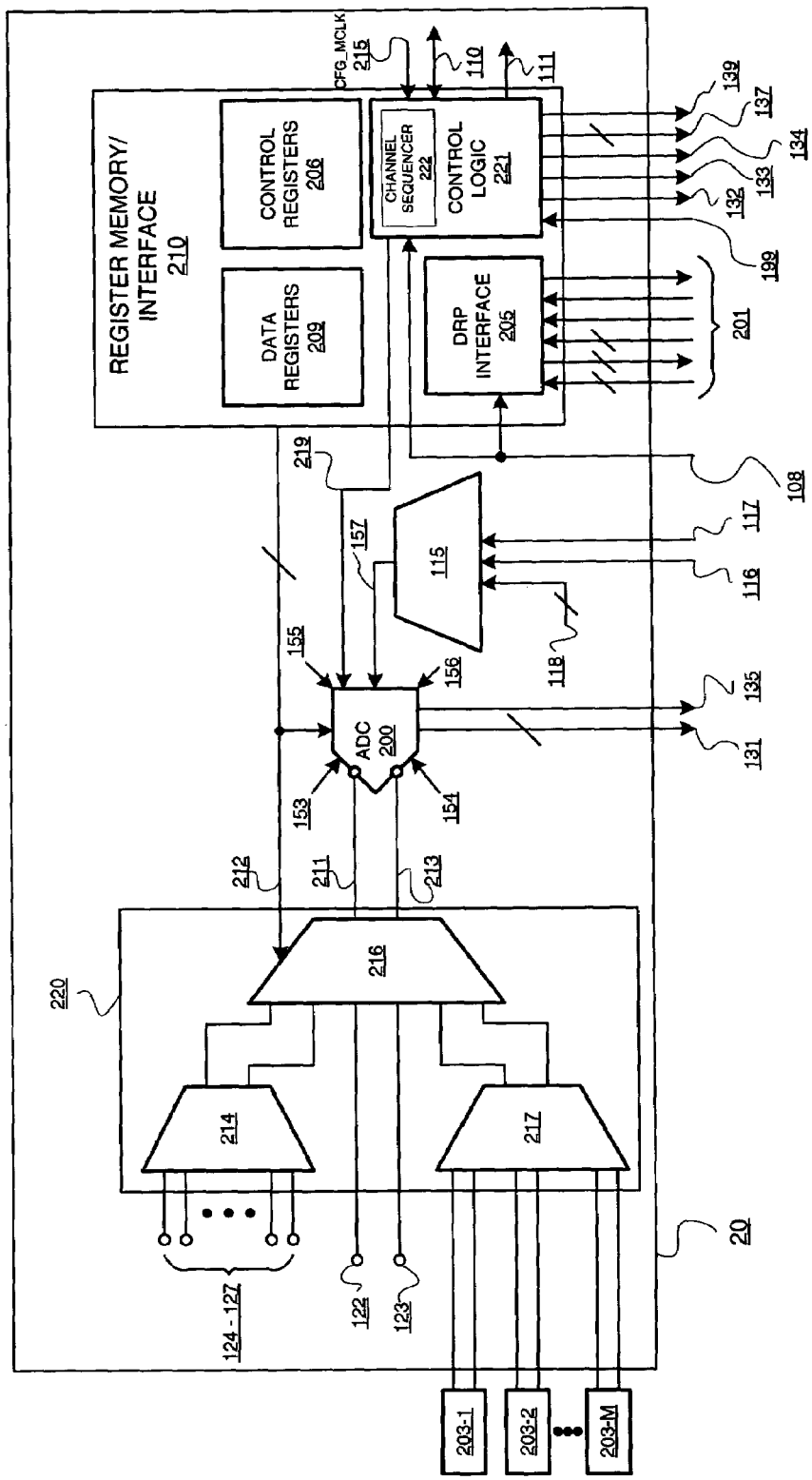
FIG. 3A is a schematic/block diagram depicting an exemplary embodiment of the System Monitor of FIG. 2.

With continuing reference to FIG. 2, and additional reference to FIG. 3A, an exemplary embodiment of the System Monitor 20 is further described. System Monitor 20 is coupled to FPGA internal sensors 203-1 to 203-M ("internal sensors 203"), for M a positive integer. For purposes of illustration, it is assumed that M is equal to three, though fewer or more than three sensors may be used.

Internal sensors 203 are analog sensors. Examples of sensors 203 include temperature sensors, supply voltage monitor sensors, and supply voltage peak/sag capture detectors. Notably, though sensor/detectors 203 are referred to as internal transducers, both external and internal transducers may be used with System Monitor 20.

External differential analog input channels are provided with differential analog input pairs 124 through 127. A differential analog input pair may be selected for output from multiplexer 214 for input to multiplexer 216. Analog inputs 124 through 127 may use differential digital input/output pairs in a selected input/output portion of a bank of input/output blocks of an FPGA. For example, fourteen local digital inputs/outputs of an FPGA may be used to provide seven differential analog channels. Notably, analog input channels 124 through 127 may be used to monitor FPGA external environmental conditions or physical characteristics, such including without limitation power supply, voltages, currents, temperature of transducers, and chassis integrity. Additionally, dedicated analog inputs 122 and 123 may be provided as inputs to multiplexer 216.

Outputs of internal sensors/detectors 203 are provided as inputs to multiplexer 217, and one or more of such inputs to multiplexer 217 may be provided as output for input to multiplexer 216.

Control signals, such as from a channel sequencer 222, for multiplexers 214 and 217 monitoring environmental conditions or physical characteristics, may sequentially select channels for input to multiplexer 216. However, with respect to multiplexer 216, output is selected responsive to control signal 212. Control signal 212 is a channel selection control signal. Accordingly, internal or external parameters are selected for output for multiplexer 216 as determined by appropriate channel selection in ADC control registers 206. Channel selection signal 212 is responsive to ADC control registers 206.

Output of multiplexer 216 is provided as input to ADC 200. ADC 200 receives reference voltage inputs 153 through 156. ADC 200 receives control signal 212, CONVST clock signal 157 and ADC clock signal 219. Output of ADC 200 includes ADC data bus signaling 131 and busy signal 135. System Monitor 20 may be located at a bottom of a center column of an FPGA. Notably, one or more System Monitors may be included in an FPGA subject to device size limitations. For example, one System Monitor may be instantiated at a bottom location of a center column of an FPGA having one ADC 200 and another ADC may be instantiated at a top location of the center column of such an FPGA. One input/output bank to a side, such as the left side, of a center column of the FPGA may be used for analog inputs 124 through 127.

System Monitor 20 may be configured to monitor on-chip environmental conditions and physical characteristics for self monitoring, and perform self-calibration responsive to such self monitoring. System monitor 20 may be dynamically configured and controlled via a DRP 201 with signal inputs and outputs as previously described.

ADC 200 may have a resolution of a number of bits and have a specified maximum sampling speed. For example, ADC may have a resolution of 10 bits and a maximum sampling speed of 200 kilo-samples per second ("kSPS"). Specifications of ADC 200 relating to System Monitoring include measurement accuracy with respect to slowly varying or direct current analog input signals, as these signals may be representative of a monitoring application. For example, in an embodiment having a 10-bit ADC, there is a minimum theoretical measurement accuracy of 1 in 1,024 counts. Thus, a signal level within an analog input range of such a 10-bit ADC may be at least resolved to an accuracy of 0.1%.

However, inaccuracy in transducers, such as resistive attenuation, and errors in an implementation of an ADC may limit measurement accuracy to within plus or minus 1%. If a linearity error of an ADC is less than 0.5 of one least significant bit ("LSB"), other errors in the ADC and transducers such as offset error and gain error may be mitigated by doing post-conversion digital correction. Accordingly, measurement accuracies with post-conversion digital correction of less than 0.1% may be obtained.

By using a multiplexer tree 220, the number of ADC analog input channels may be increased beyond the number of input channels of ADC 200. For example if ADC 200 has one differential input channel provided by inputs 211 and 213, by having output of multiplexer 216 coupled to such inputs 211 and 213, any of the input channels of multiplexer tree 220 may be selected for output from multiplexer 216 as input to ADC 200. Though three multiplexers are shown for multiplexer tree 220, fewer or more multiplexers may be used.

ADC clock signal 219 may be provided from control logic 221. Control logic 22-1 is coupled to receive oscillator signal 215 and DRP clock signal 108. Control logic 221 may use a clock source from DRP clock signal 108 or an internal FPGA oscillator signal 215, which is defined by internal FPGA configuration. Additionally, DRP clock signal 108 is provided to DRP interface 205.

Control logic 211 is configured to provide over temperature signal 111 and includes circuitry for an IEEE Standard 1149.1 TAP interface 110. Control logic 211 is coupled to System Monitor register memory/interface 210. System Monitor register memory/interface 210 includes control registers 206 and data registers 209. DRP interface 205 includes a memory controller for reading and writing from and to System Monitor memory 210.

System Monitor register memory/interface 210 further includes DRP interface 205. DRP interface 205 includes a controller for DRP 201, which is described in the co-pending patent application entitled "Reconfiguration Port for Dynamic Reconfiguration", by Vasisht M. Vadi et. al., filed concurrently. Notably, System Monitor control logic 221 of configuration memory/interface 210 provides channel signal 132, EOC signal 133, EOS signal 134, alarm signals 137, and over temperature alarm signal 139.

Figure 3B:
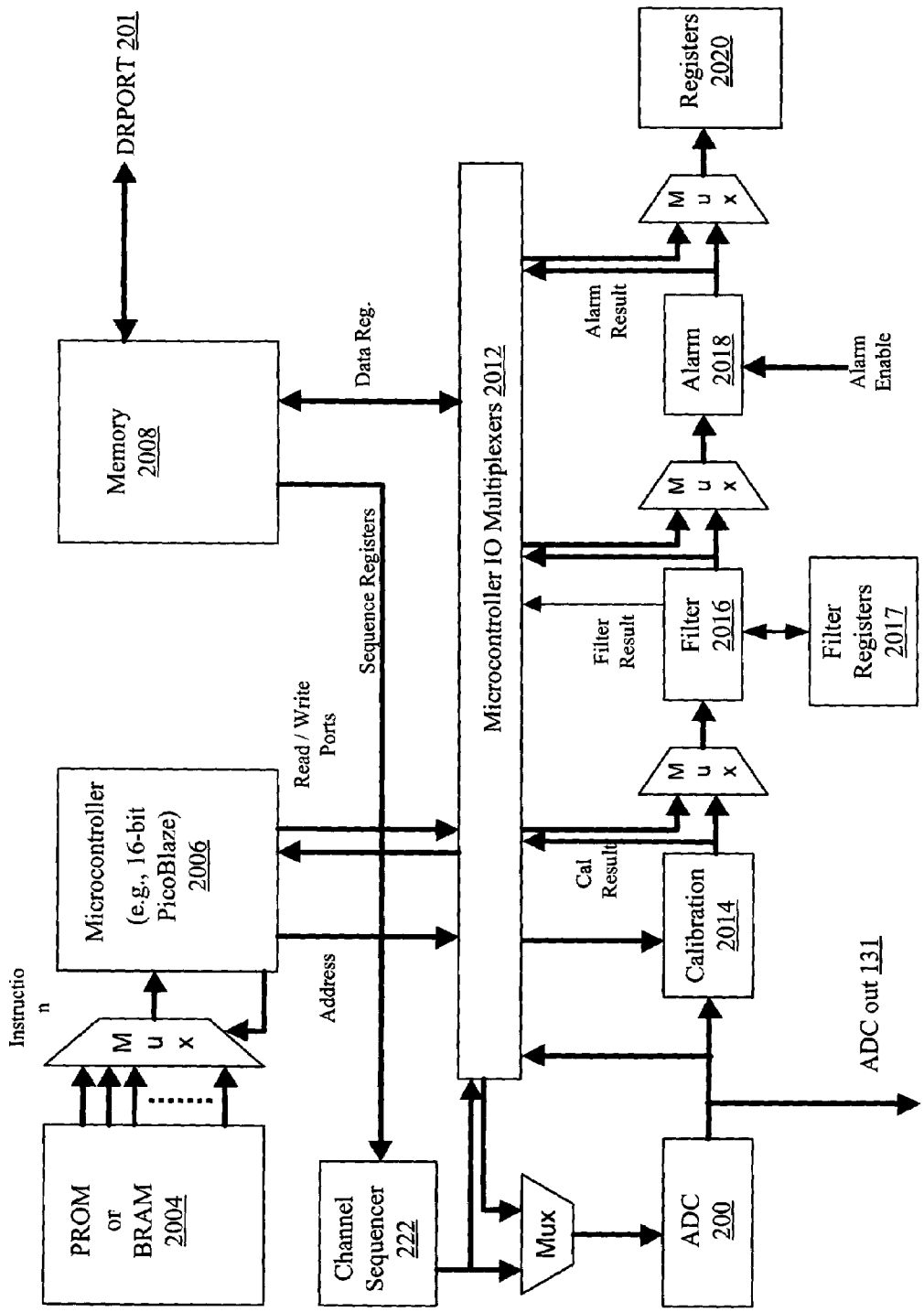
FIG. 3B is a simplified block diagram of a System Monitor of an alternative embodiment of the present invention.

FIG. 3B is a simplified block diagram of a System Monitor of an alternative embodiment of the present invention. The system monitor includes a microcontroller 2006 such as a hardwired 16-bit PicoBlaze from Xilinx Corp. of San Jose, Calif., a memory 2008 having data registers 209 and control registers 206 (see FIG. 4), a channel sequencer 222 (which allows a user to set up a sequence of channels via sequence registers 312 and their associated operating conditions for automatic monitoring), an ADC 200 (see FIG. 3C), a Calibration block 2014 receiving set calibration values such as gain and offset from calibration registers 313 (see FIG. 4), a Filter block 2016 may filter data based on filter parameters set in filter registers 2017, an Alarm block 2018 using set values from alarm registers 314 to do a comparison with monitored values, registers 2020 for general storage of results and Input/Output (I/O) multiplexers 2012 which connect together the microcontroller 2006, memory 2008, channel sequencer 222, ADC 200, calibration 2014, filter 2016, alarm 2018, and registers 2020.

The 16-bit PicoBlaze is described in PicoBlaze 8-Bit Microcontroller for Virtex-II Series Devices XAPP627 (v1.1) Feb. 4, 2003, and in Appendix A, both of which are incorporated by reference, herein. In one embodiment the instructions for the 16-bit PicoBlaze are stored in a Programmable read-only memory (PROM) so that the microcontroller can perform the calibration 2014, filter 2016, and/or alarm 2018 functions independent of the state of the rest of the IC, e.g., FPGA. In another embodiment the instructions for the 16-bit PicoBlaze are stored in a block RAM (BRAM) on the FPGA such as BRAM 28 of FIG. 1 or BRAM in 44B or 44C of FIG. 1C.

As FIG. 3B shows there may be in one use of the System Monitor, a pipeline flow of data, e.g., the ADC 200 data can be calibrated (via calibration 2014) using calibration registers 313, then filtered (via filter 2016), then checked if there should be an alarm (via alarm 2018) by doing a comparison with a set value(s) in alarm registers 314 and the result of the comparison stored in registers 2020.

Figure 3C:
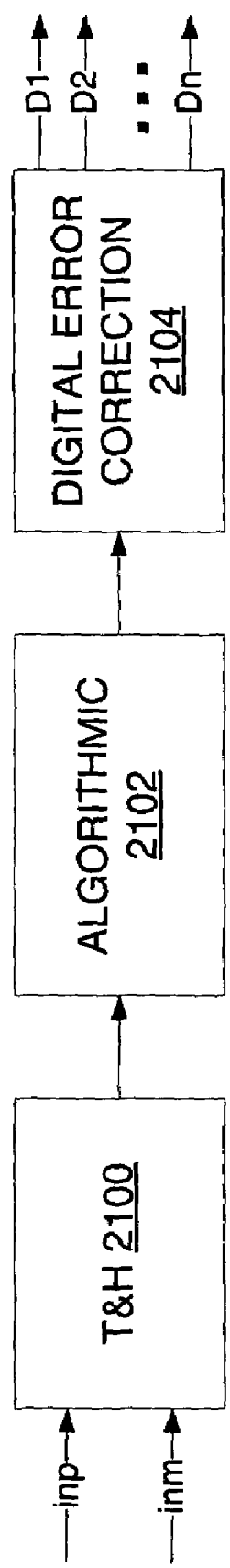
FIG. 3C is a block diagram of an ADC of an embodiment of the present invention.

FIG. 3C is a block diagram of an ADC 200 of an embodiment of the present invention. The track and hold (T&H) block 2100 is described in co-pending patent application, Ser. No. 10/231,541, entitled "Analog-to-Digital Converter which is Substantially Independent of Capacitor Mismatch" by Patrick J. Quinn, filed Aug. 29, 2002, which is herein incorporated by reference. The algorithmic block 2102 and digital error correction block 2104 are described in U.S. Pat. No. 6,642,751 B1, entitled "Configurable Track-and-Hold Circuit" by Patrick J. Quinn, filed Sep. 6, 2002, which is herein incorporated by reference.

Figure 4:
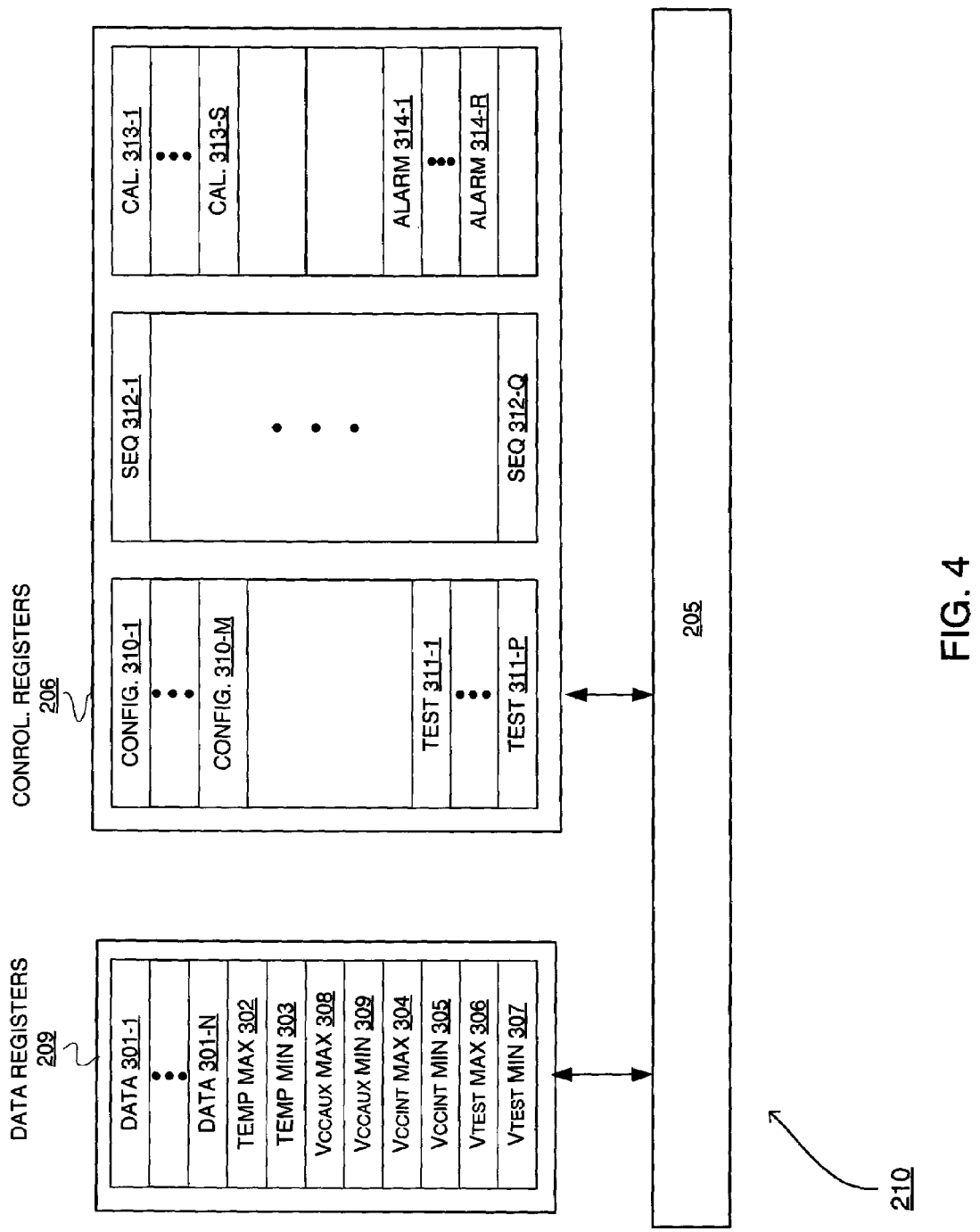
FIG. 4 is a block diagram depicting an exemplary embodiment of a memory map for System Monitor registers for system monitor register memory/interface of FIG. 3A

FIG. 4 is a block diagram depicting an exemplary embodiment of a memory map for System Monitor registers 206 and 209 for system monitor register memory/interface 210. With continuing reference to FIG. 4 and renewed reference to FIGS. 1A through 1E and 2, the memory map is further described.

Data registers 209 include data registers 301-1 through 301-N for N a positive integer, temperature maximum register 302, temperature minimum register 303, VCC auxiliary maximum register 308, VCC auxiliary minimum register 309, VCC internal maximum register 304, VCC internal minimum register 305, Vtest maximum register 306, and Vtest minimum register 307.

Control registers 206 include configuration registers 310-1 through 310-M for M a positive integer, and test registers 311-1 through 311-P for P a positive integer. Control registers 206 include sequence registers 312-1 through 312-Q for Q positive integer.

Control registers 206 include calibration registers 313-1 through 313-S for S a positive integer, alarm registers 314-1 through 314-R for R a positive integer.

By way of example not limitation, data registers 209 and control registers 206 may all be 16-bit wide registers. Moreover, by way of example, there may be 26 data registers 209 and 64 dynamically reconfigurable control registers 206. Control registers 206 may be dynamically reconfigured, such as to select a System Monitor channel and to store alarm threshold values for parameters being monitored, via DRP interface 205. Control registers 206 may be part of a random access memory block, such as a static random access memory block of memory of an FPGA. This block of memory may be dedicated memory of a function block, such as System Monitor 20, or may be dual ported configuration memory of an FPGA.

Notably, during initialization of an FPGA, default settings for control registers 206 may be set to default values as part of a configuration bit stream used to initialize an FPGA. This initialization allows System Monitor 20 to start operation in known condition, and facilitates alarm values to be stored and downloaded from FPGA configuration memory.

Continuing the above example, a first block of 32 registers of 64 control registers 206 includes System Monitor configuration registers 310, test registers 311 and channel sequence registers 312. Of the first 32 registers, six registers are reserved for configuration and testing of System Monitor 20, such as channel selection and sampling mode, among other configuration and test settings. Twenty registers of the first block of 32 registers are for defining channel selection for a sequence mode. The remaining six registers are unused and are not accessible via DRP 201.

Again, continuing the above example, the second block of 32 registers of the 64 dynamic reconfiguration registers may be used to hold alarm thresholds for digital comparison and calibration of coefficients for FPGA internal sensors. One of these registers may be defined for temperature sensor offset correction, such as one of test registers 311.

Figure 5:
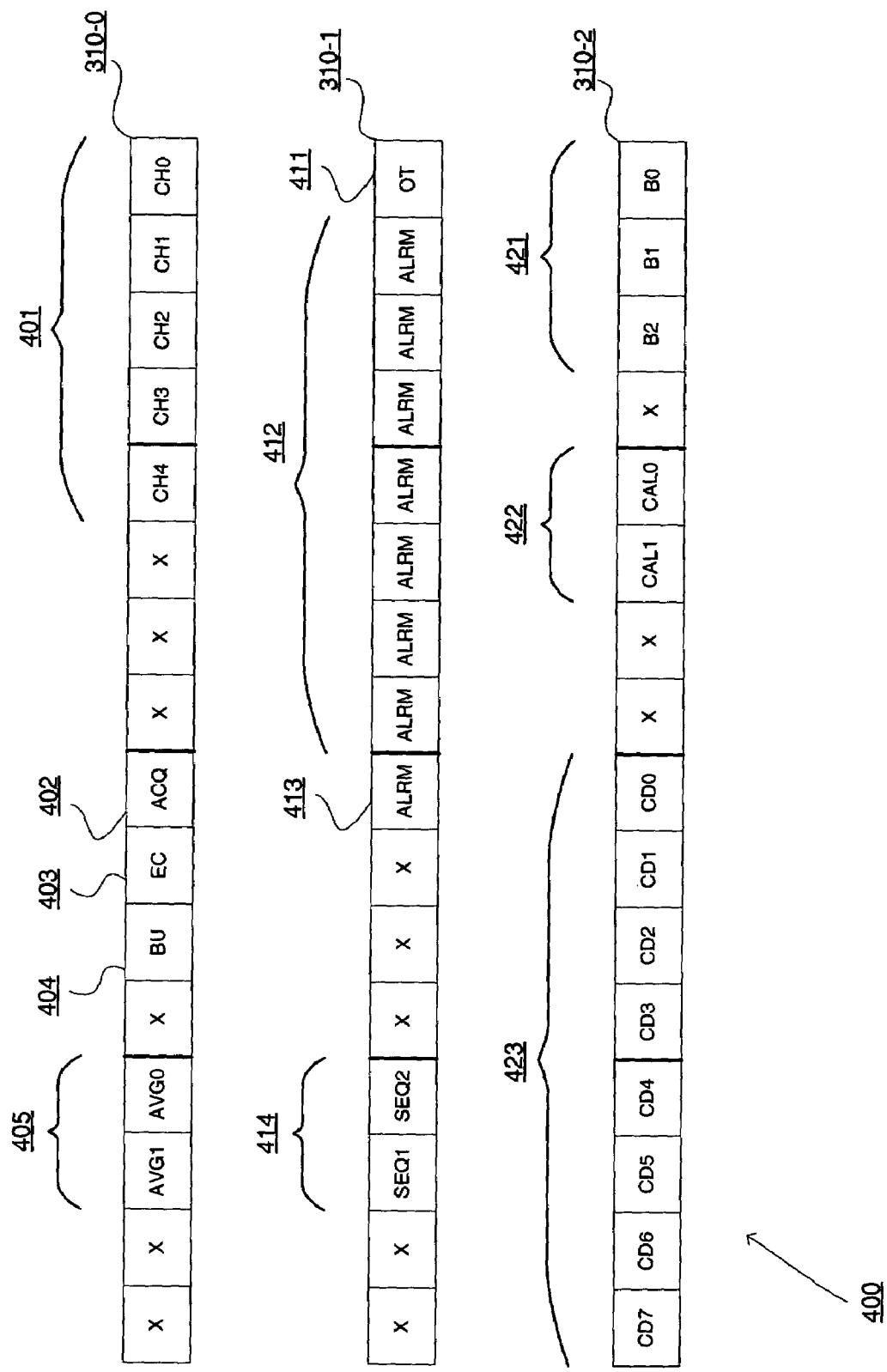
FIG. 5 is a block diagram depicting bit assignments for configuration registers of FIG. 4.

FIG. 5 is a block diagram depicting bit assignments 400 for configuration registers 310. Notably, bit locations are somewhat arbitrary. For example, bit locations 401 and 423 may be switched using some previously unused bit locations.

Moreover, for example, bit locations 402 through 405 may be swapped with bit locations 411 through 413. Additionally, for example, bit locations 411 may be switched with bit locations 412 using a previously unused bit location. Accordingly, it should be understood that bit locations are arbitrary, and bit locations other than those described below may be used. Configuration registers 310 may be reserved for System Monitor 20 configuration bits. Continuing the above example, for each configuration register 310, there are sixteen possible register bit locations in which data may be stored, of which only a portion of the register bit locations are used. Bit locations 401 of configuration register 310-0 ("configuration register 0") are used to select an analog input channel for ADC 200. A selected channel may be for receipt of an FPGA internally monitored parameter, such as voltage or temperature, or for receipt of an externally monitored parameter, such as output of a transducer external to a System Monitor 20 host FPGA. In a sequence mode, a selected channel may be monitored as a logic output of data bus 131 of ADC 200.

Data bit position 402 is used to increase acquisition time available for a Continuous Sampling Mode by a number, such as four, ADC clock cycles of ADC clock signal 108. Acquisition time may be increased by setting this bit for example to a logic one. Data bit position 403 is used to select either a continuous or an Event Driven Sampling Mode for ADC 200. For example, a logic one places ADC 200 in an Event Driven Sampling Mode, and a logic zero places ADC 200 in a Continuous Sampling Mode. Data bit position 404 is used to select either a unipolar or bipolar operating mode for analog input to ADC 200. For example, a logic one places ADC 200 in a bipolar mode, and a logic zero places ADC 200 in a unipolar mode. Bit positions 405 are used to enable averaging of data samples for a selected channel or channels. Registers 405 may be set for no averaging or averaging a number of samples, such as 16, 64 and 256.

Configuration register 310-1 ("configuration register 1") has data bit position 411 which is used to activate over temperature alarm signal 139 when a temperature exceeds a threshold temperature. For example, when a temperature greater than 120 degrees Celsius is detected, over temperature alarm signal 139 would be enabled by setting data in bit location 411 to a logic one value. Bit position 413 of configuration register 310-1 is used to enable automatic comparison of measured on-chip parameters, such as voltage and temperature, within limits defined in alarm registers 314 of FIG. 4.

Bit it positions 412 may be used to enable or disable individual alarm logic outputs. Contents of alarm registers 314 in FIG. 4 may be most significant bit ("MSB") justified, and alarm limits may be set using a 10-bit transfer function for FPGA internal temperature and voltage sensors.

Bit positions 414 may be used to enable a channel sequencer function. Sequence registers 414 may be used to disable a channel sequencer 222, or to activate a channel sequencer 222 for a one pass through sequence or for a continuous cycling of a sequence.

Bit it positions 422 of configuration register 310-2 may be set to a default or be used to activate digital calibration of FPGA internal sensors. Calibration registers 422 may be used for setting calibration on or off, setting ADC digital offset correction, setting a power supply digital offset correction, or setting both an ADC digital offset correction and a power supply digital offset correction to be active. Calibration registers 313 in FIG. 4 may be used to store calibration coefficients used by System Monitor 20. For example, a temperature offset correction may be used, an ADC offset correction may be used, and a power supply offset correction may be used.

Bit positions 423 of configuration register 310-2 are used to select a division ratio of a system clock input signal frequency and a lower frequency of ADC clock signal 108. Clock divider registers 423 may be used for dividing a system clock frequency down to a frequency for synchronization. For example, a DRP clock signal 108 has a maximum frequency, which for example may be approximately 450 MHz. A system clock signal for System Monitor 20 may be derived from DRP clock signal 108. For example, DRP clock signal 108 may be divided by two to provide a system clock signal, which for example may be approximately 225 MHz. However, ADC 200 may have an input clock frequency, namely, the frequency of ADC clock signal 219, which is substantially less than a frequency of a system clock signal of System Monitor 20.

For example, ADC 200 may operate with an ADC clock signal 219 in a frequency range of approximately 100 kHz to 2 MHz. ADC clock signal 219 is maintained at or about a frequency, such as 2 MHz, by dividing down a DRP clock signal 108 or on-chip oscillator clock signal 215 frequency. Accordingly, generation of an additional clock signal for System Monitor 20, and more particularly ADC 200, may be avoided by dividing down DRP clock signal 108 or oscillator clock signal 215 thereby avoiding adding complexity to interface 205. Clock division registers 423 may be used to divide down a system clock signal.

By dividing down DRP clock signal 108, a user my select an existing clock signal in a design and use it for System Monitor 20 thereby avoiding a dedicated System Monitor clock signal. In an embodiment, there are a minimum number of system clock signal cycles, such as four, used for each ADC clock signal 219 for some System Monitoring functions, and thus a divider ratio of this minimum number is a minimum.

System monitor 20 may include a temperature sensor 203 that produces a voltage output proportional to temperature of a die of a host FPGA. Output voltage of temperature sensor 203 may be provided by a well-known equation relating voltage to temperature, charge of an electron and Boltzmann constant. Output voltage of temperature sensor 203 may be coupled to ADC 200 to provide a digital output as part of data bus output signal 131.

Figure 6B:
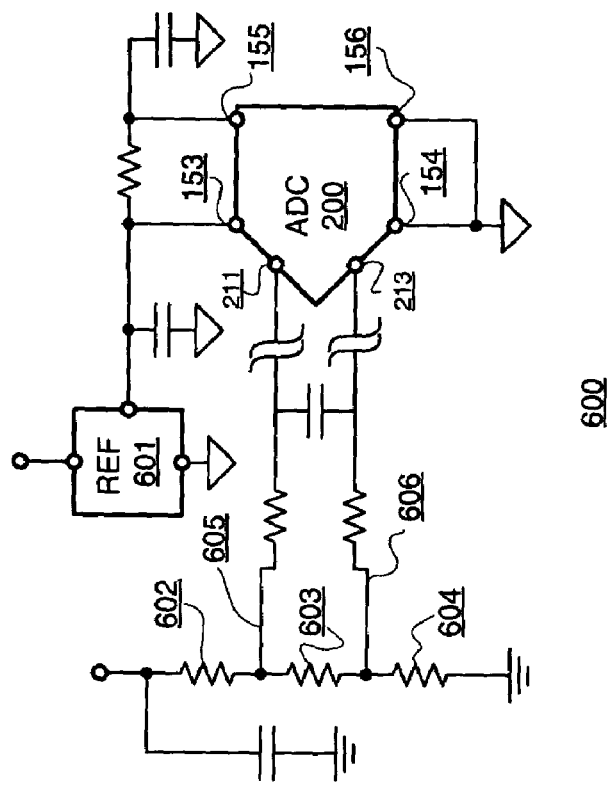
FIG. 6B is a schematic diagram depicting an exemplary embodiment of external ADC monitoring circuitry for the ADC of FIG. 3A.
Figure 6A:
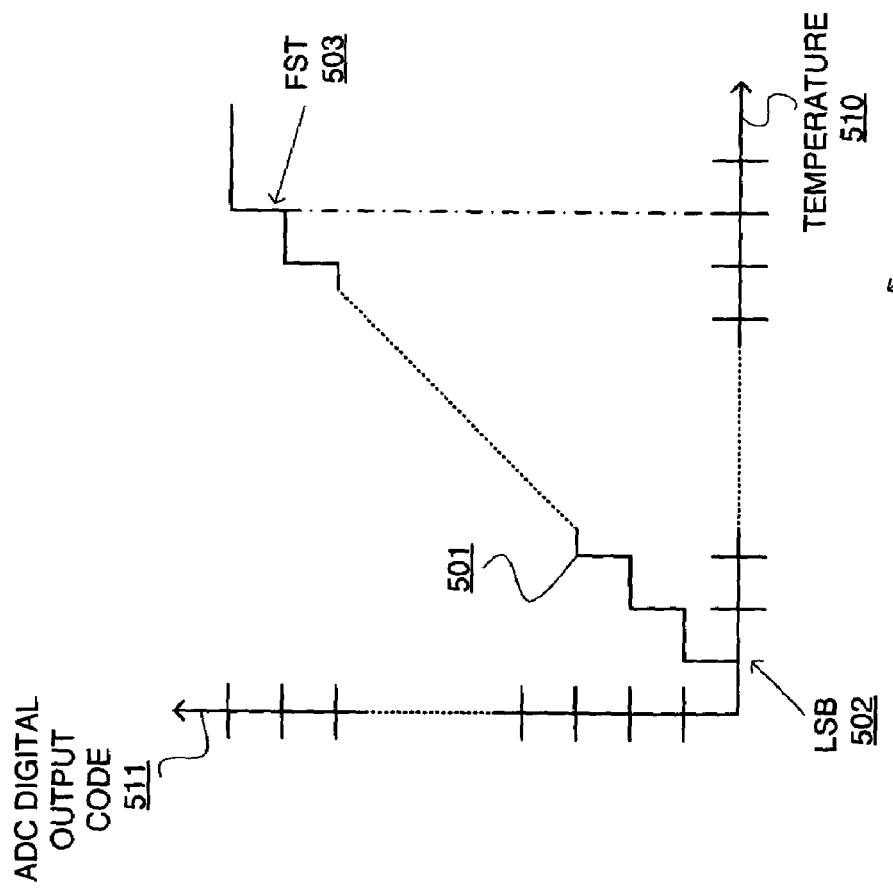
FIG. 6A is a temperature versus output code graph depicting an exemplary embodiment of an output of an analog-to-digital converter ("ADC") for the System Monitor of FIG. 2.

FIG. 6A is a temperature versus output code diagram depicting an exemplary embodiment of an output of ADC 200 for an analog input related to temperature. With continuing reference to FIG. 6A and renewed reference to FIGS. 1A through 1E and 2, the output of ADC 200 is further described.

Temperature versus ADC digital output 500 is shown as having a stepwise transfer function 501 going from a least significant bit ("LSB") generally at 502 for a temperature value at such location to a full scale transition ("FST") location generally at 503. Accordingly this is a digital output transfer function for a temperature sensor, such as a sensor 203. Additionally, System Monitor 20 may provide a digital averaging function allowing the user to average a number of samples, for example 256 individual temperature sensor samples to produce a reading. Averaging may be used to help reduce the effects of noise and to improve repeatability of measurement. A result of a temperature reading may be placed in a register of output data registers 209. Notably, a full ADC transfer function may be greater than a temperature operating range of an FPGA.

In addition to monitoring temperature, voltage, such as supply voltage, conditions may be monitored for any potential problems. Likewise with respect to temperature monitoring, monitoring internal power supplies involves selecting a channel via control registers 206. A transfer function for an on-chip voltage being monitored would be similar to that of FIG. 6A, namely, having an LSB location and a full scale transition location for a voltage relative to an ADC digital output code. Moreover, voltage monitoring may have a stepwise transfer function for voltage versus ADC digital output code. Signal conditioning in ADC modes may automatically be set up responsive to channel selection for a particular supply voltage being monitored. Notably, there may be more than one supply voltage on an FPGA. This signal conditioning for ADC 200 mode setup may be done responsive to control signal 212.

In the event an FPGA supply voltage exceeds an input range of a differential input of ADC 200, an attenuator may be used. To enhance accuracy with use of an attenuator without calibration, an external reference voltage circuit for signal conditioning may be used to accurately calibrate an ADC 200 for power supply monitoring. Examples of such externally supplied reference voltages include voltages 153, 154, 155 and 156.

To capture short duration peaks and sags of voltages such as supply voltages, peak detector circuits of sensors 203 may be used. Peak values may be accessed by selecting an associated channel with a peak detector, such as a detector peak detector 203. Again a transfer function similar to that shown in FIG. 6A may be used for detecting peaks and sags.

ADC 200 may be operated in either a Continuous Sampling Mode or an Event Driven Sampling Mode. In a Continuous Sampling Mode, ADC 200 automatically starts a new conversion at the end of the current conversion cycle. In a Continuous Sampling Mode, ADC 200 will continue to carry out a conversion on a currently selected analog input as long as ADC clock signal 219 is present. In an event sampling mode, a user initiates a next conversion after the end of the current conversion cycle using CONVST signal 116. These operating modes are selected by writing to ADC configuration register 310-0 location 403, as described above.

FIG. 6B is a schematic diagram depicting an exemplary embodiment of external ADC monitoring circuitry 600. An external voltage is used as reference voltage 601 to establish absolute measurement accuracy over extremes of temperature within limits, such as approximately 2.5V±0.2% and ≦50 ppm/° C. With continuing reference to FIG. 6B and renewed reference to FIG. 6A, ADC monitoring circuitry 600 is further described.

Pin 153 is used to receive an external positive reference voltage $V_{REFP}$ to ADC 200. Pin 154 is used to receive an external negative reference voltage $V_{REFN}$ to ADC 200. Pins 155 and 156 are used as analog voltage supply for ADC 200.

External resistors 602, 603, and 604 are coupled in series to implement an external voltage monitoring circuit. A tap or an output 605 from a common node of resistors 601 and 602 and a tap or an output 606 from a common node of resistors 602 and 603 in combination provide a differential output. This differential output may be provided, such as via a multiplexer 216, to inputs 211 and 213 of ADC 200.

ADC 200 converts input from pins 211 and 213 into ADC digital output code 511. For example, the size of one LSB generally at 502 of an ADC output digital code 511 may be approximately 0.977 mV. The analog-to-digital transfer function of ADC 200 is inversely proportional to the external reference voltage $V_{IN}/V_{REFN}$, which for example may be approximately 2.5V. A change in the reference voltage results in a change in the size of LSB 502. The relationship is inversely proportional. So, for example, a 1% increase in reference voltage may result in maximum of 1% ADC error or less in proportion of $V_{IN}/V_{REFN}$.

System Monitor Timing Modes.

Figure 7A:
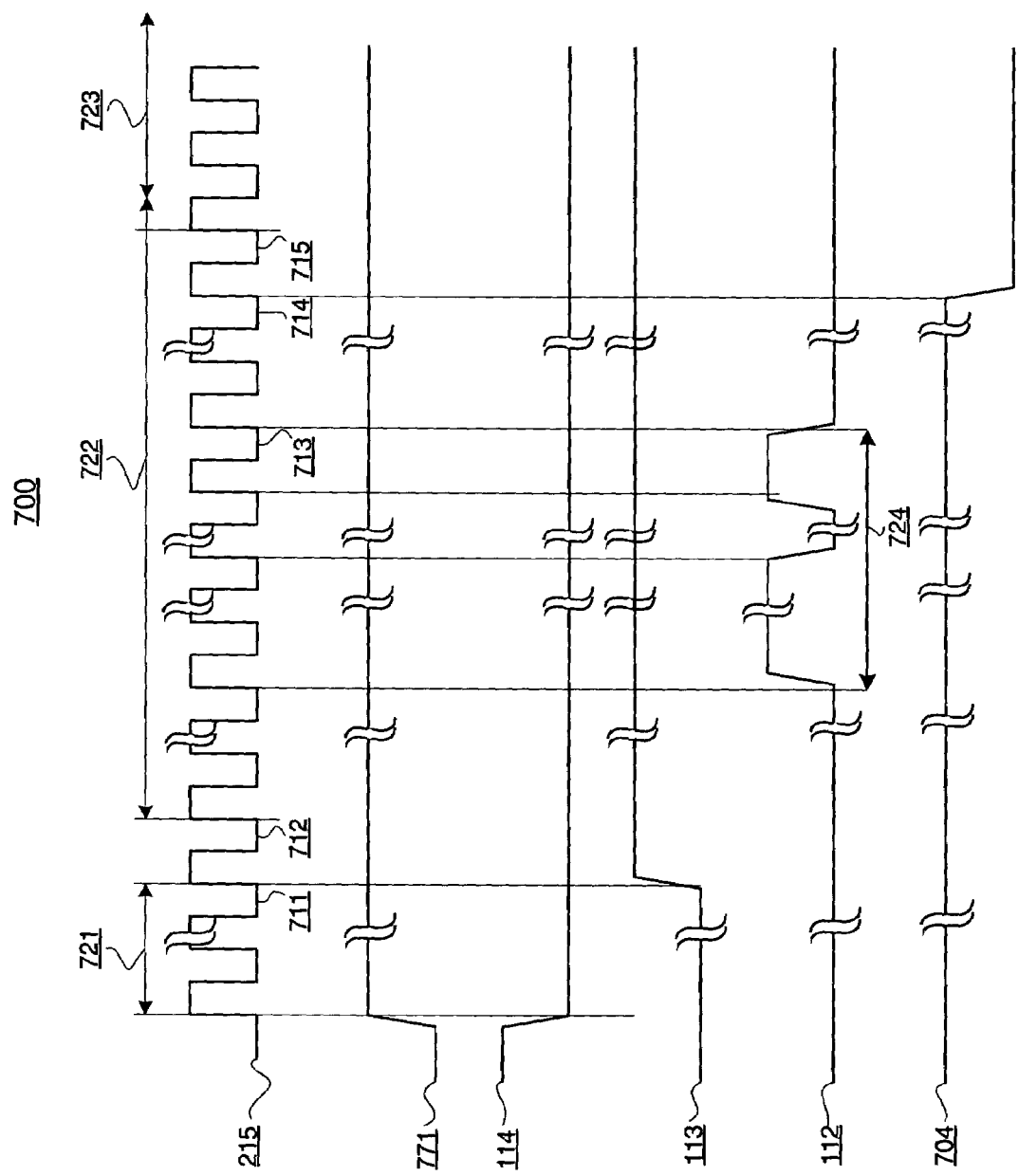
FIG. 7A is a signal diagram depicting an exemplary embodiment of System Monitor start up timing.

FIG. 7A is a signal diagram depicting an exemplary embodiment of System Monitor start up timing 700. FIG. 7A illustrates power up timing for an FPGA with System Monitor 20 and start up operation of System Monitor 20 before FPGA configuration. With continued reference to FIG. 7A and renewed reference to FIGS. 2 and 3, an embodiment of a start up operation of System Monitor 20 is further described.

An FPGA chip reset signal ("CFG_RST") 114 or power on reset ("POR") signal 771 resets System Monitor logic after FPGA power up. At this point in time System Monitor control logic is not operational. System Monitor 20 remains in this mode until the end of a "House Keeping" mode 721 which may be up to 20 ms or more depending on the size of the FPGA chip. There is no monitoring of any on-chip or off-chip sensors during House Keeping Mode 721. For that mode oscillator clock ("CFG_MCLK") signal 215 is used by analog circuitry of System Monitor 20 to bring up reference generation circuits and at least one sensor. These circuits are settled and become fully functioning within specification by the end of House Keeping Mode 721.

Generally at time 711 of oscillator clock signal 215, FPGA configuration logic issues a logic high initialization complete signal 113 to inform System Monitor 20 that House Keeping Mode 721 is over. On the next rising edge, generally at time 712 of oscillator clock signal 215, FPGA configuration logic enters a "Fixed Function Mode" 722 for System Monitor 20. This is a fixed function mode and thus System Monitor 20 operation is completely independent of any activity in configuration memory cells or programmable interconnect of the host FPGA. Accordingly, System Monitor 20 operation is not affected by changes in configuration bit settings during full or partial configuration/reconfiguration of CLBs/IOBs of a host FPGA.

During "Fixed Function Mode" 722, System Monitor 20 may measure temperature for example. If the measured and averaged temperature exceeds a hardwired limit, such as for example of 110° C., then over temperature alarm signal 139 is asserted. Over temperature alarm signal 139 remains asserted until the measured temperature drops below a hardwired limit, such as for example approximately 70° C. System Monitor 20 may average multiple temperatures, such as sixteen temperature measurements, in this mode.

System Monitor 20 leaves "Fixed Function Mode" 722 on a rising edge of oscillator clock signal 215 after global write enable signal ("GWE_B") 704 goes to a logic low state. Global write enable signal 704 is not de-asserted until after the initial configuration of a host FPGA. Generally at this time 715, System Monitor 20 starts "Normal Operation Mode" 723 using the configuration bit stream setting. A dedicated write configuration signal 112 goes logic high responsive to FPGA configuration logic writing to FPGA configuration memory. System Monitor 20 uses write configuration signal 112 only after the initial power up configuration.

FIGS. 7B and 7C are signal diagrams depicting respective exemplary embodiments of partial configuration mode timings 740 and 750. A user may implement two types of reconfiguration settings for an FPGA such as Normal Partial Reconfiguration 740 and Active Partial Reconfiguration 750.

For Active Partial Reconfiguration 750, FPGA operation is not suspended and any global signals, such as global write enable signal 704, are not de-asserted and thus the FPGA maintains Normal Operation Mode 723. For Normal Partial Reconfiguration 740, FPGA operation is suspended and global write enable signal 704 is de-asserted.

During Normal Partial Reconfiguration 740, a global write enable signal 704 is de-asserted prior to any configuration write operation, such as Fixed Function Mode 722, initiated by write configuration signal 112. A configuration write operation, which is in this example Fixed Function Mode 722, starts by write configuration signal 112. If global write enable signal 704 is logic high, i.e. is de-asserted, then generally at time 731, System Monitor 20 enters Fixed Function Mode 722 on the next rising edge of write configuration signal 112.

System Monitor 20 remains in Fixed Function Mode 722 until global write enable signal 704 is asserted again at the end of the current configuration write operation. Normal operation begins on the first oscillator clock signal 215 rising edge after global write enable signal 704 is asserted, i.e. is logic low signal state, generally at time 734. Notably, write configuration signal 112 may toggle at irregular intervals. However, after the first rising edge of write configuration signal 112, write configuration signal 112 is not used in the current mode, and thus subsequent edges of write configuration signal 112 have no effect on operation of System Monitor 20. System monitor 20 only resumes normal operation when global write enable signal 704 transitions to a logic low signal state.

Because during Active Partial Reconfiguration 750 FPGA operation is not suspended during configuration, Active Partial Reconfiguration 750 is used for configuration bit scrubbing while configuration bits are continuously refreshed.

During Active Partial Reconfiguration mode 750, any global signals like global write enable signal 704 are not de-asserted, i.e., being logic high, for the duration of the FPGA configuration. Therefore, System monitor 20 does not enter Fixed Function Mode 722 when write configuration signal 112 transitions to logic high and System Monitor 20 maintains Normal Operation mode 723 throughout Active Partial Reconfiguration 750.

Due to the absence of logic high state for global write enable signal 704, Active Partial Reconfiguration 750 may not include a frame which contains the System Monitor block. Thus, in this timing mode, System Monitor 20 may still be reconfigured via DRP 201.

FIG. 8A is a signal diagram depicting an exemplary embodiment of a Continuous Sampling Mode timing 800. With continuing reference to FIG. 8A and renewed reference to FIGS. 1A through 1E and 2, Continuous Sampling Mode timing 800 is further described.

System clock 801 is a fraction of the frequency of data clock 108. In this exemplary embodiment, system clock 801 is half the frequency of data clock 108. Data write enable signal 107 is pulsed to select a channel for data. For example, pulse 802 having an edge aligned to system clock signal 801 is asserted. Responsive to assertion of data write enable signal pulse 802, an address 804 on address signal 105 is captured along with data. For example, captured address 804 of data address signaling 105 may indicate that data 803 of data input signaling 104 is to be written to configuration register 0, which data 803 may subsequently be output via data output signaling 120 or via DRP 201, which is described in more detail in the co-pending patent application "Reconfiguration Port for Dynamic Reconfiguration", by Vasisht M. Vadi et. al., filed concurrently.

During an acquisition phase of a Continuous Sampling Mode, ADC 200 acquires voltage on a selected channel in order to perform an analog-to-digital conversion. For example, a capacitor in ADC 200 is charged to an input voltage for a selected channel. The time to charge this capacitor will depend on source impedance of the selected input channel. Acquisition time may be four cycles of ADC clock signal 219, such as acquisition time 805, namely, from end of a conversion phase until a sampling edge, such as conversion finished edge 807 to a sampling edge 806. However, if a new input channel is selected after start of an acquisition phase, then acquisition time 805 is from end of a dynamic reconfiguration port write operation to the sampling edge, namely in this embodiment the fifth rising edge of ADC clock after the end of the previous conversion. If a new channel selection is made by writing to DRP 201 during a conversion phase, such as conversion time 810, namely, after a sampling edge 806 when busy signal 135 is active logic high, such as pulse 811, a newly selected channel will not start its acquisition phase until the end of a current conversion phase when busy signal 135 transitions to a logic low level. In a sequence mode, a new channel selection is made when busy signal goes to a logic low level voltage.

If an ACQ bit in a configuration register 0 is set to logic one, then an extra six ADC clock cycles of ADC clock signal 219 are inserted before a sampling edge to offer more acquisition time for a selected channel. This may be useful if a sampled signal has a relatively large source impedance, such as greater than approximately 10 kilo-ohms.

A conversion phase starts on a sampling edge, such as sampling edge 806, at the end of an acquisition phase. In other words, after an analog measurement is obtained in an acquisition phase, it may then be converted to a digital value in a conversion phase. From sampling edge 806, busy cycle 135 goes to an active logic high state to indicate that ADC 200 is carrying out a conversion. Any channel selection or configuration writes to DRP 201 when busy signal 135 is in a logic high state will not be latched until the end of such a conversion phase, namely, when busy signal 135 goes to a logic low state generally at conversion finished edge 808.

For converting an internal supply voltage monitor channel, an additional four ADC clock cycles may be added to a conversion phase. A result of a conversion may appear on ADC data bus 131, such as data 803, at the end of a conversion finished edge, such as edge 808. A conversion result will be transferred to data registers 209 one ADC clock cycle after a minimum number of system clock cycles, such as four cycles for example. EOC logic output signal 133 is pulsed high for one pulse width, such as pulse 809, after a conversion phase.

Notably, if a channel being converted is also being filtered, filtered data will only be transferred to data registers 209 after a last sample result has been converted. Thus, if channels are being filtered to provide an analog-to-digital conversion, no EOC pulse, such as pulse 809, will be generated for all such conversions except for a last conversion result. For example, if 256 samples were taken, the $256^{th}$ sample would be the sample for which an EOC signal 133 pulse 809 would be generated. Of course the number of samples taken will depend on the filter setting. When System Monitor 20 is operated in a sequence mode, a user may identify which channel is having data thereon converted by monitoring channel address signal 132. A channel address of a channel being converted is updated responsive to busy signal 135 going to a logic low state at the end of a conversion phase.

Channel address outputs may be used with EOC signal 133 to automatically latch contents of output data registers 209 via output data bus signaling 131 to a first-in first-out buffer or block access random memory. For example, channel output may be associated with a data address where EOC signal 133 is used as a write enable for random access memory. If no filtering is being used, EOC signal 133 may be used to latch contents of ADC data bus signals 131. EOS signal 134 is pushed when an output data register for a last channel in a program sequence is updated.

Figure 8B:
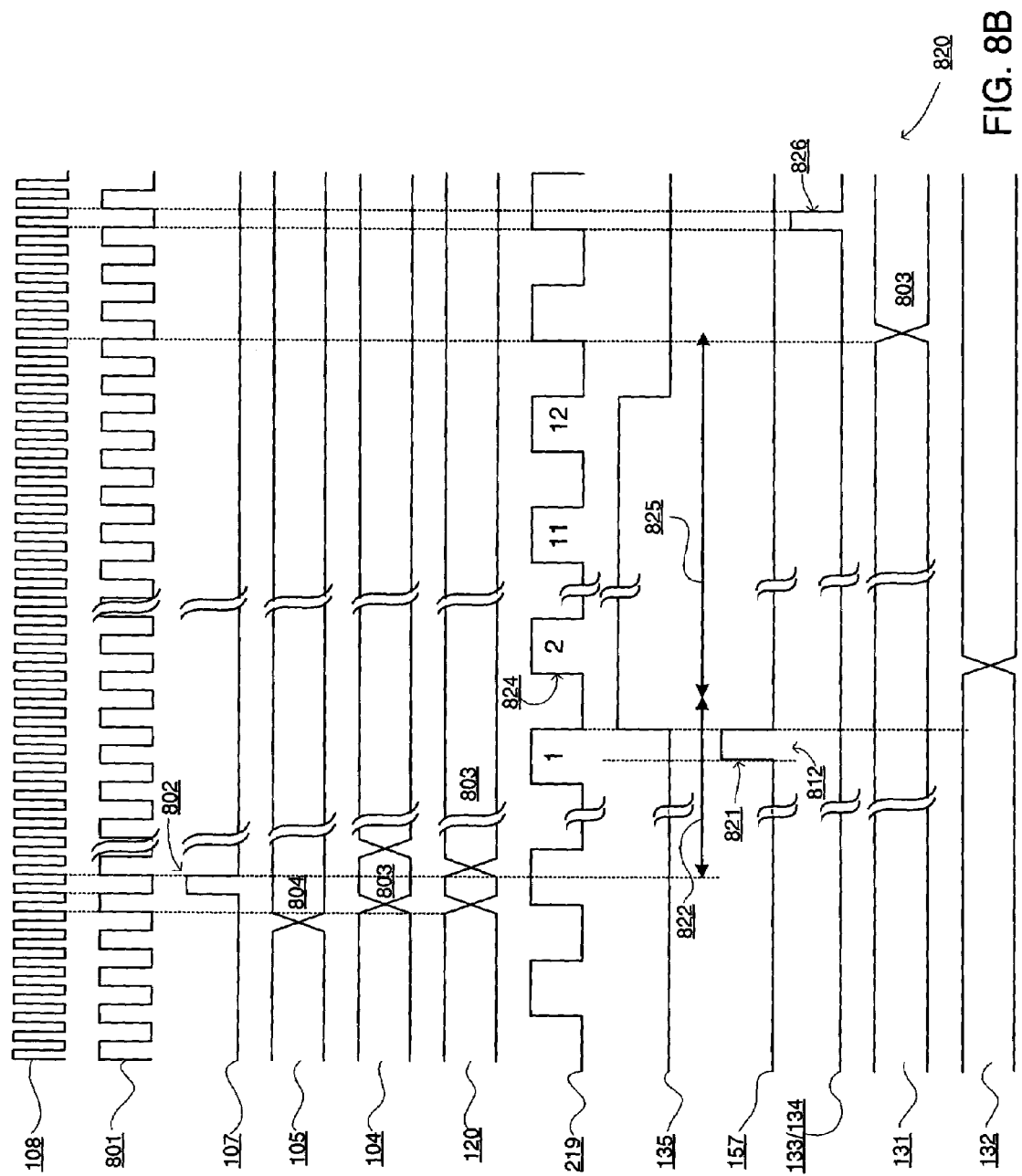
FIG. 8B is a signal diagram depicting an exemplary embodiment of an Event Driven Sampling Mode timing.
Figure 8C:
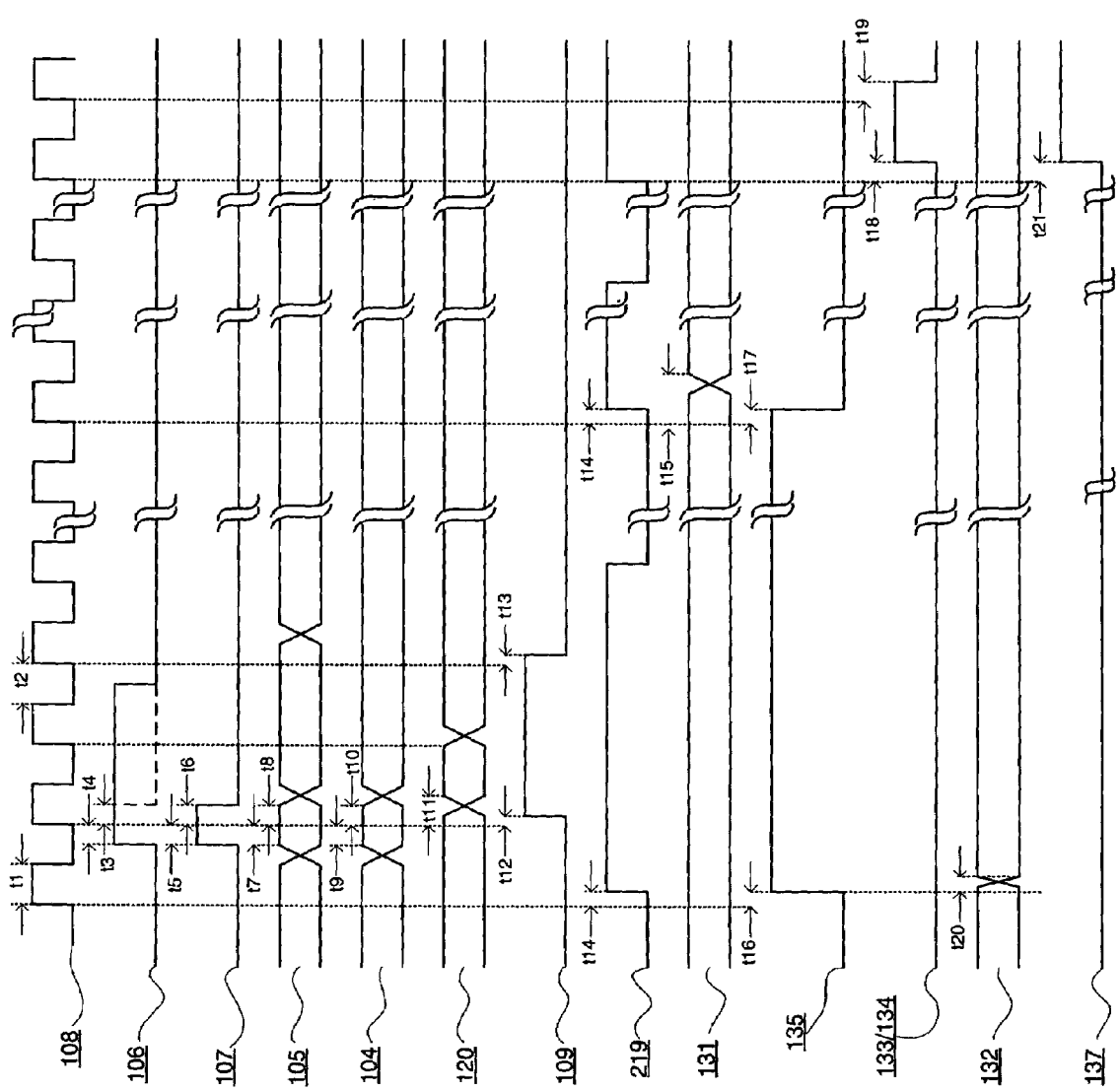
FIG. 8C is a lower-level signal diagram depicting an exemplary embodiment of a System Monitor detailed timing.

FIG. 8B is a signal diagram depicting an exemplary embodiment of an Event Driven Sampling Mode timing 820, and FIG. 8C is a lower-level signal diagram depicting an exemplary embodiment of a System Monitor detailed timing 840. Notably, actual values for times t1 through t21 of FIG. 8C will vary with implementation, and thus are not described herein in detail.

In Event Driven Sampling Mode, such as even driven sampling mode timing 820, sampling and subsequent conversion, is initiated by an internally or externally triggered signal called Convert Start ("CONVST") signal 157. A logic low to logic high transition (e.g., a rising edge) of CONVST signal 157 defines a sampling edge for a selected analog input channel, such as a sampling edge generally at 821.

CONVST signal 157 may be an asynchronous externally provided signal. In which embodiment, System Monitor 20 automatically resynchronizes a conversion to ADC clock signal 219. CONVST signal 157 has a minimum low or high time of at least a number of seconds, such approximately 50 nanoseconds. As in the above-described Continuous Sampling Mode, ADC clock cycles of ADC clock signal 219 are used for an acquisition phase 822, namely, time between a channel change and a sampling edge, such as a rising edge of CONVST signal 157. A sufficient number of ADC clock cycles facilitates ADC 200 to acquire a new signal before it is sampled by CONVST signal 157 and a conversion phase begins.

Notably, the ACQ bit has no meaning in an event sampling mode, since a sampling instance is controlled by CONVST signal 157, and therefore CONVST signal 157 controls acquisition time for a selected channel. If a long acquisition time, such as time 822 is used, then a user may leave a required acquisition time before CONVST signal 157 is pulsed, such as a pulse 812.

Notably, as mentioned above, CONVST signal 157 may be provided from clock inputs such as IOB clocks of an FPGA, namely, global IOB's. Alternatively, CONVST signal 157 may be exercised by an FPGA from a global clock network via a local interconnect, namely, CONVST clock signal 117.

After an analog input has been sampled responsive to a rising edge of CONVST signal 157, a conversion is initiated on a next rising edge of ADC clock signal 219, such as edge 824. In response, busy signal 135 goes to a logic high state. Conversion occurs over a number of clock cycles of ADC clock signal 219. Conversion time 825 is this period including at least a portion of the pulse width of CONVST signal pulse 812.

For example for a 10-bit implementation of the above-described embodiment, when FPGA internal power supply sensors, such as may have outputs coupled to input channels of System Monitor 20, are selected, an ADC conversion cycle may have 6+n ADC clock cycles. As with a Continuous Sampling Mode, a result of the conversion appears on ADC data bus signaling 131 responsive to busy signal 135 transitioning to a logic low state. Such a conversion result will be transferred to data registers 209 one ADC clock cycle after a conversion result is obtained with a minimum number of system clock cycles of system clock signal 801, such as four cycles for example.

EOC signal 133 logic output pulses are transitioned to a logic high state, such as pulse 826, for one cycle of clock signal 108 for DRP 201 after a conversion result is transferred to output data registers 209. If a channel being converted is also being filtered, then filtered data is transferred to output data registers 209 when a last sample result has been converted, as previously described. Notably, a rising edge occurs on CONVST signal 157 to initiate a conversion and advance a sequencer to a next channel. If an automatic sequencing is used, System Monitor 20 may be operated in a Continuous Sampling Mode. However, a user may use an event timing mode in a sequence mode. EOC signal 133, EOS signal 134, and channel signal 132 operate as previously described with respect to a Continuous Sampling Mode.

System monitor 20 provides a self-contained monitoring function for on-chip supply voltages and temperature. Notably, once System Monitor 20 is configured with default settings, only an external DRP clock signal 108 resource from a host FPGA is used. Notably, if DRP clock signal 108 for DRP 201 is not present, System Monitor 20 automatically switches over to an on-chip oscillator clock signal 215.

Measurement data for on-chip parameters may be stored in user-readable registers, namely, registers of data registers 209 of System Monitor 20. Data registers 209 are output data registers which may be accessed via DRP 201. In addition to collecting measurement data, System Monitor 20 may activate alarms, provided via alarm output signal 137, when a measured data result exceeds a pre-defined threshold value. Threshold values for measurement values, namely, threshold alarm values, are stored in alarm registers 314.

System monitor 20 may be configured to detect over temperature conditions and both over and under voltage conditions for supply voltages. Alarm levels may be user programmable at time of design of a circuit to be instantiated in an FPGA. Furthermore, alarm thresholds may be dynamically changed via DRP 201.

When an alarm condition is detected, a logic output alarm signal 137 automatically goes to an active logic high state. Automatic alarm signaling may be disabled using System Monitor configuration registers bit location 413 of FIG. 5. Notably, automatic monitoring is provided in part by a channel sequencer 222, which forms part of control logic 221 of FIG. 3A.

Channel sequencer 222 allows a user to set up a sequence of channels and their associated operating conditions for automatic monitoring. A sequencer function is made up of a number of channels, including calibration channels. For example, there may be approximately 20 channels. These channels are associated with registers as previously described.

Each sequence register may have the same bit definitions as configuration register 310-0. Accordingly, as well as selecting a channel, sequence registers may be used to select unipolar or differential input operation for that selected channel. Notably, internal channels may be unipolar only. Sequencer 222 may be used to select whether a channel result is averaged, and may be used to provide a longer acquisition time for such a channel. Initially, sequencer 222 may be used to select between continuous and event driven modes. As the name implies, sequence registers are read starting at a lowest register address and finishing at the highest register sequence address, or until a sequence register containing all logic ones is encountered.

Sequencer 222 will operate in one of two modes responsive to how sequence bits 414 of configuration registers 310-1 are set. These modes are single pass mode or continuous mode.

In a single pass mode, sequencer 222 completes a measurement on all channels in a sequence at least once. This may involve a multiplicity of iterations, such as two hundred fifty six iterations of a sequence, for those channels having averaging activated. Accordingly, the number of iterations will depend upon the number of samples taken. When data registers of data registers 209 for all channels in a sequence have been updated, an EOS signal 134 pulse, such as pulse 826, is issued on a last data register update.

At this point, data registers contain results of all channels in a sequence. Channels with no averaging will have a corresponding data registers overwritten on each pass through a sequence rather than just a final pass of a sequence. Accordingly, data registers are maintained to contain the most recent measurement data associated therewith. Busy signal 135 and EOC signal 133 continue to be active during analog-to-digital conversions, when System Monitor 20 is operating in a sequence mode.

At the end of a sequence, ADC 200 reverts back to configuration defined for the configuration registers for the next and subsequent conversions. To reset a sequence, a user can reset System Monitor 20 with reset signal 199. This reset may be done dynamically via DRP 201.

Continuous mode operation is the same as single pass mode operation, except at the end of a singled pass through a sequence, an EOS signal 134 pulse is issued, such as pulse 809, and the sequence automatically starts over again. Conversion or average results from each selected channel in a sequence are loaded into a corresponding data register of data registers 209 when a conversion is finished. These registers may be read during operation via DRP 201. For example, results from channel 0 may be written to data register 0 and results from channel 5 may be written to data register 5, where 0 and 5 refer to address locations of such registers. When EOS signal 134 is pulsed at the end of a sequence, a new sequence automatically starts with data continuously being written to a data register of data registers 209 by System Monitor 20. To avoid reading a register that is being written to by System Monitor 20, data register reads may happen only when busy signal 135 is at a logic high voltage level. Accordingly, a high speed read of all data registers may be started when busy signal 135 goes to a logic high voltage level after a pulse of EOS signal 134. Notably, a result of the channel is written to data registers even when System Monitor 20 is not operating in a sequence mode.

As mentioned above, System Monitor 20 offers the capability of averaging results, such as 16, 64, or 256 results, among others, of separate measurements for a selected channel, for example to reduce effects of noise in such results. When averaging is active, noise content of measured quantities like power supply voltage and temperature may be significantly reduced. Furthermore, by adding hysteresis to such measurements, risk of producing a false alarm condition that might otherwise exist if such an alarm condition was based on just one measurement may be reduced. Furthermore, calibration channels may be averaged to obtain a more accurate offset correction.

FIG. 9A is a signal diagram depicting another exemplary embodiment of a Continuous Sampling Mode timing 900. With continuing reference to FIG. 9A and renewed reference to FIGS. 1A through 1E and 2, Continuous Sampling Mode timing 900 is further described.

In Continuous Sampling Mode 900, ADC 200 continues to carry out a conversion on the currently selected analog inputs as long as ADC clock signal 219 is present. ADC clock signal 219 is generated by the clock divider registers 423. The analog-to-digital conversion process is divided into two parts, namely, acquisition phase 805 and conversion phase 810.

During acquisition phase 805, ADC 200 acquires the voltage on a selected channel to perform the conversion. The acquisition phase basically involves charging a capacitor in ADC 200 to the input voltage on the selected channel. The time required to charge this capacitor depends on the source impedance of the selected input channel. Acquisition time 805 involves a number of ADC clock signal 219 cycles, such as four for example, from the end of the previous conversion phase until the sampling edge of the next phase. When not operating in sequence mode, a user needs to write to configuration register 310-0 to select the next channel for conversion. Write operations to configuration registers happen while busy signal 135 is high.

Configuration register settings are latched when busy signal 135 transitions to a logic low signal state. In sequence mode, a new channel selection is made automatically when busy signal 135 transitions to a logic low signal state. If the ACQ bit in configuration register 0 is set to logic one, then a number of extra ADC clock signal 219 cycles, such as six for example, are inserted before the sampling edge to allow for more acquisition time on a selected channel. This is useful if an external analog input channel has a large source impedance, e.g, greater than 10 k-ohms, These extra ADC clock signal 219 cycles are 10 through 23 (cycles 14 and 200 are not shown on FIG. 9A). For an embodiment, an edge transition time 911 for busy signal 135 may be equal to approximately 10 ns, and time interval 912 from the instance 907 of edge transition 911 to pulse 811 of EOC/EOS signal 133/134 may be equal to approximately 10 clock cycles of system clock signal 801.

Conversion phase 810 starts on sampling edge 806 of busy signal 135 at the end of acquisition phase 805. Generally at this point in time, busy signal 135 transitions to a logic high state to indicate ADC 200 is carrying out a conversion. Any channel selection or configuration writes to the DRP 201 when busy signal 135 is logic high is latched until the end of conversion phase 810 (i.e., when busy signal 135 transitions to a logic low signal state). In an embodiment, conversion phase 810 may be 13 ADC clock signal 219 cycles in duration. When converting an internal supply monitor channel, an additional number, such as four for example, of ADC clock signal 219 cycles may be added to the conversion cycle. The result of a conversion on an external channel also appears on the ADC data bus 131 one half of an ADC clock signal 219 cycle before busy signal 135 transitions to a logic low signal state. Conversion results for on-chip sensors may be accessed via data registers 209 via DRP 201.

ADC 200 conversions are transferred to the data registers a number, such as 10 for example, of cycles of system clock 801 after the end of a conversion responsive to busy signal 135 transitioning to a logic low signal state. The logic output of EOC signal 133 will pulse high for one DRP clock cycle at this time. If the channel being converted is also being filtered, then the filtered data will only be transferred to the output data registers when the last sample result is converted. Thus, if a channel is being filtered, no pulse of EOC signal 133 will be generated for all but the last conversion result i.e., 16th, 64th, 256th sample depending on the filter setting. When System Monitor 20 is being operated in a sequence mode, a user may identify which channel is being converted by monitoring channel signal 132 addresses. A channel address of a channel being converted may be updated on these logic outputs half an ADC clock signal 219 cycle before busy signal 135 transitions to a logic low signal state at the end of a conversion phase 810.

Channel address logic outputs 132 may be used with EOC signal 133 to automatically latch the contents of the output data registers into a FIFO or BRAM, such as by connecting channel address logic outputs 132 to data addressing 105 and using EOC signal 133 as a write enable for the BRAM. If no filtering is being used then EOC signal 133 may also be used to latch the contents of the ADC data bus 131. EOS signal 134 has the same timing as EOC signal 133. EOS signal 134 is pulsed when the output data register for the last channel in a programmed sequence is updated.

FIG. 9B is a signal diagram depicting another exemplary embodiment of an Event Driven Sampling Mode timing 920, and FIG. 9C is a lower-level signal diagram depicting another exemplary embodiment of a System Monitor detailed timing 940. Notably, actual values for times t1 through t14 of FIG. 9C will vary with implementation, and thus are not described herein in detail.

In Event Driven Sampling Mode 920, as in Event Driven Sampling Mode 820 of FIG. 8B, sampling and subsequent conversion are initiated by an internally or externally triggered signal. CONVST signal 157 may be used for this triggering.

In Event Driven Sampling Mode 920, a sampling instant and subsequent conversion process is initiated by an internal or external trigger, such as CONVST signal 157. A logic low to logic high transition (rising edge) on CONVST signal 157, such as rising edge 921 of pulse 912, defines an sampling instant for a selected analog input channel. Busy signal 135 transitions to a logic high state just before the sampling instant. Signal CONVST 157 may be an asynchronous external signal, as System Monitor 20 automatically re-synchronizes a conversion to ADC clock signal 219. A restriction on CONVST signal 157 is that it has a minimum low or high time, for example a minimum low or high time of at least 50 ns. As for Continuous Sampling Mode 900, enough time is provided for acquisition phase 922 ranging between a channel change and a sampling edge, i.e. the rising edge 921 of pulse 912 for CONVST signal 157. This allows ADC 200 to acquire a new signal before it is sampled by CONVST signal 157 and before a conversion phase 925 starts following the acquisition phase 922.

Notably, ACQ bit 402 has no meaning in event sampling mode 920 since the sampling instant is controlled by CONVST signal 157 and therefore so is the acquisition time on the selected channel. If a long acquisition time is to be used, then acquisition time before CONVST signal 157 is pulsed is provided. After an analog input has been sampled by a rising edge on CONVST signal 157, a conversion is initiated on the next rising edge of ADC clock signal 219. In Event Driven Sampling Mode 920, ADC 200 uses a number of ADC clock cycles of ADC clock signal 219 (for example 12 cycles marked 1 through 12 on FIG. 9B though pulses 3 through 10 are not shown), to perform a conversion, such as a 10-bit conversion for example. When FPGA on-chip power supply sensors are selected, an ADC 200 conversion cycle may be extended, for example by 6 additional (16 total) ADC clock signal 219 cycles.

As with Continuous Sampling Mode 900, the result of the conversion on an external channel also appears on the ADC data bus 131 one half ADC clock signal 219 cycles before busy signal 135 transitions to a logic low signal state. The conversion result may also be transferred to the output data registers a number of system clock cycles 912 later, such as 10 clock cycles later for example. EOC signal 135 logic output pulses to a logic high state, such as pulse 926, for one DRP clock signal 108 cycle at this time. If the channel being converted is also being filtered, then the filtered data will only be transferred to the output data registers when the last sample result has been converted. Thus, if a channel is being filtered, no EOC pulse 135 is generated for all but the last conversion result, i.e. 16th, 64th, 256th sample depending on the filter setting. If the automatic sequencer is being used, System Monitor 20 may operate in Continuous Sampling Mode 900. However, if a user wishes to use Event Timing Mode 920 in a sequence mode, this timing is allowed. EOC 135, EOS 136, and channel outputs 134 operate the same way described above for Continuous Sampling Mode 900 of FIG. 9A.

System Monitor Configurations

Figure 10:
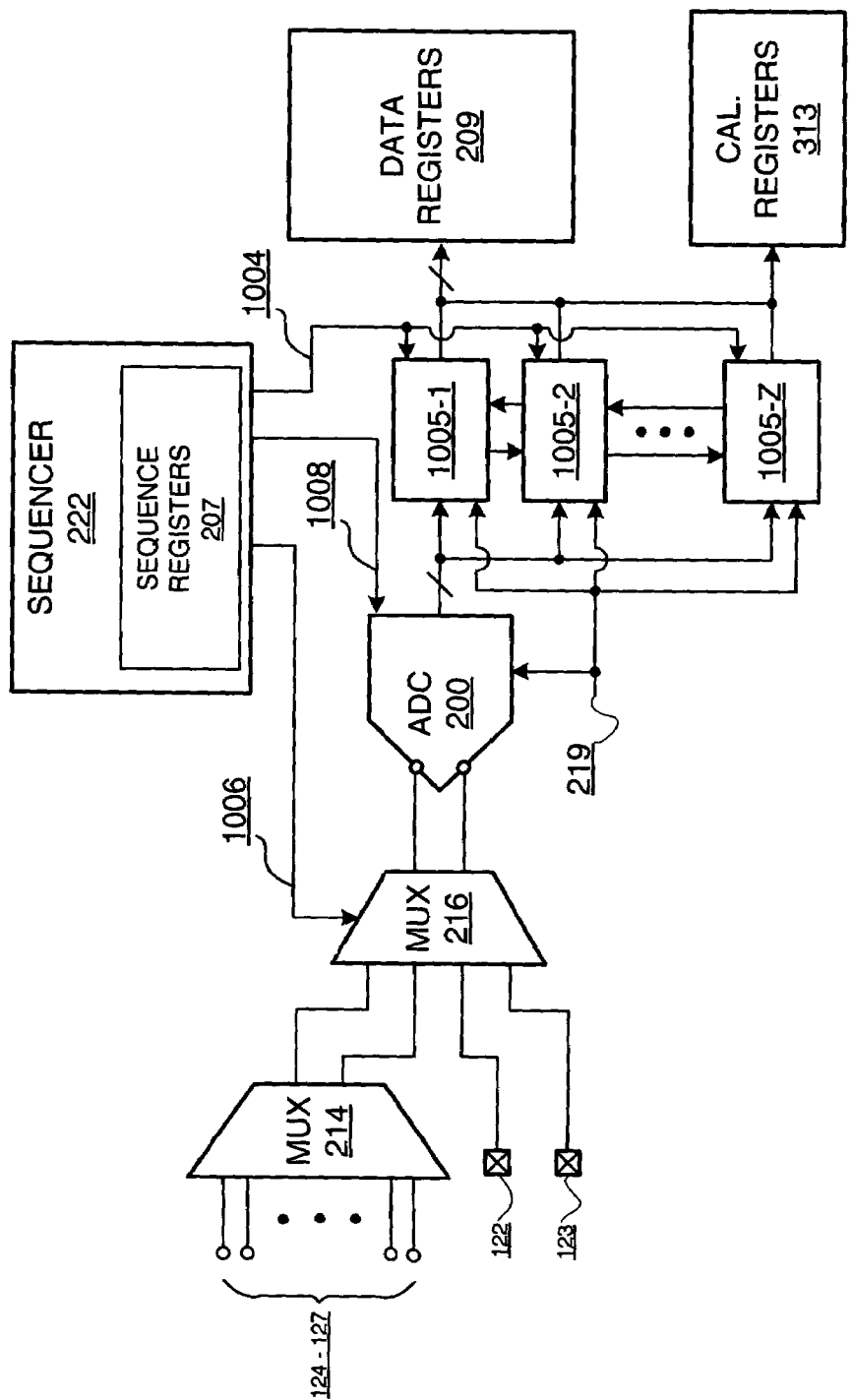
FIG. 10 is a block/schematic diagram depicting an exemplary embodiment of a portion of the System Monitor of FIG. 2 with averaging.

FIG. 10 is a block/schematic diagram depicting an exemplary embodiment of a portion of System Monitor 20 with averaging. With continuous reference to FIG. 10 and renewed reference to FIGS. 1A through 1E and FIGS. 2, 3 and 4, System Monitor 20 averaging operation is further described.

On-chip measurement may be averaged using averagers 1005-1 through 1005-Z, for Z a positive integer. For example, there may be approximately thirteen averagers 1005. Averagers 1005 may be a part of ADC 200 or a part of register memory/interface 210.

ADC clock signal 219 is applied to each averager 1005 and to ADC 200. Measurement samples from dedicated analog inputs 122, 123 or user selectable external analog inputs 124 through 127 may be provided to ADC 200 via one or more of multiplexers 214 and 216. Analog-to-digital converted samples are output from ADC 200 and provided to averagers 1005. Output signal 1006 from sequence registers 207 of sequencer 222 is used as a control signal input to multiplexer 216 to select a channel sample for input to ADC 200.

Additionally, ADC 200 includes voltage references, such as a short circuit channel input 156 and a positive reference voltage channel input 153, shown in FIG. 3A, which may be averaged. Averaging for a selected channel is activated by writing data settings to bit locations 405 of configuration register 310-0.

When operating in a sequence mode, successive samples are taken from different channels in the sequence even if an averaging function has been activated on some other channels. An averager of a channel may be updated once per each single pass through sequence registers 207. Accordingly, average values for a given channel may be computed over a longer time frame than taking successive samples on a selected channel for averaging. A result is loaded from an averager 1005 into output data registers 209. Additionally, offsets may be calibrated using averaging, and thus if a selected channel is used for calibration, output from an averager 1005 is provided to a respective calibration register 313.

Once a predetermined number of samples have been collected, an averager 1005 is reset to zero. Notably, sequencer 222 may be activated or deactivated by writing to sequence bit locations 414 of configuration register 310-1. Responsive to sequencer 222 being activated or deactivated, averaging accumulators are reset to zero via sequencer reset signal 1004. Channel selection is done by providing a control signal 1006 from sequence registers 207 to a select input of multiplexer 216. An ADC configuration signal 1008 may be provided from sequence registers 207 to ADC 200 to configure ADC 200. Additional input to ADC 200 may come from control registers 206 as depicted by FIG. 4.

A user may use an averaging function when not operating in a sequence mode. In such a condition, an average is computed using successive samples from a selected channel. An EOC signal 133 pulse is issued after an average result is loaded into output data registers 209.

System monitor 20 may be configured to automatically generate alarm signals when measured quantities exceed predetermined maximum or minimum levels. Apart from the over temperature register, such limits are held in alarm registers 314 in System Monitor memory 210. Over temperature register contents are defined by configuration bit settings which are not accessible via DRP 201.

Alarm conditions may be generated for on-chip parameters like temperature, and power supply voltage. An alarm may be indicated in one of a plurality, such as eight, alarm signals, such as seven alarm signals 137 and over-temperature alarm signal 138. An alarm condition is generated based on contents of data registers 209. If data averaging is activated, an average value will be used in order to generate an alarm condition. Notably, temperature measurement may be used to initiate an over temperature alarm, and averaging may be used to provide such an over-temperature alarm to reduce or avoid impact of erroneous temperature measurements.

Figure 11:
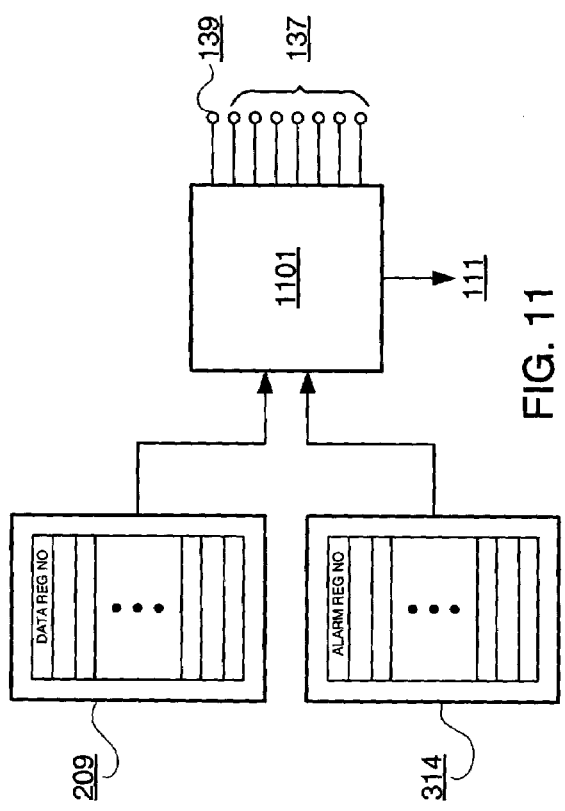
FIG. 11 is a block diagram depicting an exemplary embodiment of a portion of the System Monitor of FIG. 2 having a digital comparator.

FIG. 11 is a block diagram depicting an exemplary embodiment of a portion of System Monitor 20 having a digital comparator 1101. Outputs from data registers 209 and alarm registers 314 are provided as inputs to comparator 1101. Notably, in this embodiment for each data register there is a corresponding alarm register. Comparator 1101 may determine whether a data register value is larger or smaller than an alarm register value. Output of comparator 1101 are over temperature alarm signal 139, over temperature signal 111, which is a direct connection to configuration logic of an FPGA, and alarm signals 137. Alarm signals, as well as over temperature alarm signal 139, are connect to a host FPGA via local interconnects.

Notably, individual alarm logic outputs may be disabled by setting alarm bits, such as over temperature register bit 411 and alarm register bits 412, to a logic zero in configuration register 310-1. Moreover, an automatic alarm function, except for over temperature alarm signals 139 and over temperature signal 111, may be disabled by setting alarm bit 412 in configuration register 310-1 to logic zero.

Output logic alarms 137 are not activated responsive to a measured parameter, such as contents of output data registers 209, being-within tolerance as specified in alarm registers 314. Output data registers 209 may be configured to allow maximum or minimum measurement for temperature and power supply voltages to be captured as part of monitored channels. Each temperature and supply voltage channel has an associated maximum and minimum register. For example, temperature, VCC internal, and VCC auxiliary have associated maximum and minimum register starting addresses.

A currently measured value, such as temperature or power supply voltage, may be compared with contents of its maximum and minimum registers. If a currently held value exceeds a value in a maximum register, the maximum register is updated along with a current value register to reflect the current value. Similarly, for a minimum register, if a current value falls below minimum register contents, then the minimum register is updated to reflect the current value. A current value may be obtained from ADC 200, as an average number of samples. Again, a user may set the number of samples for averaging. Reset input signal 199 may be used to reset contents of maximum and minimum registers for temperature and supply voltages. Responsive to a reset, maximum registers may be set to logic zero and minimum registers may be set to a full scale value, as described above with respect to a transfer function.

Accuracy of ADC 200 transfer function is dependant on measurement accuracy. For measuring parameters, direct current accuracy of ADC 200 depends upon offset, gain and linearity errors, among other specifications. Accordingly, a user may carry out an offset calibration of ADC 200 to enhance accuracy of ADC 200.

Offset calibration may be done by digitally adding or subtracting an offset correction from an ADC conversion result. An offset correction factor may be obtained when a conversion is carried out in a bipolar mode with differential inputs of an analog channel to ADC 200 shorted. For a channel having analog inputs shorted selected for analog-to-digital conversion, a user may opt to have averaging of this data by setting bits 405 in configuration register 310-0. A number of different measurements or samples may be used for this averaging, as previously described, to obtain an average ADC offset. An offset correction factor may be stored in a non-user accessible register. Notably, there is no output data register 209 for a short-circuited channel, and use of an offset calibration coefficient is activated by using calibration bits 422 in configuration register 310-2. A short-circuited input channel may further be inserted into a sequence register just like any other channel. By inserting a short-circuited input channel into a sequence register 207, continuous background ADC offset calibration may be done during operation, namely, a continuous offset calibration.

System monitor 20 provides calibration for removing offset in on-chip power supply voltage sensors, such as sensors for VCC internal, and VCC auxiliary. An offset correction factor is obtained when a conversion is carried out with a channel selection set to an auxiliary supply voltage, VCC auxiliary, connected to a positive reference voltage, $V_{REFP}$. When a channel is selected for conversion, a user has an option of averaging data by setting averaging bits 405 in configuration register 310-0. The number of samples collected to calculate an average offset for monitoring supply voltages may be varied, as previously described herein. An offset is calculated by comparing an average measurement result on a selected channel with an ideal result for a supply voltage, such as approximately 2.5 volts for an auxiliary supply voltage, VCC auxiliary. Accordingly, this depends on a reference voltage supply having a narrow tolerance, such as within approximately plus or minus 0.2%. Such an offset correction factor may be stored in a non-user accessible register.

Notably, there is no output data register 209 for a positive reference voltage channel. Use of an offset calibration coefficient is activated by using calibration bits 422 in configuration register 310-2. A positive reference voltage input channel may further be inserted into a sequencer 222 just like any other channel. Such insertion would be for continuous background offset calibration over temperature and time, as an external voltage reference will be stable with changes in integrated circuit die temperature.

An on-chip temperature sensor provides a voltage output proportional to temperature. For example, a targeted uncalibrated temperature error of such a sensor may be approximately plus or minus 4 degrees Celsius. Signal conditioning circuitry may be used to level shift and amplify a temperature sensor voltage to match it to an analog input range of ADC 200. However, if a more accurate measurement of temperature is to be used, a one-point calibration at a known temperature may be done.

Figure 12:
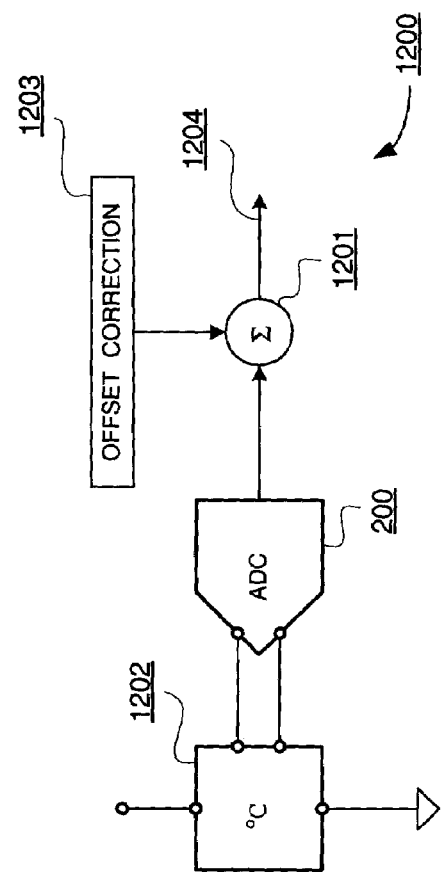
FIG. 12 is a block/schematic diagram depicting a single point temperature calibration circuit for the System Monitor of FIG. 2.

FIG. 12 is a block/schematic diagram depicting a single point temperature calibration circuit 1200. Temperature sensor 1202 has positive and negative voltage outputs, a differential output, coupled to a differential input of ADC 200. Output of ADC 200 is a digital output, which may be provided to a summing junction 1201 for summing with an offset correction 1203. Offset correction 1203 may be stored in a calibration register 313 as described above.

Output 1204 from summing junction 1201 is an ADC code adjusted for correction offset. An offset correction 1203 is digitally added or subtracted from an ADC result. This offset correction may be in addition to an ADC offset correction previously mentioned. A temperature offset correction register may be accessed by a user via DRP 201 for access to a calibration register 313. A calibration register 313 may contain an initial value, which may be used after characterization of an FPGA dye, which may be used to center a transfer function of temperature sensor 1202. Notably, users may modify contents of such a calibration register in order to carry out their own calibration.

Notably, many registers have no definition in any ADC mode. Accordingly, such registers may be used as user memory for a processor, such as an embedded or software instantiated microprocessor, which controls ADC 200 function. Accordingly, writing to such user registers will have no impact on operation of ADC 200. Such scratch registers may be read and written via DRP 201 and may be initialized at design time or dynamically reconfigured during operation. Notably, a user may disable calibration coefficients at any time by using calibration bits 422 in configuration registers 310-2.

Analog inputs of ADC 200 may employ differential sampling to reduce effects of common mode noise signals.

Common mode rejection improves performance of ADC 200 in noisy digital environments. ADC 200 analog inputs may be driven from single-ended or differential sources. For using analog inputs with single-ended sources unipolar mode should be used. For driving analog inputs from a differential source, such analog inputs are used in a bipolar mode. Unipolar and bipolar mode selection is made by writing to unipolar/bipolar mode bit location 404 in configuration register 310-0.

Figure 13A:
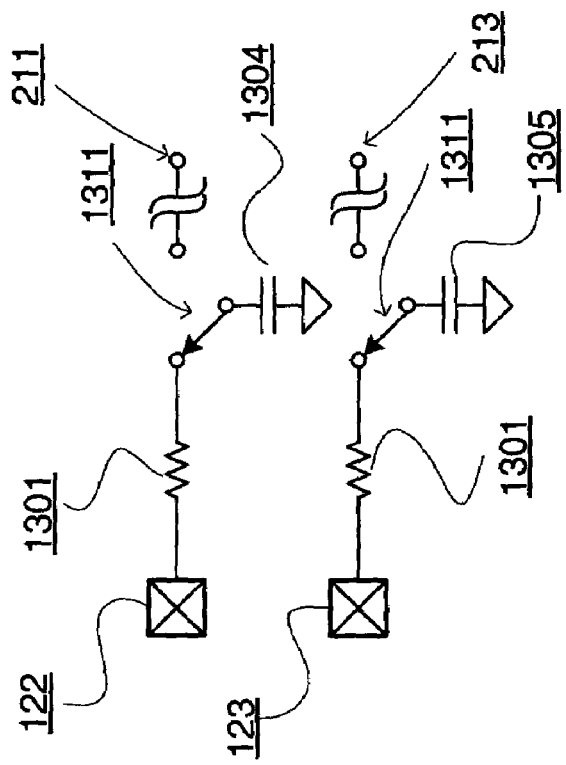
FIGS. 13A and FIG. 13B are schematic diagrams depicting exemplary embodiments of respective unipolar and bipolar mode analog inputs to the ADC of FIG. 3A.
Figure 13B:
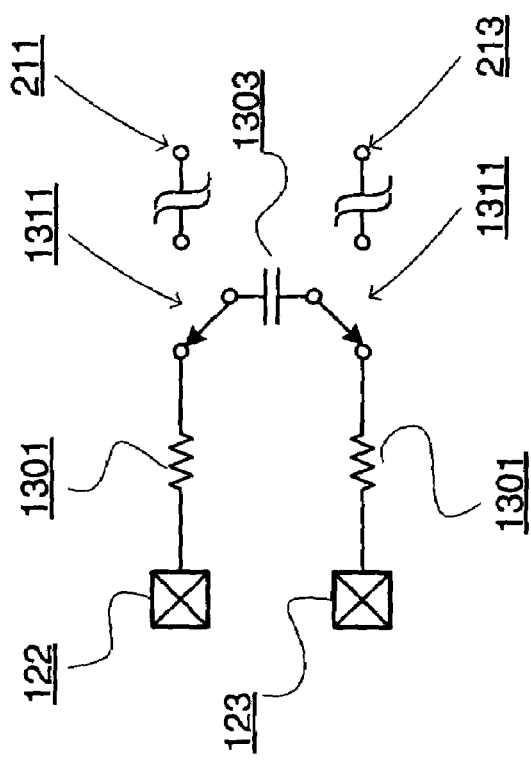

FIGS. 13A and 13B are schematic diagrams depicting exemplary embodiments of respective unipolar and bipolar mode analog inputs to ADC 200. In both unipolar mode and bipolar mode, each terminal 122 and 123 is respectively coupled to a multiplexer having a resistance 1301. Operation of multiplexer 216 may be modeled as a sampling switch 1311 having an associated sampling capacitance, such as sampling capacitor 1303 in a unipolar mode and sampling capacitors 1304 and 1305 in a bipolar mode. Sampling switch 1311 and associated sampling capacitance are used to acquire signal of an analog input for conversion by ADC 200.

During an acquisition phase, sampling switch 1311 is closed and a sampling capacitance, such as for sampling capacitor 1303 or sampling capacitors 1304 and 1305, is charged up to voltage of an analog input. Time needed to charge such a capacitor to a final value is dependent upon the capacitor capacitance as well as the multiplexer resistance. For example, with a multiplexer having a resistance of approximately 100 ohms for a dedicated analog channel, or approximately 30 kilo-ohms for an auxiliary analog channel, and sample capacitance of approximately six pico-farads in a unipolar mode and approximately three pico-farads in a bipolar mode, acquisition time may be in the nanosecond range for dedicated connections and in the sub-one microsecond range for auxiliary analog input channels. Accordingly, external resistance of analog inputs adds to the effective impedance, shown as multiplexer resistance, for purposes of determining acquisition time.

Output coding of ADC 200 in a unipolar mode is binary. Design code transitions occur at successive integer LSB values.

When operated in a bipolar mode, analog inputs to ADC 200 may be driven from differential sources. When an input is differential, the amplitude of such an input is the difference between the positive and negative voltage inputs. A peak-to-peak amplitude of each input is approximated to a common mode voltage. For a differential source, common mode voltage is defined as the quantity of a positive voltage plus a negative voltage divided by two. Output coding of ADC 200 in bipolar mode is two's compliment. Accordingly, design code transitions occur at successive integer LSB values.

System monitor 20 is integrated into a host FPGA. This integration includes access to local interconnect tiles, clock resources, configuration memory, dedicated input/output lines and local digital input/output connections for additional analog inputs. Additionally, IEEE Standard 1149.1-controlled read-back support for System Monitor 20 output data registers may be included.

Figure 14A:
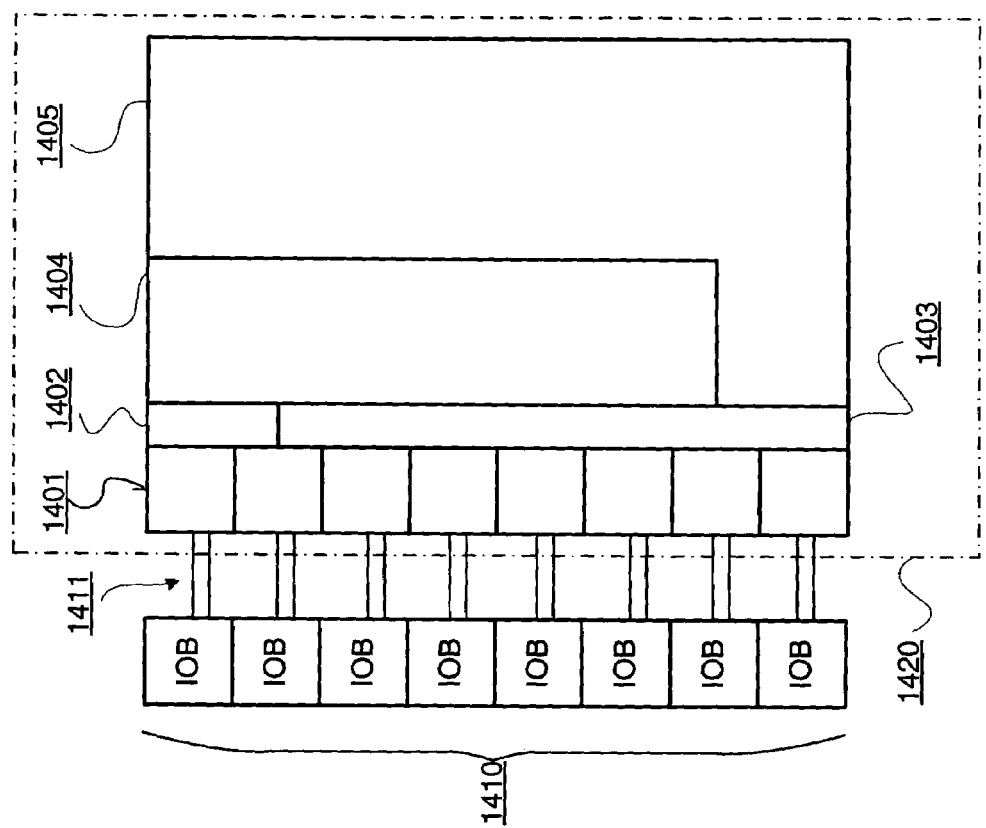
FIGS. 14A and 14B are block diagrams depicting respective exemplary embodiments of System Monitor floor plans for the System Monitor of FIG. 2.
Figure 14B:
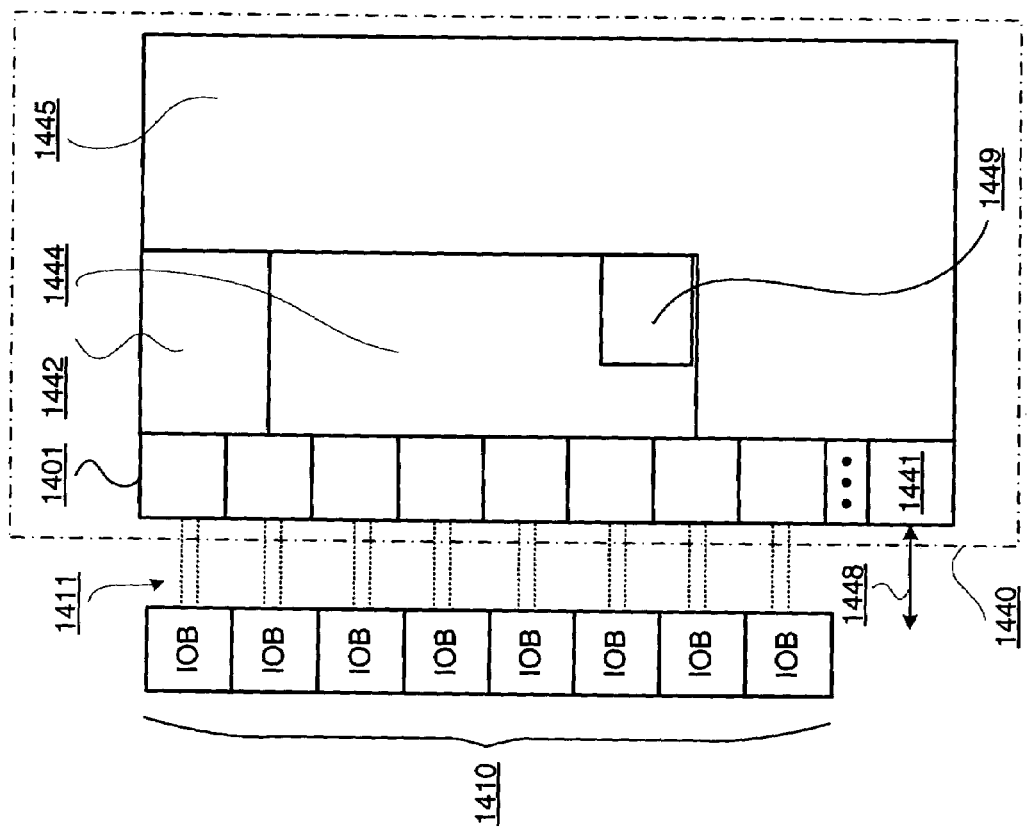

FIGS. 14A and 14B are block diagrams depicting respective exemplary embodiments of System Monitor floor plans 1420 and 1440. Notably, interconnect tiles 1401 may be connected to IOBs 1410 via traces 1411 in each System Monitor floor plan 1420 and 1440.

In System Monitor floor plan 1420, eight interconnect tiles 1401 border System Monitor dynamic reconfiguration memory 1402 and programmable read-only memory 1403. System monitor logic block 1404 borders System Monitor dynamic reconfiguration memory 1402 and a portion of programmable read-only memory 1403. Notably, programmable read-only memory 1403 within System Monitor 20 is optional, and may be omitted if insufficient area is available. In which embodiment, memory external to System Monitor 20 may be accessed. System monitor analog block 1405 borders System Monitor logic block 1404 and a portion of programmable read-only memory 1403. System monitor analog block 1405 includes ADC 200, analog multiplexers, reference voltage generators, temperature sensors, peak detectors, and supply voltage monitors.

In System Monitor floor plan 1440, the interconnect tiles 1401 border System Monitor dynamic reconfiguration memory 1442, System Monitor logic block 1444 and a portion of System Monitor analog block 1445. System monitor dynamic reconfiguration memory 1442 and System Monitor logic block 1444 border System Monitor analog block 1445. System monitor analog block 1445 includes ADC 200, analog multiplexers, reference voltage generators, temperature sensors, and supply voltage monitors.

System monitor logic block 1444 includes a processor block 1449. Processor block 1449 may include an embedded microprocessor, such as a 16-bit hardwired version of a PicoBlaze from Xilinx, Inc. of San Jose, Calif., or an embedded microsequencer. Memory whether internal to or external from System Monitor 20 may be used to store instructions for such an embedded processor or microsequencer.

DRP clock signal 108 for DRP 201 is obtained directly from an FPGA interconnect tile and used to clock ADC 200. Additionally, DRP clock signal 108 for DRP 201 is used to clock digital logic and synchronized data transfers between System Monitor 20 and other FPGA circuitry.

DRP clock signal 108 is not derived from an on-chip oscillator signal 215. On-chip oscillator signal 215 may automatically switched over as a source clock for System Monitor 20 internal circuitry in the event there is no DRP clock signal 108 input from an FPGA interconnect. DRP clock signal 108 may be derived from an externally provided signal to a host FPGA.

On-chip oscillator signal 215 source is used during an initial power-up and is provided to run System Monitor 20 for temperature monitoring until DRP clock signal 108 takes over, if present. System monitor 20 transitions to use DRP clock signal 108, if present, responsive to global write enable signal 704 going to a logic low level and DRP clock signal 108 becoming active at the end of an FPGA initial configuration of System Monitor 20.

System monitor 20 switches over to signal 215 during power-down of an FPGA and continues to monitor FPGA conditions, such as temperature, during power-down. System monitor 20 is configured to detect if DRP clock signal 108 from an FPGA interconnect somehow goes missing during operation, and will switch over to on-chip oscillator signal 215 to provide continued monitoring. Selection of on-chip oscillator signal 215 is controlled by System Monitor control logic 221.

Figure 15A:
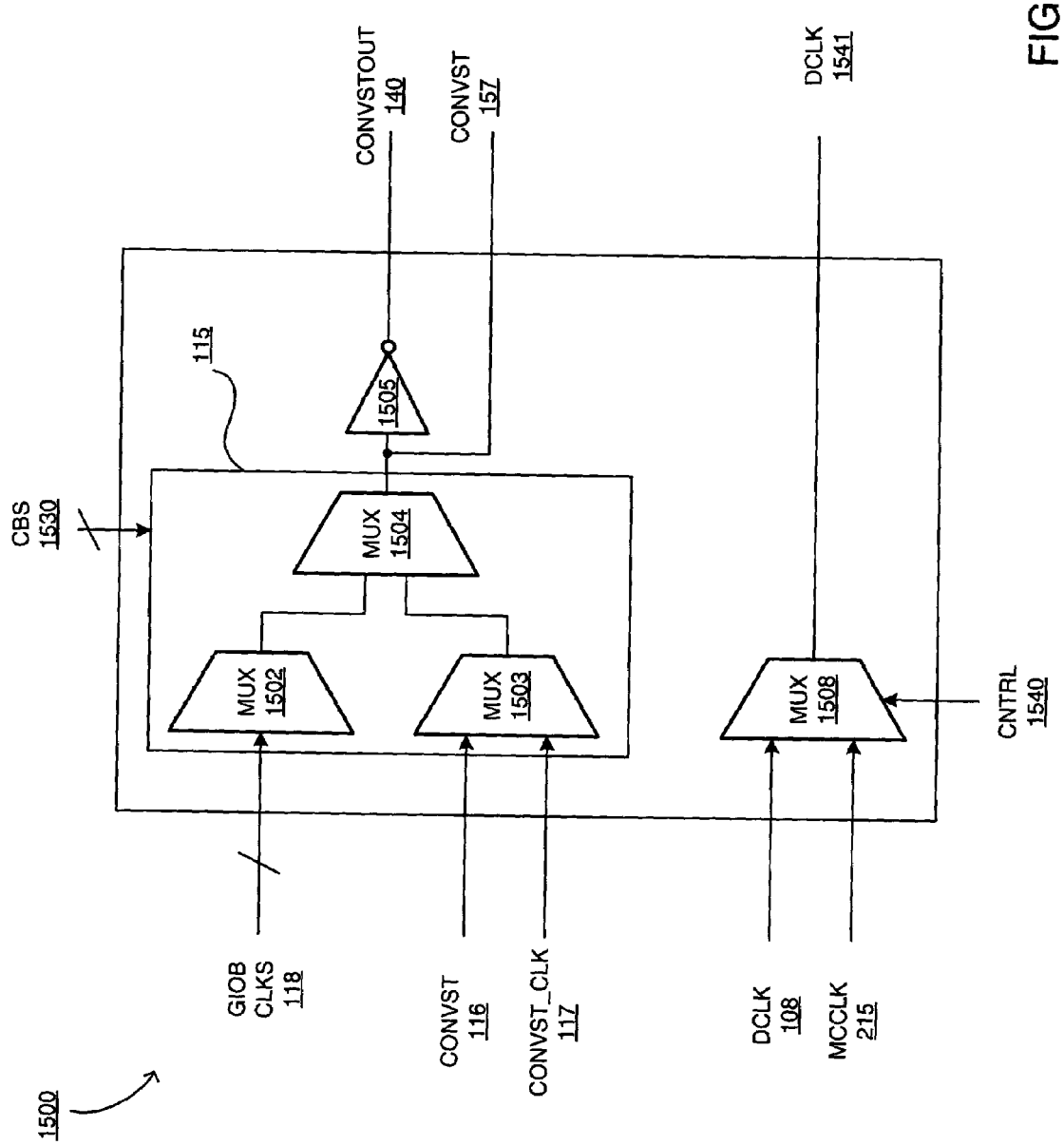
FIG. 15A is a schematic diagram depicting an exemplary embodiment of a clock tree for the System Monitor of FIG. 2.

FIG. 15A is a schematic diagram depicting an exemplary embodiment of System Monitor 20 clock tree 1500. Clock tree 1500 includes multiplexers 115 and 1508, and optionally may include inverter 1505. Multiplexer 115 may be made up of multiplexers 1502, 1503 and 1504. With renewed reference to FIGS. 2 and 3 and continued reference to FIG. 15A, clock tree 1500 is further described.

CONVST clock input 157 is used for an event-sampling mode to define a sampling incident of ADC 200. CONVST clock signal 157 has three possible sources. CONVST clock signal 157 may be obtained from a clock output from an interconnect, namely, CONVST clock signal 117. CONVST clock signal 157 may be obtained from a logic output from an interconnect, namely, CONVST signal 116. Or, CONVST clock signal 157 may be obtained from one of a number, such as sixteen, of GIOB clock signals 118 which are differential.

GIOB clock signals 118 provide a low jitter, low latency clock source for CONVST clock signal 157. For an ADC 200 sampling clock in dynamic applications, it is beneficial to have limited jitter.

For example, CONVST clock multiplexer 1502 may receive sixteen GIOB clock signal inputs 118 of which one may be selected for output from multiplexer 1502. A control signal, such as FPGA configuration bits signal 1530, may be used to select one of GIOB clock signal inputs 118 for output from multiplexer 1502. Output of multiplexer 1502 is provided as an input to multiplexer 1504.

Multiplexer 1503 receives a CONVST clock signal 117 and a CONVST signal 116. A control signal, such as FPGA configuration bits signal 1530, may be used to select one of CONVST clock signal 117 and CONVST signal 116 for output from multiplexer 1503. Output of multiplexer 1503 is provided as an input to multiplexer 1504.

Output of multiplexer 1504 is either one of CONVST clock signal 117 and CONVST signal 116 or one of GIOB clocks 118. A control signal, such as FPGA configuration bits signal 1530, may be used to select an output from multiplexer 1504. The output of multiplexer 1504 is CONVST signal 157. The output from multiplexer 1504 may be inverted with an optional inverter 1505 to provide CONVSTOUT signal 140. CONVST clock multiplexers 1502, 1503 and 1504 may be implemented in System Monitor 20.

Dynamic reconfiguration port DRP clock signal 108 and on-chip oscillator signal 215 are provided as inputs to multiplexer 1508. System monitor control logic 221 provides a control signal 1540 to multiplexer 1508 to select DRP clock signal 108 when present and to select on-chip oscillator signal 215 when DRP clock signal 108 is not present to provide ADC data clock signal 1541. Data clock signal 1541 is divided down to provide ADC clock signal 219.

System monitor 20 initializes control via registers 310, 312, 313 and 314. Registers 310, 312, 313 and 314 may be written to and read from by FPGA both during an initialization as well as afterwards dynamically during operation. However, to initialize registers 310, 312, 313 and 314 at design time, such registers may be associated with FPGA configuration memory cells as a memory block. A dynamic reconfiguration memory block may be used to implement System Monitor 20 registers 310, 312, 313 and 314.

Configuration register bits for System Monitor 20 may be implemented using dynamic reconfiguration. Thus, in addition to being configured by a configuration bitstream, such bits may be read to and written from FPGA fabric via DRP 201. Address space is allocated for reading and writing to such registers via DRP 201.

System Monitor JTAG Configurations

Figure 15B:
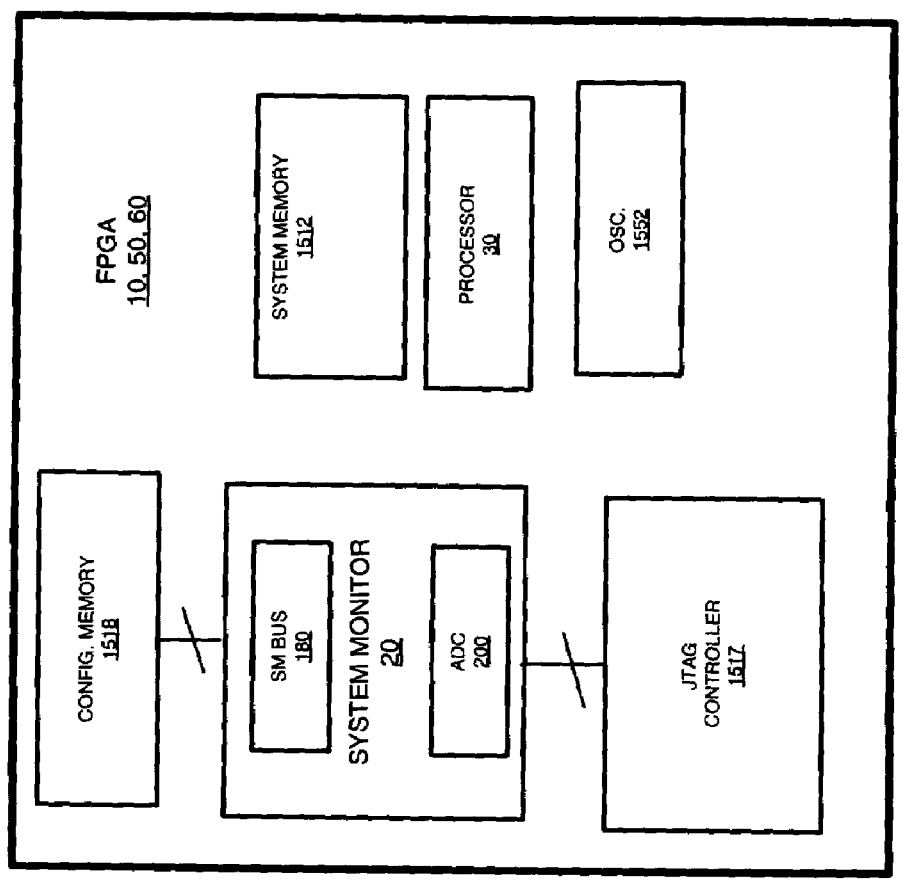
FIG. 15B is a block diagram depicting an exemplary embodiment of an FPGA having a System Monitor of FIG. 2.

FIG. 15B is a block diagram depicting an exemplary embodiment of an FPGA 10, 50, and 60 having a System Monitor 20, configuration memory 1518, system memory 1512, processor 30, oscillator 1552, and an IEEE 1149.1 TAP controller 1517. System Monitor 20 may communicate via DRP 201 to access configuration memory 1518 associated with System Monitor 20. System Monitor 20 includes a system monitor digital bus 180.

With renewed reference to FIGS. 2, 3 and 15A and continued reference to FIG. 15B, FPGAs 10, 50, and 60 are further described. Aspects of System Monitor 20 configuration are not accessible via DRP 201 including a bit used to divide DRP clock signal 108 to provide a state machine clock signal. Additionally, there are bits for dividing down oscillator signal 215 to provide ADC clock signal 219. There are bits to set over temperature alarm limits, and these bits have the same definition as bits in alarm registers 314. There are bits used to configure operating modes of System Monitor 20, including system monitor mode, ADC mode, test mode, and system monitor block power-off, among other parameters or functions for operating modes. There are bits used to select a CONVST clock source.

There are bits used as block enables for hardwired logic in System Monitor 20. Each of these blocks may be disabled and their functionality replaced with a software instantiated processor. The default setting is to disable a software instantiated processor. There are bits used to activate adjustments to system monitor functionality.

A number of dedicated connections between configuration logic block and System Monitor blocks may be present. These dedicated connections may be used to provide JTAG read functionality to data registers 209. Special purpose and global signals allow System Monitor 20 to operate before configuration and during partial configuration of an FPGA.

Output registers of System Monitor 20 may be scanned via an IEEE 1149.1 Test Access Port ("TAP") as part of TAP controller 1517. A TAP controller state machine of IEEE 1149.1 TAP controller 1517 contains instructions to allow a read-back of output data stored in output data registers 209 via a Test Data Out ("TDO") bus of the TAP controller 1517. A read-back may be done during an FPGA power-down or after an initial power-up of an FPGA prior to configuration of System Monitor 20. Scan pins 141 through 150 may be used by TAP controller 1517 to do boundary test scans of System Monitor 20.

TAP controller 1517 is a digital interface, which may conform to IEEE 1149.1. Accordingly, it should be understood that by using ADC 200 functions to provide digital signals to TAP controller 1517, TAP controller 1517 may be used to provide analog test capability using an IEEE 1149.1 interface. This is done in part by using ADC 200 of System Monitor 20, and thus circuitry overhead for analog testing is reduced. Additionally, as described below in additional detail, a digital-to-analog converter ("DAC") may be added to a boundary-scan chain to provide an analog stimulus for a test procedure for a parametric analog test of a component.

Figure 16A:
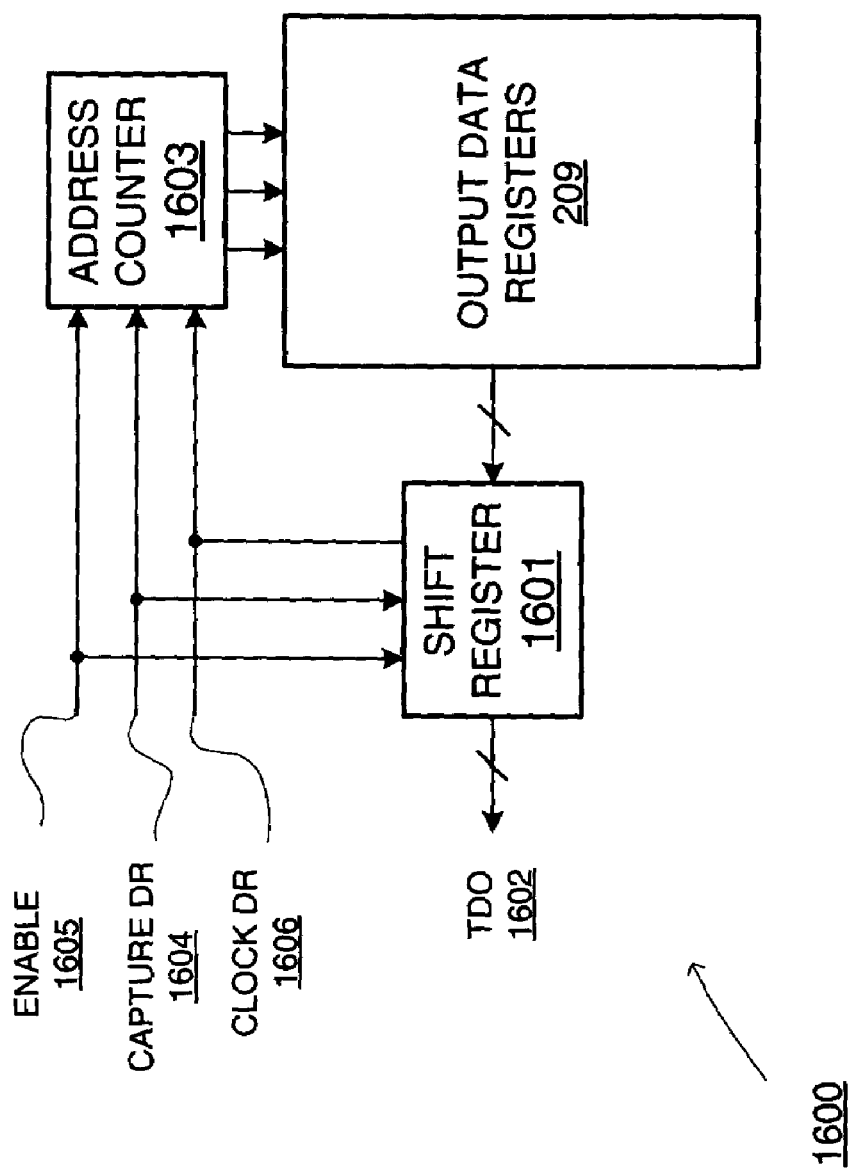
FIG. 16A is a block diagram depicting an exemplary embodiment of IEEE 1149.1 Test Access Port (TAP) connections for the System Monitor register memory/interface of FIG. 3A.

FIG. 16A is a block diagram depicting an exemplary embodiment of System Monitor 20 TAP signal connections 1600 for the register memory/interface 210. FIG. 16B is a signal diagram depicting an exemplary embodiment of System Monitor read timing 1670. With simultaneous reference to FIGS. 16A and 16B, System Monitor TAP signal connectivity and read timing is further described.

Output data registers 209 are coupled to shift register 1601 for providing stored data thereto. Stored data is shifted out of shift register 1601 via test data output ("TDO") signals 1602. An address counter 1603 is coupled to output data registers 209. Capture data register signal 1604, enable signal 1605 and clock data register signal 1606 are provided to shift register 1601 and address counter 1603. Clock data register signal 1606 may be provided responsive to and synchronized with a Test Clock ("TCLK") signal 1640.

For a readback of output data stored in output data registers 209, System Monitor 20 shifts out a header sequence 1620, such as 32 zeros, of TDO signals 1602 to synchronize external clock TCLK 1640 with internal System Monitor clock 108. Furthermore, this shifting out of 32 zeros provides sufficient time for System Monitor 20 to suspend updating of output data registers 209 and start shifting registers contents out onto TDO signals 1602. Data 1621 is shifted out starting at a $33^{rd}$ clock cycle, generally at 1610, of data register clock signal 1606. Data 1621 continues to be shifted out ending with an ending clock cycle, such as clock cycle 416 of clock data register signal 1606 generally at 1611.

Accordingly, on TDO signals 1602 a header 1620, such as of 32 zeros, is followed by data 1621 from output data registers 209. In the exemplary embodiment illustratively shown in FIG. 16B, if capture data register signal 1604 is high on a rising edge of clock data register signal 1606, the first zero is shifted out on the next clock data register signal 1606 rising edge, generally at 1632. This idle time (e.g., 32 zeros) is used to provide enough time for System Monitor 20 to suspend updating of output data registers and start shifting output data register contents out via TDO signals 1602. Data is shifted out starting with the Most Significant Bit ("MSB") of one data register, such as a first register in a stack, and ends with the Least Significant Bit ("LSB") of another data register, such as a last register in the stack. In this embodiment, data is shifted out starting at clock cycle 33 and ending on clock cycle 416.

In addition to monitoring on-chip quantities like temperature and voltage, System Monitor 20 provides access to external analog signals via existing digital input/output blocks of an FPGA. These digital input/output blocks may be defined either as digital or analog in configuration at the time of configuration of an FPGA. In an embodiment, input/output bank to the left of center column 83 of FIG. 1D may be used to provide seven differential input channels (i.e., auxiliary analog input channels) for seven external auxiliary input/output channels. Differential analog input channels may be routed for impedance matching to enhance analog performance.

In an embodiment, System Monitor 20 includes six dedicated input/outputs to ADC 200. Two of these dedicated input/outputs are for a differential input. Two other of these input/outputs are for a differential reference voltage input. By using an external reference device, positive and negative reference voltages with low temperature coefficients may be supplied. Accordingly, such a reference voltage should be stable over a wide temperature range, as it will be used to calibrate on-chip measurements. The remaining two analog input/outputs coupled to dedicated connections of an FPGA are ADC VDD 155 and ADC VSS 156, and may be used to decouple the power supply for ADC 200 analog circuits and provide a ground return for ADC digital circuitry.

FIG. 16C is a signal diagram depicting an exemplary alternative embodiment of System Monitor read timing 1670A. System Monitor read timing 1670A is similar to System Monitor read timing 1670 of FIG. 16B, except clock data register signal 1606 begins and ends at a logic high level; enable signal 1605 is shifted one clock cycle of TCLK 1640 to the right; and capture data register signal 1604 is shifted one clock cycle of TCLK 1640 to the right. Thus, clock data register signal 1606 will be at a logic high level when not used as described below.

Responsive to JTAG instruction for System Monitor access being loaded and the JTAG state machine being taken through a capture data register ("CaptureDR") state to a shift data register ("ShiftDR") state, clock data register signal 1606 begins cycling, namely, going to a logic low level for a half cycle and then to a logic high level for a half cycle and then repeating the cycle. Capture data register signal 1604 pulses high during that first full cycle 1675 that clock data register signal 1606 goes from an idle logic high state to cycling. Enable signal 1605 in response to pulse 1631 goes to a logic high level on the falling edge of that first full cycle 1675 of clock data register signal 1606.

Figure 17A:
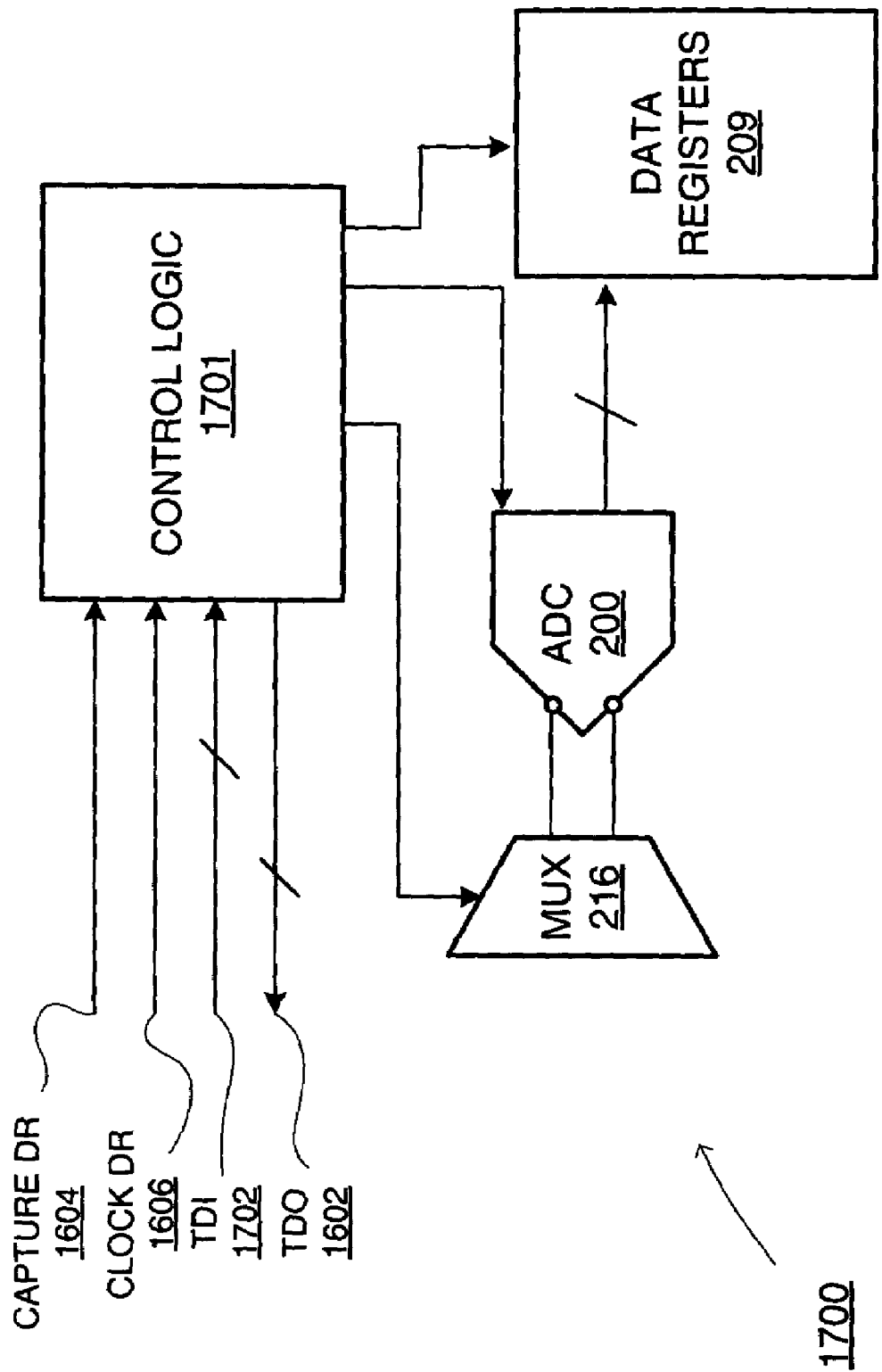
FIG. 17A is a block/schematic diagram depicting an exemplary embodiment of an analog-to-digital TAP controller interface for capturing data.

FIG. 17A is a block/schematic diagram depicting an exemplary embodiment of an analog-to-digital TAP interface 1700 for capturing data. Control logic 1701 is configured to provide TDO signals 1602 and to receive captured data register signal 1604, clock data register signal 1606 and Test Data Input ("TDI") signals 1702. Signals 1604, 1606, 1602 and 1702 are to or from JTAG controller 1517 of FIG. 15B.

A channel for inputting data is selected from multiplexer 216 as previously described, and such data is provided to ADC 200 for analog-to-digital conversion. ADC 200 may be configured by control logic 1701. Output of ADC 200 is stored in data registers 209 under control of control logic 1701.

For example, with a JTAG write operation, an internal or external sensor to a host FPGA may be selected by sending an address for channel selection to control logic 1701 and thereby to analog multiplexer 216. A subsequent JTAG write operation may be used to instruct ADC 200 via control logic 1701 to perform an analog-to-digital conversion on analog output from a selected channel and place the digital result in a register of data registers 209. A subsequent JTAG read operation may be used to access the digital result.

Figure 17B:
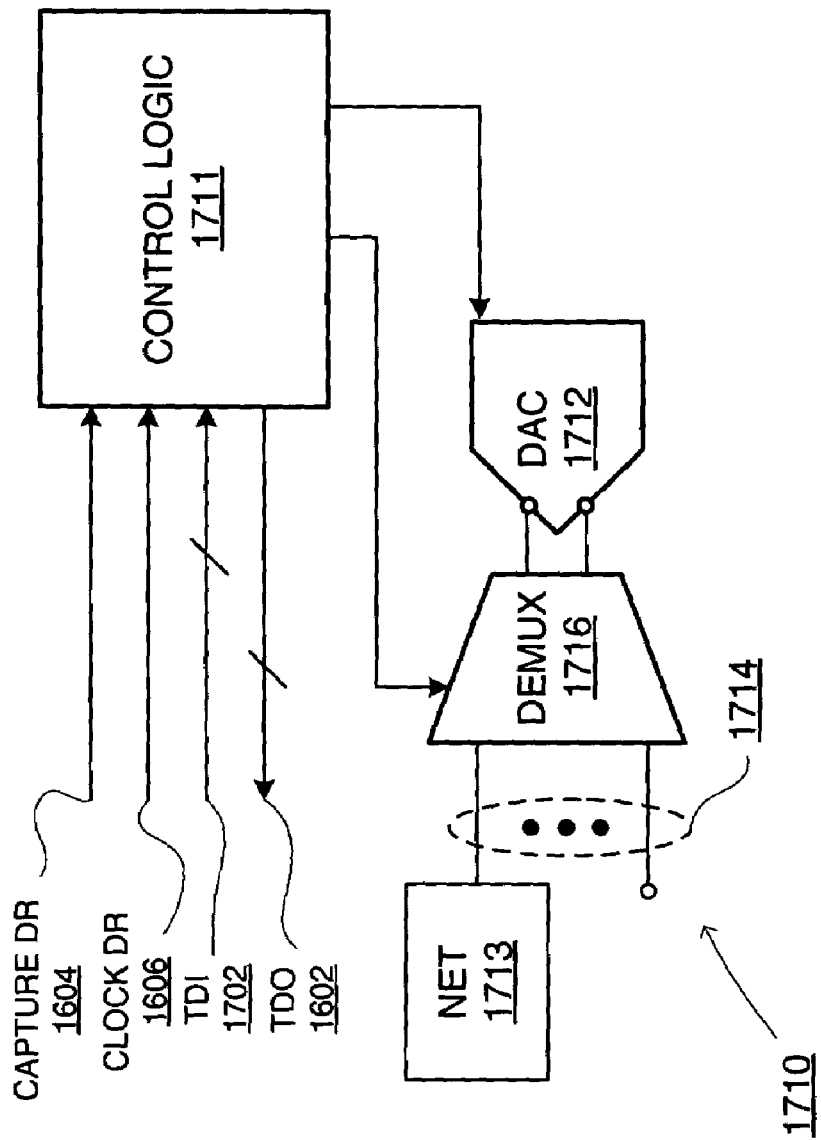
FIG. 17B is a block/schematic diagram depicting an exemplary embodiment of a digital-to-analog TAP controller interface for generating an on-chip or off-chip analog stimulus signal.

FIG. 17B is a block/schematic diagram depicting an exemplary embodiment of a digital-to-analog JTAG interface 1710. Digital-to-analog converter ("DAC") 1712 is coupled to receive digital input from control logic 1711. Control logic 1711 is coupled to JTAG controller 1517 of FIG. 15B to receive digital TDI signals 1702 and configured to provide digital TDI signals 1702 to DAC 1712. DAC 1712 converts such TDI digital input to analog output and is coupled to provide a differential analog output to demultiplexer 1716. Demultiplexer 1716 may be multiplexer 216 of FIG. 17A operated in a reverse direction. Moreover, multiplexer 216 of FIG. 17A and demultiplexer 1716 may be thought of as a multiplexer tree, such as multiplexer tree 220 of FIG. 3A, where the latter is operated in the reverse direction.

A control signal from control logic 1711 is used to select a channel from a plurality of channels 1714 to provide differential analog output, for example to a detector, sensor or other circuit or network under test 1713. For example, an analog voltage may be provided to circuit under test 1713. Circuit under test 1713 may be external or internal to a host FPGA of interface 1710.

For example, a write-only function may be implemented allowing DAC 1712 output voltage to be adjusted using a JTAG write operation. Demultiplexer 1716 may be used to select a circuit to be tested. Notably, by using a demultiplexer 1716, a single DAC may be used to test multiple circuits. Output of DAC 1712 may be a reference voltage, frequency or waveform for testing analog functions of circuit under test 1713.

In FIGS. 17A and 17B, control logic 1711 and 1702 may be formed of configurable logic. However, control logic 1711 and 1702 may be hardwired logic. Moreover, multiplexer 216 and demultiplexer 1716 are formed of hardwired logic. Notably, an analog input may be provided via DAC 1712 to a circuit under test 1713, and the response to such analog input stimulus may be an analog voltage or other analog information. This information may be collected using a TAP of TAP controller 1517 of FIG. 15B. Collected information may be monitored by System Monitor 20 of FIG. 2. For such monitoring, an analog output response may be converted to digital information using ADC 200. Accordingly, analog components of a circuit under test 1713 may be determined. Thus, analog characteristics of a circuit under test 1713 may be evaluated for analog trim or calibration. Moreover, TAP controller 1517 of FIG. 15B may be used to collect responses to analog stimuli for system level analog calibration for production testing.

Accordingly, it should be appreciated that an ADC and DAC embedded in a host FPGA for use in mixed signal applications may be leveraged for calibration and test using JTAG circuitry of such a host FPGA. This is not limited to FPGA integrated circuits, but includes other integrated circuits. For example, microcontrollers may include an embedded ADC and support JTAG for testing and to program embedded memory, such as embedded flash memory. Such an integrated circuit may have the ADC added to the boundary-scan chain, where an analog interface of the microcontroller may be used to perform analog measurements with chip or board level data being available via a an IEEE 1149.1 interface during testing. For example, at a circuit board level, power supply voltages, current and temperatures may be monitored over a digital test bus, such as a JTAG interface, using an ADC for an analog-to-digital conversion of the monitored signals. Notably, external channels do not have to be dedicated, but may be assigned to applications, such as a user interface, e.g., touch screen, among other applications. Furthermore, prior to swapping in a replacement circuit board, TAP controller 1517 may be used to test analog functionality of such board, as well as digital functionality, prior to using it as a replacement.

Furthermore, it should be appreciated that by using or reusing embedded DAC or ADC functionality within an FPGA, tests may be run that would otherwise involve using more expensive Automated Test Equipment ("ATE"). For example, with a programmable logic device, such as a CPLD or FPGA, post processing of digital information converted from analog information may be done internal to such programmable logic device by downloading Built-In Self-Test ("BIST") functions, such as Fast Fourier Transforms ("FFTs"), using configurable logic. By configuring configurable logic and programmable interconnects, a mixed signal tester on an integrated circuit may be provided with a programmable logic device so configured.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners. Additionally, the headings herein are for the convenience of the reader and are not intended to limit the scope of one or more aspects of the invention.

APPENDIX A

```
// Copyright (c) 2000, 2002 Xilinx Inc. All rights reserved.
// Title: PicoBlaze Microcontroller (16-bit version)
// Project: System Monitor
// Description: Implements a register transfer level (RTL)
// Verilog model of Ken Chapman's Constant (k) Coefficient
// Programmable State Machine microcontroller (KCPSM). This version // has 16 bit wide data paths.
// This version of PicoBlaze differs from the original as follows:
// 1. The data paths are 16 bits wide. Since the instruction
//   constant (kk) remains 8 bit wide, it is sign extended
//   for all // the original instructions that included the kk
//   field.
// 2. To free up op codes for new instructions, the
//   following two // instructions were moved:
// Was: Bxy0 INPUT sX, (sY)
// Is: Cxy8 INPUT sX, (sY)
// Was: Fxy0 OUTPUT sX, (sY)
// Is: Cxy9 OUTPUT sX, (sY)
// 3. Two new compare (subtract without changing any
//   registers) // instructions were created, as follows:
// Bxkk CMP sX,KK ; the sign of kk is extended to the
//   upper 8 bits // CxyE CMP sX,sY
// 4. To easily load the upper byte of a register with a
//   constant, // the following new instruction was implemented:
// Fxkk LDUPR sX, kk
// 5. The register file and stack file are now on the same
//   // hierachy level as this module. This allows them to be
//   // optionally implemented in custom logic.
// 6. All instantiations from the unisims library have been
//   // replaced with in-line behavioral code.
// 7. Three internal signals have been pinned out to
//   facilitate // testing.
// 8. When an interrupt occurs, the ZERO and CARRY
//   flags never1 // change at the end of the instruction that
//   was interrupted. // (This doesn't affect operation, but it
//   does make the trace // listing less confusing.)
// 9. Designware adder/subtractor DW01_addsub is
//   instantiated // directly for the ALU adder/subtractor.
//   This provides access to // the carry-out signal, without
//   implementing a 17 bit unit.
// 10. All D flip-flops are asynchronously cleared by
//   RESET, with // the trailing edge of the internal reset
//   synchronized.
module piscosys
(
    RESET, // PicoBlaze signals
    WRITE_STROBE,
    READ_STROBE,
    INTERRUPT,
    CLK,
    PORT_ID,
    OUTPUT,
    INPUT,
    I,
    ADDR,
    READ_REG, // additional signals needed to
    NEW_REG_DATA, // interface to the external
    WT_REG_UPR, // register file
    WT_REG_LWR,
    STACK_RAM, // additional signals needed to
    STACK, // interface to the external
    READ, // stack file
    FLAG_EN, // additional signals needed
```

```
    ZERO, // for the Verilog test bench
    CARRY
);
//========================================
//========================================
//
// Input/Output declarations
//
//========================================
//======================================== input RESET; // PicoBlaze signals
output WRITE_STROBE;
output READ_STROBE;
input INTERRUPT;
input CLK;
output ['D_MSB:0] PORT_ID;
input ['D_MSB:0] OUTPUT // this bus is sourced by the
   register file
input ['D_MSB:0] INPUT;
input [15:0] I;
output ['A_MSB:0] ADDR;
input ['D_MSB:0] READ_REG; // additional signals
   needed
output ['D_MSB:0] NEW_REG_DATA; // interface to
   external
output WT_REG_UPR; // register file
output WT_REG_LWR;
input ['A_MSB:0] STACK_RAM; // additional signals
   needed to
output [3:0] STACK; // interface to the external
output READ; // stack file
output FLAG_EN; // additional signals needed
output ZERO; // for the Verilog test bench
output CARRY;
//========================================
//========================================
//
// Signal declarations
//
//========================================
//======================================== reg RESET_S;
reg INTERNAL_RESET;
reg REG_DATA_SEL;
reg ['D_MSB:0] LOGIC;
reg ['D_MSB:0] LOGICAL;
wire SELECT_VECTOR;
reg ['A_MSB:0] RETURN_VECTOR;
wire ['A_MSB:0] ADDR_VECTOR;
reg ['D_MSB:0] ADD_SUB;
wire ['D_MSB:0] LOGICAL_ADD_SUB;
reg ADD_SUB_CARRY;
wire ['D_MSB:0] SHIFT_INPUT;
wire TMP_SHIFT_0;
wire TMP_SHIFT_1;
wire SHIFT_DECODE;
reg SHIFT_INPUT_SEL;
wire SHIFT_BIT;
reg SEL_SHIFT_CY;
reg SHIFT_CARRY;
reg SEL_ARITH_CY;
wire ['A_MSB:0] CNT_ADDR;
wire ['A_MSB:0] NEW_ADDR;
wire INC_ADDR;
reg ['A_MSB:0] ADDR;
wire ALU_CODE3;
reg ALU_CODE2;
wire ALU_CODE1;
wire ALU_CODE0; // when true, CARRY flag is add/sub
   carry input
wire FOR_CODE2;
wire ['D_MSB:0] ARITH;
reg ['D_MSB:0] SHIFT;
wire ['D_MSB:0] SR;
wire ARITH_CARRY;
wire ARITH_DECODE;
reg [3:0] STACK;
wire [3:0] NEW_STACK;
wire [3:0] CNT_STACK;
wire [2:0] CNT_STACK_CY;
wire STACK_LSB;
wire STACK_CIN;
wire FLAG_EN_TYPE;
reg FLAG_EN_COMMAND;
wire FOR_CARRY;
wire NEW_CARRY;
reg CARRY;
reg PRESERVE_CARRY;
wire FOR_ZERO;
wire NEW_CARRY;
reg ZERO;
reg PRESERVE_ZERO;
reg READ; // toggles on each CLK rising edge
reg READ_STROBE;
wire RD_STRB;
wire EN_WRITE_REG;
reg WT_REG_UPR;
reg WT_REG_LWR;
wire REG_WRITE_TYPE;
wire WR_STRB;
reg WRITE_STROBE;
wire FORCE_FF;
reg INTERRUPT_CAPTURE;
wire RETURNI_DECODE;
reg RETURNI_COMMAND;
wire HOLD_CLEAR_INT;
wire INT_SET;
wire INTERRUPT_TYPE;
wire FOR_INT_EN;
reg INT_ENABLE;
wire MOVE_COMMAND;
wire MOVE_BASE_GROUP;
wire VALID_TO_MOVE;
wire SRCY;
wire CONDITION_MET;
wire [7:0] LDUPR_MUX;
wire GROUP_INPUT; // I=A---
wire GROUP_COMPARE; // I=B---
wire GROUP_2_REG; // I=C---
wire GROUP_SHIFT; // I=D---
wire GROUP_OUTPUT; // I=E---
wire GROUP_LDUPR; // I=F---
wire SUB_GROUP_INPUT; // I=---8
wire SUB_GROUP_OUTPUT; // I=---9
wire SUB_GROUP_COMPARE; // I=---E
reg FORCE_FF_REG;
wire [7:0] KK_UPR;
wire [7:0] KK_LWR;
wire ['D_MSB:0] KK;
wire KK_SIGN;
// wire LOGICAL_KK; // not needed because logicals now
   sign-extend
```

```
   wire CARRY_IN;
// wire GND=0;
// wire VCC=1;
/*
// synopsys translate_off
   initial
      begin
         ADDR=0;
         ADD_SUB=0;
         ADD_SUB_CARRY=0;
         ALU_CODE2=0;
         CARRY=0;
         FLAG_EN_COMMAND=0;
         FORCE_FF_REG=0;
         INTERNAL_RESET=1;
         INTERRUPT_CAPTURE=0;
         INT_ENABLE=0;
         LOGICAL=0;
         PRESERVE_CARRY=0;
         PRESERVE_ZERO=0;
         READ=0;
         READ_STROBE=0;
         REG_DATA_SEL=0;
         RESET_S=1;
         RETURNI_COMMAND=0;
         RETURN_VECTOR=0;
         SEL_ARITH_CY=0;
         SEL_SHIFT_CY=0;
         SHIFT=0;
         SHIFT_CARRY=0;
         SHIFT_INPUT_SEL=0;
         STACK=0;
         WRITE_STROBE=0;
         WT_REG_LWR=0;
         WT_REG_UPR=0;
         ZERO=0;
      end
   // synopsys translate_on
*/
//===========================================
//
// Reset
//
//===========================================
// INTERNAL_RESET is asynchronously activated by RESET, but it is
// synchronously deactivated after RESET is deactivated.
always @ (posedge CLK or posedge RESET)
   begin
      if (RESET) RESET_S<=#1 1'b1;
      else RESET_S<=#1 RESET;
   end
always # (posedge CLK or posedge RESET)
   begin
      if (RESET) INTERNAL_RESET<=#1 1'b1;
      else INTERNAL_RESET<=#1 RESET_S;
   end
//===========================================
//
// Instruction Group & Sub-group translations
//
//===========================================
assign GROUP_INPUT=(I[15:12]==4'hA);
assign GROUP_COMPARE=(I[15:12]==4'hB);
assign GROUP_2_REG=(I[15:12]==4'hC);
assign GROUP_SHIFT=(I[15:12]==4'hD);
assign GROUP_OUTPUT=(I[15:12]==4'hE);
assign GROUP_LDUPR=(I[15:12]==4'hF);
assign SUB_GROUP_INPUT=(I[3:0]==4'h8);
assign SUB_GROUP_OUTPUT=(I[3:0]==4'h9);
assign SUB_GROUP_COMPARE=(I[3:0]==4'hE);
//===========================================
//
// Program counter logic
//
//===========================================
assign SELECT_VECTOR=MOVE_BASE_GROUP & VALID_TO_MOVE;
assign ADDR_VECTOR=I[8] ? I['A_MSB:0]: RETURN_VECTOR;
assign CNT_ADDR=SELECT_VECTOR ? ADDR_VECTOR: ADDR;
assign INC_ADDR=~(MOVE_BASE_GROUP & VALID_TO_MOVE & (I[8]| I[6]));
assign NEW_ADDR=CNT_ADDR+INC_ADDR;
always @ (posedge CLK or posedge INTERNAL_RESET)
   begin
      if (INTERNAL_RESET)
         ADDR<=#1 0;
      else
         begin
            if (FORCE_FF)
               ADDR<=#1 8'NEW_ADDR;
            else
            if (READ)
               ADDR<=#1 NEW_ADDR;
         end
   end
//===========================================
//
// Internal register file logic
//
//===========================================
assign LOGICAL_ADD_SUB=ALU_CODE2 ? ADD_SUB: LOGICAL;
always @ (posedge CLK or posedge INTERNAL_RESET)
   begin
      if (INTERNAL_RESET)
         REG_DATA_SEL<=#1 0;
      else
         REG_DATA_SEL<=#1 ALU_CODE3;
   end
assign NEW_REG_DATA=REG_DATA_SEL? LOGICAL_ADD_SUB: SHIFT_INPUT;
// assign REG_WRITE_TYPE=~I[15]
// |(I[15] & (I[14] ^ I[13]));
assign REG_WRITE_TYPE=~I[15]// 0xkk-7xkk
   |GROUP_INPUT // Axpp
   |(GROUP_2_REG & ~I[3]) // Cxy0-Cxy7
   |(GROUP_2_REG & SUB_GROUP_INPUT) // Cxy8
   |GROUP_SHIFT /// Dx00-Dx0F
   |GROUP_LDUPR; // FxKK
```

```
assign EN_WRITE_REG=~FORCE_FF & READ &
   REG_WRITE_TYPE;
always @ (posedge CLK or posedge INTERNAL_RE-
   SET)
   begin
      if (INTERNAL_RESET)
         WT_REG_UPR<=#1 0;
      else
         WT_REG_UPR<=#1 EN_WRITE_REG;
   end
always @ (posedge CLK or posedge INTERNAL_RE-
   SET)
   begin
      if (INTERNAL_RESET)
         WT_REG_LWR<=#1 0;
      else
         WT_REG_LWR<=#1  (EN_WRITE_REG  &
            ~GROUP_LDUPR);
   end
//==========================
==========================
//
// Logical ALU function logic
//
//==========================
========================== always @ (ALU_CODE1 or ALU_CODE0 or OUTPUT
   or PORT_ID)
   begin
      case ({ALU_CODE1, ALU_CODE0}) // synopsys
         parallel_case
      2'h0: LOGIC=PORT_ID; // pass thru
      2'h1: LOGIC=OUTPUT & PORT_ID; // logical
         "and"
      2'h2: LOGIC=OUTPUT |PORT_ID; // logical "or"
      2'h3: LOGIC=OUTPUT ^ PORT_ID; // logical
         "xor"
         default: LOGIC=PORT_ID; // pass thru (de-
            fault)
      endcase
   end
always @ (posedge CLK or posedge INTERNAL_RE-
   SET)
   begin
      if (INTERNAL_RESET)
         LOGICAL<=#1 0;
      else
         LOGICAL<=#1 LOGIC;
   end
//==========================
==========================
//
// Arithmetic ALU function logic
//
//==========================
==========================
assign CARRY_IN=ALU_CODE0 & CARRY;
/*
reg ['D_MSB+1:0] ARITH_WC; // most significant bit is
   carry/borrow
always @ (ALU_CODE1 or OUTPUT or PORT_ID or
   CARRY_IN)
   begin
      if(ALU_CODE1)         ARITH_WC=OUTPUT-
         PORT_ID-CARRY_IN;
      else ARITH_WC=OUTPUT+PORT_ID+CARRY_IN;
   end
assign ARITH=ARITH_WC['D_MSB:0];
assign ARITH_CARRY=ARITH_WC['D_MSB+1];
*/
// alternate implementation of above adder/subtractor
   code
// assign {ARITH_CARRY, ARITH}=ALU_CODE1 ?
   OUTPUT-PORT_ID-CARRY_IN:    OUTPUT+
   PORT_ID+CARRY_IN;
// DW01_addsub Adder-Subtractor
// ADD_SUB='1': SUM<=A-B-CI
// ADD_SUB='0': SUM<=A+B+CI
// Carry-in and Carry-out are active high for both addition
   and subtraction.
DW01_addsub # (16) AS (.A(OUTPUT),
   .B(PORT_ID),
   .CI(CARRY_IN),
   .ADD_SUB(ALU_CODE1),
   .SUM(ARITH),
   .CO(ARITH_CARRY));
always @ (posedge CLK or posedge INTERNAL_RE-
   SET)
   begin
      if (INTERNAL_RESET)
         ADD_SUB<=#1 0;
      else
         ADD_SUB<=#1 ARITH;
   end
//==========================
==========================
//
// Shift ALU function logic
//
//==========================
========================== always @ (posedge CLK or posedge INTERNAL_RE-
   SET)
   begin
      if (INTERNAL_RESET)
         SHIFT_INPUT_SEL<=#1 0;
      else
         SHIFT_INPUT_SEL<=#1  I[13]  &  ~GROU-
            P_LDUPR;
   end
assign LDUPR_MUX=GROUP_LDUPR? I[7:0]: SHIFT
   [15:8];
assign SHIFT_INPUT=SHIFT_INPUT_SEL? INPUT:
   {LDUPR_MUX, SHIFT[7:0]};
// assign SHIFT_INPUT=SHIFT_INPUT_SEL? INPUT:
   SHIFT;
assign TMP_SHIFT_0=I[1] ? OUTPUT ['D_MSB]:
   CARRY;
assign TMP_SHIFT_1=I[1] ?I [0]: OUTPUT[0];
assign  SHIFT_BIT=I[2]  ?  TMP_SHIFT_1: TMP-
   _SHIFT_0;
// assign SR[7]=I[3]? SHIFT_BIT: OUTPUT[6];
// assign SR[6:1]=I[3]? OUTPUT[7:2]: OUTPUT[5:0];
// assign SR[0]=I[3] ? OUTPUT[1]: SHIFT_BIT;
assign  SR['D_MSB]=I[3]?  SHIFT_BIT:  OUTPUT
   ['D_MSB-[1];
assign SR['D_MSB-1:1]=I[3]? OUTPUT['D_MSB:[2]:
   OUTPUT['D_MSB-2:0];
assign SR[0]=I[3]? OUTPUT[1]: SHIFT_BIT;
```

```
always @ (posedge CLK or posedge INTERNAL_RE-
    SET)
    begin
        if (INTERNAL_RESET)
            SHIFT<=#1 0;
        else
            SHIFT<=#1 SR;
    end
//==========================================
//==========================================
//
// Port ID logic
//
//==========================================
//==========================================
// Revised such that logicals (AND, OR, XOR) now sign
    extend.
// assign SELECT_sY=I[15] & ((I[14] & (I[13]~^ I[12]))
    |(~I[14] & I[13] & I[12]);
// assign LOGICAL_KK=~I[15] & ~I[14] & (I[13]|I[12]);
// AND, OR, or XOR
// assign KK_SIGN=I[7] & ~(LOGICAL_KK);
assign KK_SIGN=I[7];
assign KK_UPR={8{KK_SIGN}};
assign KK_LWR=I[7:0];
assign KK={KK_UPR, KK_LWR};
assign PORT_ID=GROUP_2 _REG? READ_REG: KK;
//==========================================
//==========================================
//
// Program stack logic
//
//==========================================
//==========================================
assign STACK_LSB=~READ|(READ & MOVE_BASE_
    GROUP & VALID_TO_MOVE & ~I[8]);
assign CNT_STACK[3]=READ^ STACK[3];
assign CNT_STACK[2]=READ^ STACK[2];
assign CNT_STACK[1]=READ^ STACK[1];
assign CNT_STACK[0]=(FORCE_FF & ((READ & ~
    STACK[0])|(~READ & STACK_LSB)))
    |(~FORCE_FF & (READ^ STACK_LSB^ STACK[0]));
assign STACK_CIN=I[9] & VALID_TO_MOVE &
    MOVE_BASE_GROUP & READ;
assign CNT_STACK_CY[2] =CNT_STACK[2] ?
    CNT_STACK_CY[1]: STACK[2];
assign CNT_STACK_CY[1] =CNT_STACK[1] ? CNT_
    STACK_CY[0]: STACK[1];
assign CNT_STACK_CY[0] =CNT_STACK[0] ? CNT_
    STACK_CIN : STACK[0];
assign NEW_STACK[3]=CNT_STACK_CY[2^ CNT_
    STACK[3];
assign NEW_STACK[2]=CNT_STACK_CY[1^ CNT_
    STACK[2];
assign NEW_STACK[1]=CNT_STACK_CY[0]^ CNT_
    STACK[1];
assign NEW_STACK[0]=STACK_CIN^ CNT_STACK
    [0];
always @ (posedge CLK or posedge INTERNAL_RE-
    SET)
    begin
        if (INTERNAL_RESET)
            STACK<=#1 0;
        else
            if (~FORCE_FF)
                STACK<=#1 NEW_STACK;
    end always @ (posedge CLK or posedge INTERNAL_RE-
    SET)
    begin
        if (INTERNAL_RESET)
            RETURN_VECTOR<=#1 0;
        else
            RETURN_VECTOR<=#1 STACK_RAM;
    end
//==========================================
//==========================================
//
// Status flag logic
//
//==========================================
//==========================================
// wire FLAG_EN3;
// wire FLAG_EN2;
// wire FLAG_EN1;
// assign FLAG_EN3=I[2]|I[1]|I[0];
// assign FLAG_EN2=I[15] & I[14] & ~I[13] & ~[12];
// assign FLAG_EN1=(~I[15] & (I[14]|I[13]|I[12]))|(I[15]
    & I[14] & ~I[13] & I[12]);
//    assign    FLAG_EN_TYPE=(FLAG_EN3    &
    (FLAG_EN2|FLAG_EN1))|    (~FLAG_EN3    &
    FLAG_EN1);
assign FLAG_EN_TYPE=(~I[15] & (I[14]|I[13]|I[12])) //
    1xkk-7xkk
    |(GROUP_2_REG & (~I[3] & (I[2] |I[1]| I[0]))) //
        Cxy1-Cxy7
    |(GROUP_2_REG & SUB_GROUP_COMPARE) //
        CxyE CMP register
    |GROUP_SHIFT // Dx00-Dx0F All shift
    |GROUP_COMPARE; // Bxkk CMP constant
always @ (posedge CLK or posedge INTERNAL _
    RESET)
    begin
        if (INTERNAL_RESET)
            FLAG_EN_COMMAND<=#1 0;
        else
            FLAG_EN_COMMAND<=#1    FLAG_EN_
                TYPE;
    end
assign ALU_CODE3=~I[15]
    |(I[15] & ~I[13] & ~I[12])
    |GROUP_COMPARE; // CMP constant
assign FOR_CODE2=(I[15] & I[2]) // 0->LOGICAL,
    1->ADD_SUB
    |(~I[15] & I[14])
    |GROUP_COMPARE;
always @ (posedge CLK or posedge INTERNAL_RE-
    SET)
    begin
        if (INTERNAL_RESET)
            ALU_CODE2<=#1 0;
        else
            ALU_CODE2<=#1 FOR_CODE2;
    end
assign ALU_CODE1=(I[15] & I[1])
    |(~I[15] & I[13])
    |GROUP_COMPARE; // CMP constant
assign ALU_CODE0=((I[15] & I[0])|(~I[15] & I[12])) &
    (I[15:12] !=4'hB); // ALU_CODE0 must be zero for
    CMP
//    assign    FLAG_EN=~READ    &
    (RETURN|_COMMAND|FLAG_EN_COMMAND);
```

```
// This code keeps the CARRY and ZERO flags from
   changing when an // instruction is interrupted. (It
   doesn't cause a malfunction if they
// change, but it is confusing in the trace and virsim
   displays.)
always @ (posedge CLK or posedge INTERNAL_RESET)
   begin
      if (INTERNAL_RESET)
         FORCE_FF_REG<=@1 0;
      else
         FORCE_FF_REG<=#1 FORCE_FF;
   end
assign FLAG_EN=~READ & (RETURNI_COMMAND|
   (FLAG_EN_COMMAND & ~FORCE_FF_REG));
// assign HIGH_ZERO=~NEW_REG_DATA[7] & ~
   NEW_REG_DATA[6] & ~NEW_REG_DATA[5] & ~
   NEW_REG_DATA[4];
//assign  LOW_ZERO=~NEW_REG_DATA[3]  &  ~
   NEW_REG_DATA[2] & ~NEW_REG_DATA[1] & ~
   NEW_REG_DATA[0];
// assign LOW_ZERO_CY=LOW_ZERO?1: 0;
//   assign  FOR_ZERO=HIGH_ZERO  &  LOW_ZERO_CY;
// assign FOR_ZERO=HIGH_ZERO & LOW_ZERO;
assign FOR_ZERO=(NEW_REG_DATA==0);
assign NEW_ZERO=(RETURNI_COMMAND & PRESERVE_ZERO)|(~RETURNI_COMMAND  &
   FOR_ZERO);
always @ (posedge CLK or posedge INTERNAL_RESET)
   begin
      if (INTERNAL_RESET)
         ZERO<=#1 0;
      else
         if (FLAG_EN)
            ZERO<=#1 NEW_ZERO;
   end
always @ (posedge CLK or posedge INTERNAL_RESET)
   begin
      if (INTERNAL_RESET)
         PRESERVE_ZERO<=#1 0;
      else
         if (FORCE_FF)
            PRESERVE_ZERO<=#1 ZERO;
   end
assign SRCY=(I[3] & OUTPUT[0])|(~I[3] & OUTPUT
   ['D_MSB]);
always @ (posedge CLK or posedge INTERNAL_RESET)
   begin
      if (INTERNAL_RESET)
         SHIFT_CARRY<=#1 0;
      else
         SHIFT_CARRY<=#1 SRCY;
   end
assign SHIFT_DECODE=I[15] & I[14] & ~I[13] & I[12];
always @ (posedge CLK or posedge INTERNAL_RESET)
   begin
      if (INTERNAL_RESET)
         SEL_SHIFT_CY<=#1 0;
      else
         SEL_SHIFT_CY<=#1 SHIFT_DECODE;
   end
assign ARITH_DECODE=(GROUP_2_REG & I[2])
   |GROUP_COMPARE // CMP constant
   |(~I[15] & I[14]);
always @ (posedge CLK or posedge INTERNAL_RESET)
   begin
      if (INTERNAL_RESET)
         SEL_ARITH_CY<=#1 0;
      else
         SEL_ARITH_CY<=#1 ARITH_13_DECODE;
   end
always @ (posedge CLK or posedge INTERNAL_RESET)
   begin
      if (INTERNAL_RESET)
         ADD_SUB_CARRY<=#1 0:
      else
         ADD_SUB_CARRY<=#1 ARITH_CARRY;
   end
assign     FOR_CARRY=(ADD_SUB_CARRY      &
   SEL_ARITH_CY    &    ~SEL_SHIFT_CY)|(~SEL_ARITH_CY  &  SEL_SHIFT_CY  &  SHIFT_CARRY);
assign NEW_CARRY=(RETURNI_COMMAND   &
   PRESERVE_CARRY)|(~RETURNI_COMMAND  &
   FOR_CARRY);
always @ (posedge CLK or posedge INTERNAL_RESET)
   begin
      if (INTERNAL_RESET)
         CARRY<=#1 0;
      else
         if (FLAG_EN)
            CARRY<=#1 NEW_CARRY;
   end
always @ (posedge CLK or posedge INTERNAL_RESET)
   begin
      if (INTERNAL_RESET)
         PRESERVE_CARRY<=#1 0;
      else
         if (FORCE_FF)
            PRESERVE_CARRY<=#1 CARRY;
   end
// ===================================
//=====================
//
// Interrupt logic
//
//       ===============================
=================================== always @ (posedge CLK or posedge INTERNAL_RESET)
   begin
      if (INTERNAL_RESET)
         INTERRUPT_CAPTURE<=#1 0;
      else
         INTERRUPT_CAPTURE<=#1 INTERRUPT;
   end
assign HOLD_CLEAR_INT=~FORCE_FF & INT_ENABLE;
assign INT_SET=~FORCE_FF & I[5];
assign INTERRUPT_TYPE=MOVE_BASE_GROUP &
   ~I[8] & I[4];
assign FOR_INT_EN=INTERRUPT_TYPE ? INT_SET:
   HOLD_CLEAR_INT;
```

```
always @ (posedge CLK or posedge INTERNAL_RE-
    SET)
  begin
    if (INTERNAL_RESET)
      INT_ENABLE<=#1 0;
    else
      INT_ENABLE<=#1 FOR_INT_EN;
  end
assign FORCE_FF=INT_ENABLE & READ & INTER-
    RUPT_CAPTURE;
assign  RETURNI_DECODE=MOVE_BASE_GROUP
    & ~ I[8] & I[7] & I[4];
always @ (posedge CLK or posedge INTERNAL_RE-
    SET)
  begin
    if (INTERNAL_RESET)
      RETURNI_COMMAND<=#1 0;
    else
      RETURNI_COMMAND<=#1    RETURNI_DE-
        CODE;
  end
//==========================
==========================
//
// Miscellaneous logic
//
//==========================
==========================
assign MOVE_BASE_GROUP=I[15] & ~I[14] & ~I[13];
assign MOVE_COMMAND=I[8] |I[7];
assign CONDITION_MET=(I[11] & (I[10] ^ CARRY))|
    (~I[11] & (I[10]^ZERO));
assign VALID_TO_MOVE=I[12] ? CONDITION_MET:
    MOVE_COMMAND;
always @ (posedge CLK or posedge INTERNAL_RE-
    SET)
  begin
    if (INTERNAL_RESET)
      READ<=#1 0;
    else
      READ<=#1 ~READ;
  end
// assign RD_STRB=I[15] & ~I[14] & I[13] & READ;
// Was: Bxy0 INPUT sx,(sY)
// Is: Cxy8 INPUT sX,(sY)
assign RD_STRB=(READ & GROUP_INPUT)
    |READ & GROUP_2_REG & SUB_GROUP_INPUT);
// wire CLR_IO_STROBES;
//   assign   CLR_IO_STROBES=INTERNAL_RESET
    |FORCE_FF;
always @ (posedge CLK or posedge INTERNAL_RE-
    SET)
  begin
    if (INTERNAL_RESET)
      READ_STROBE<=#1 0;
    else
      READ_STROBE<=#1  RD_STRB  &  ~FORC-
        E_FF;
  end
// assign WR_STRB=I[15] & I[14] & I[13] & READ;
// Was: Fxy0 OUTPUT sx, (sY)
// Is: Cxy9 OUTPUT sX, (sY)
assign WR_STRB=(READ & GROUP_OUTPUT)
    |(READ & GROUP_2_REG & SUB_GROUP_OUT-
    PUT);
always @ (posedge CLK or posedge INTERNAL_RE-
    SET)
  begin
    if (INTERNAL_RESET)
      WRITE_STROBE<=#1 0;
    else
      WRITE_STROBE<=#1 WR_STRB & ~FORC-
        E_FF;
  end
endmodule
```

What is claimed is:

1. A system monitor circuit in an integrated circuit comprising:
   an analog-to digital converter (ADC) configured to monitor a plurality of sensors;
   a calibration circuit for calibrating an output of the ADC using a set value in a first register;
   a filter circuit for filtering an output of the calibration circuit or an output of the ADC; and
   a alarm circuit configured to determine an alarm condition by comparing the output of the calibration circuit or an output of the ADC or an output of the filter circuit with a set value in a second register.

2. The system monitor circuit of claim 1 further comprising: a microcontroller coupled to the ADC.

3. The system monitor circuit of claim 2 wherein the microcontroller is coupled to a read-only memory.

4. The system monitor circuit of claim 2 wherein the microcontroller is coupled to a random access memory.

5. The system monitor circuit of claim 1 further comprising: a hardwired PicoBlaze microcontroller coupled to a memory, the memory including the first and second registers.

6. The system monitor circuit of claim 1 further comprising: a memory coupled to a channel sequencer, the channel sequencer selecting a channel of the ADC for automatic monitoring.

7. A system monitor circuit in an integrated circuit comprising:
   selection circuitry coupled to a plurality of sensors,
   the selection circuitry configurable to select one of the plurality of sensors responsive to a first portion of control information;
   an analog-to digital converter (ADC) configured to monitor the selected sensor
   the ADC configurable responsive to a second portion of the control information;
   a calibration circuit for calibrating an output of the ADC using a set value in a first register;
   a filter circuit for filtering an output of the calibration circuit or an output of the ADC; and
   a alarm circuit configured to determine an alarm condition by comparing the output of the calibration circuit or an output of the ADC or an output of the filter circuit with a set value in a second register.

8. The system monitor circuit of claim 7 further comprising: a microcontroller coupled to the ADC.

9. The system monitor circuit of claim 8 wherein the microcontroller is coupled to a read-only memory.

10. The system monitor circuit of claim 8 wherein the microcontroller is coupled to a random access memory.

11. The system monitor circuit of claim 7 further comprising: a hardwired PicoBlaze microcontroller coupled to a memory, the memory including the first and second registers.

12. The system monitor circuit of claim 7 further comprising: a memory coupled to a channel sequencer, the channel sequencer selecting a channel of the ADC for automatic monitoring.

* * * * *